(12) United States Patent
Park et al.

(10) Patent No.: US 11,961,847 B2
(45) Date of Patent: Apr. 16, 2024

(54) DISPLAY DEVICE

(71) Applicant: Samsung Display Co., LTD., Yongin-si (KR)

(72) Inventors: No Kyung Park, Yongin-si (KR); Kyung Bae Kim, Yongin-si (KR); Min Kyu Woo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/332,201

(22) Filed: Jun. 9, 2023

(65) Prior Publication Data

US 2023/0317738 A1     Oct. 5, 2023

Related U.S. Application Data

(63) Continuation of application No. 17/324,634, filed on May 19, 2021, now Pat. No. 11,721,706.

(30) Foreign Application Priority Data

Sep. 21, 2020   (KR) .................. 10-2020-0121758

(51) Int. Cl.
  *H01L 27/12*    (2006.01)
  *H01L 25/16*    (2023.01)
  *H01L 33/44*    (2010.01)
(52) U.S. Cl.
  CPC ........ *H01L 27/1244* (2013.01); *H01L 25/167* (2013.01); *H01L 33/44* (2013.01)
(58) Field of Classification Search
  None
  See application file for complete search history.

(56) References Cited

U.S. PATENT DOCUMENTS

| | | |
|---|---|---|
| 9,178,123 B2 | 11/2015 | Sakariya et al. |
| 10,868,088 B2 * | 12/2020 | Bok .................. G06F 3/04164 |

(Continued)

FOREIGN PATENT DOCUMENTS

| | | |
|---|---|---|
| KR | 10-2015-0084922 | 7/2015 |
| KR | 10-2020-0027136 | 3/2020 |

(Continued)

OTHER PUBLICATIONS

International Search Report corresponding to International Application No. PCT/KR2021/012056 dated Dec. 14, 2021.

*Primary Examiner* — Bo B Jang
(74) *Attorney, Agent, or Firm* — KILE PARK REED & HOUTTEMAN PLLC

(57) ABSTRACT

A display device includes pixels disposed in a display area and including first and second pixels that are adjacent to each other in a first direction, and a first integrated bank pattern disposed between the first and second pixels. Each of the pixels includes a first electrode and a second electrode that are spaced apart from each other along the first direction in a light emitting area and extend in a second direction, a first bank pattern portion overlapping the first electrode, and a second bank pattern portion overlapping the second electrode. The first integrated bank pattern includes a second bank pattern portion disposed at the first pixel, a first bank pattern portion disposed at the second pixel, and a protrusion extending in the second direction in a boundary area between the first pixel and the second pixel.

20 Claims, 33 Drawing Sheets

(56) References Cited

U.S. PATENT DOCUMENTS

| | | |
|---|---|---|
| 2021/0057610 A1 | 2/2021 | Yang et al. |
| 2021/0143137 A1 | 5/2021 | Kim et al. |
| 2021/0217739 A1 | 7/2021 | Lee et al. |
| 2021/0265324 A1 | 8/2021 | Kong et al. |
| 2021/0336108 A1 | 10/2021 | Lee et al. |

FOREIGN PATENT DOCUMENTS

| | | |
|---|---|---|
| KR | 10-2020-0042075 | 4/2020 |
| KR | 10-2020-0070493 | 6/2020 |
| KR | 10-2020-0088954 | 7/2020 |
| KR | 10-2020-0088962 | 7/2020 |
| KR | 10-2021-0057891 | 5/2021 |

* cited by examiner

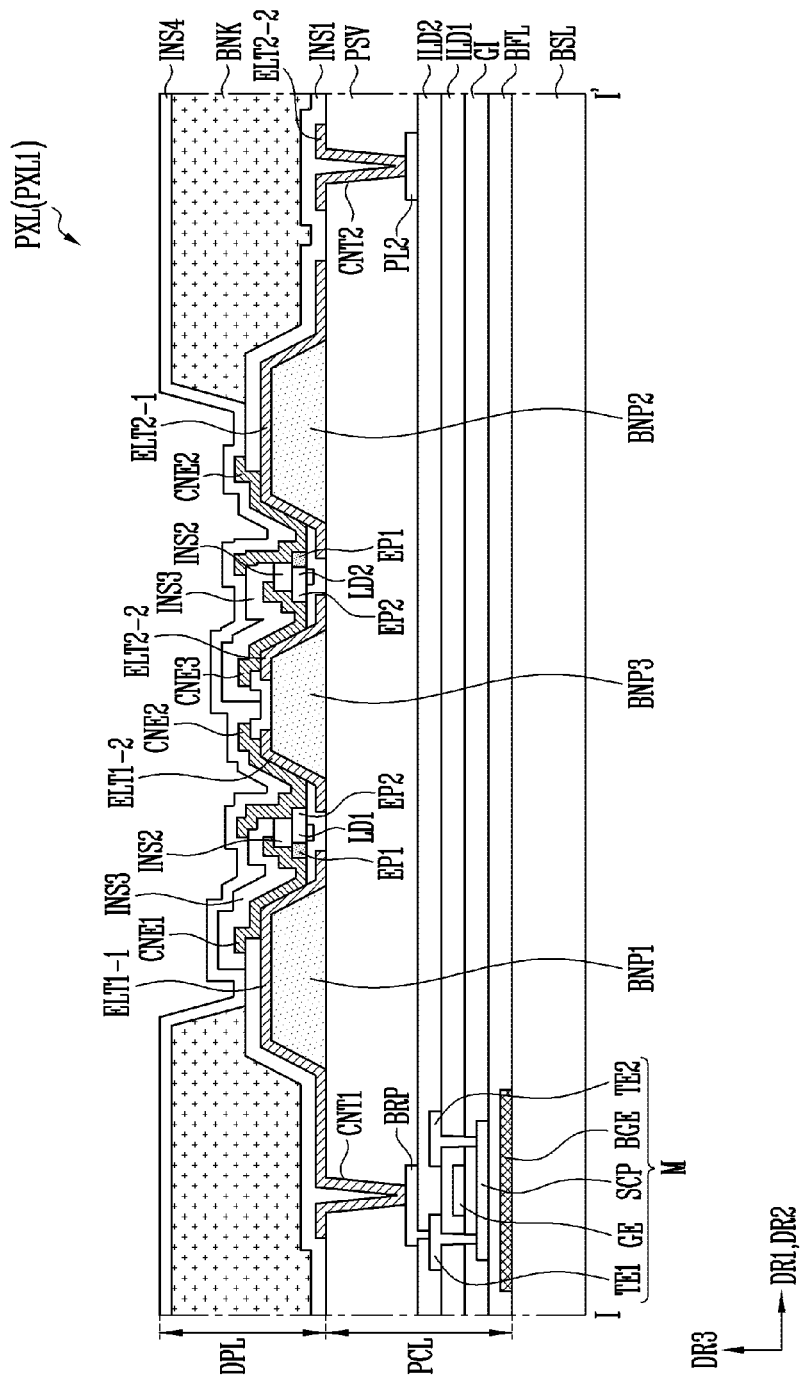

DISPLAY DEVICE

CROSS-REFERENCE TO RELATED APPLICATION(S)

This is a continuation application of U.S. patent application Ser. No. 17/324,634, filed May 19, 2021 (now pending), the disclosure of which is incorporated herein by reference in its entirety. U.S. patent application Ser. No. 17/324,634 claims priority to and benefits of Korean Patent Application No. 10-2020-0121758 under 35 U.S.C. § 119, filed in the Korean Intellectual Property Office on Sep. 21, 2020, the entire contents of which are incorporated herein by reference.

BACKGROUND OF THE INVENTION

1. Technical Field

An embodiment of the disclosure relates to a display device.

2. Description of the Related Art

Recently, interest in information display is increasing. Accordingly, research and development of display devices is continuously being conducted.

SUMMARY OF THE INVENTION

The disclosure has been made in an effort to provide a display device that may prevent short-circuit defects of pixel electrodes.

An embodiment of the disclosure provides a display device that may include pixels disposed in a display area and that may include a first pixel and a second pixel that may be adjacent to each other in a first direction, and a first integrated bank pattern disposed between the first pixel and the second pixel. Each pixel may include a first electrode and a second electrode that are spaced apart from each other along the first direction in a light emitting area and extend in a second direction, a first bank pattern portion overlapping the first electrode, and a second bank pattern portion overlapping the second electrode. The first integrated bank pattern may include a second bank pattern portion disposed at the first pixel, a first bank pattern portion disposed at the second pixel, and a protrusion extending in the second direction in a boundary area between the first pixel and the second pixel.

The first direction may be a row direction of the display area, and the second direction may be a column direction of the display area.

End portions at an upper end and a lower end of the first integrated bank pattern may respectively protrude in directions of a previous pixel row and a next pixel row.

The first integrated bank pattern and at least one of a first integrated bank pattern of a previous pixel row and a first integrated bank pattern of a next pixel row may be integral with each other.

The protrusion may include at least one corner portion.

The protrusion may include a first area and a second area that may be continuously disposed along the second direction and have a first width and a second width, respectively, along the first direction, and the first width and the second width may be different from each other.

The protrusion further may include a third area that contacts the second area and has a third width different from the second width.

The protrusion may have a width that may change in at least one area.

The protrusion may have a uniform width.

The protrusion may be disposed in an area between a second electrode of the first pixel and a first electrode of the second pixel in a plan view.

Another embodiment of the disclosure provides a display device that may include pixels disposed in a display area and that may include a first pixel and a second pixel that are adjacent to each other in a first direction, and a first integrated bank pattern disposed between the first pixel and the second pixel. Each of the pixels may include a first electrode and a second electrode that may be spaced apart from each other along the first direction in a light emitting area, and extend in a second direction, a third electrode disposed between the first electrode and the second electrode, a first bank pattern portion overlapping the first electrode, a second bank pattern portion overlapping the second electrode, and a third bank pattern portion overlapping the third electrode. The first integrated bank pattern may include a second bank pattern portion disposed at the first pixel, a first bank pattern portion disposed at the second pixel, and a protrusion extending in the second direction in a boundary area between the first pixel and the second pixel.

The pixels may further include a third pixel adjacent to the first pixel in the second direction, and the first, second, and third electrodes of the first pixel and first, second, and third electrodes of the third pixel may be electrically disconnected from each other in a separation area between the first pixel and the third pixel.

The display device may further include a second integrated bank pattern that may include a third bank pattern portion of the first pixel, and a third bank pattern portion of the third pixel, wherein the second integrated bank pattern may have a first width in the light emitting area and a second width larger than the first width in the separation area.

The second integrated bank pattern may completely overlap end portions of third electrodes of the first and third pixels in the separation area.

Each of the pixels may further include a fourth electrode disposed between the second electrode and the third electrode, and the second integrated bank pattern may completely overlap end portions of third and fourth electrodes of the first and third pixels in the separation area.

The end portions of the third and fourth electrodes of the first and third pixels may be disposed on an upper surface of the second integrated bank pattern in the separation area.

The second integrated bank pattern may extend along the second direction in the display area and overlap third and fourth electrodes of pixels disposed in a same pixel column along the second direction.

The second integrated bank pattern may partially overlap the third and fourth electrodes in a light emitting area of each of the pixels disposed in the same pixel column, and the second integrated bank pattern may completely overlap, in a separation area between two adjacent pixels along the second direction, the end portions of the third and fourth electrodes of the two adjacent pixels.

The second integrated bank pattern may have a third width smaller than the first width in an area between the light emitting area and the separation area.

The second integrated bank pattern may not overlap the fourth electrode in an area having the third width.

The third bank pattern portion of the first pixel and the third bank pattern portion of the third pixel may be spaced apart from each other in the separation area, and each of the third bank pattern portion of the first pixel and the third bank pattern portion of the third pixel may have a first width in the light emitting area and a second width larger than the first width in the separation area.

Each of the third bank pattern portion of the first pixel and the third bank pattern portion of the third pixel may have a third width smaller than the first width in an area between the light emitting area and the separation area.

Another embodiment of the disclosure provides a display device that may include pixels disposed in a display area. Each of the pixels may include a first electrode and a second electrode that are spaced apart from each other along a first direction in a light emitting area, and extend in a second direction, a third electrode disposed between the first electrode and the second electrode and extending along the second direction, a first bank pattern portion overlapping the first electrode, a second bank pattern portion overlapping the second electrode, and a third bank pattern portion disposed between the first bank pattern portion and the second bank pattern portion and overlapping the third electrode. The third bank pattern portion may have a first width in the light emitting area and a second width larger than the first width in a separation area between adjacent pixels in the second direction.

The third bank pattern portion and a third bank pattern portion disposed in at least one adjacent pixel in the second direction are integral with each other to form an integrated bank pattern.

Third bank pattern portions of pixels disposed in each pixel column of the display area along the second direction may be integral with each other to form each integrated bank pattern, and the integrated bank pattern may extend along the first direction in separation areas between adjacent pixels in the second direction.

First, second, and third electrodes of adjacent pixels in the second direction may be electrically disconnected from each other in the separation areas.

The integrated bank pattern may completely overlap end portions of third electrodes of each pixel column in the separation areas.

Each of the pixels may further include a fourth electrode disposed between the second electrode and the third electrode, and the integrated bank pattern may completely overlap end portions of the third and fourth electrodes of each pixel column in the separation areas.

The end portions of the third and fourth electrodes of each pixel column may be disposed on an upper surface of the integrated bank pattern in the separation areas.

The integrated bank pattern may partially overlap the third and fourth electrodes in light emitting areas of each pixel column, and the integrated bank pattern may completely overlap the end portions of the third and fourth electrodes in the separation areas.

The third bank pattern portion may have a third width smaller than the first width in an area between the light emitting area and the separation area.

Each of the pixels may further include a fourth electrode disposed between the second electrode and the third electrode.

The third bank pattern portion may partially overlap the third and fourth electrodes in the light emitting area, may completely overlap an end portion of each of the third and fourth electrodes in the separation area, may at least partially overlap the third electrode in an area having the third width, and may not overlap the fourth electrode.

Each pixel may include at least one contact portion formed at the fourth electrode in an area between the light emitting area and the separation area, and the third bank pattern portion may not overlap the at least one contact portion.

The pixels may include a first pixel and a second pixel that may be sequentially disposed in the first direction, and the second bank pattern portion of the first pixel and the first bank pattern portion of the second pixel may be integral with each other, and may protrude in the second direction in a boundary area of the first and second pixels.

Another embodiment of the disclosure provides a display device that may include pixels disposed in a display area along a first direction and a second direction. Each of the pixels may include a first electrode and a second electrode that may be spaced apart from each other along the first direction in a light emitting area and extend in the second direction, a third electrode disposed between the first electrode and the second electrode and extending along the second direction, a first bank pattern portion overlapping the first electrode, a second bank pattern portion overlapping the second electrode, and an integrated bank pattern that may be disposed between the first bank pattern portion and the second bank pattern portion to overlap the third electrode, the integrated bank pattern extending along the second direction in each light emitting area. The integrated bank pattern may have, in a first separation area between two adjacent pixels along the second direction, a width extending to completely overlap an end portion of a third electrode of at least one of the two adjacent pixels.

The integrated bank pattern may have a first width in each light emitting area, and a second width larger than the first width in the first separation area.

The integrated bank pattern may have a third width smaller than each of the first width and the second width in a non-light emitting area between each light emitting area and the first separation area.

Each of the pixels may further include a fourth electrode disposed between the second electrode and the third electrode. The integrated bank pattern may partially overlap the third and fourth electrodes in each light emitting area, and the integrated bank pattern may completely overlap respective end portions of the third and fourth electrodes of two adjacent pixels along the second direction in the first separation area.

Each of the pixels may further include light emitting elements disposed between the first, second, and third electrodes.

Each light emitting area may include a first light emitting area and a second light emitting area that are spaced apart from each other along the second direction. Each of the pixels may further include a second separation area disposed between the first light emitting area and the second light emitting area.

The integrated bank pattern may extend from the first light emitting area through the second separation area to the second light emitting area, and the integrated bank pattern may have a first width in the first and second light emitting areas, and may have a second width larger than the first width in the first separation area.

The integrated bank pattern may have a third width smaller than each of the first width and the second width in a non-light emitting area around the first and second light emitting areas and in the second separated area.

The integrated bank pattern may have a third width smaller than each of the first width and the second width in a non-light emitting area around the first and second light emitting areas, and the second width in the second separation area.

The first light emitting area may include the first, second, and third electrodes, and a fourth electrode disposed between the second and third electrodes and extending along the second direction. The second light emitting area may include a fifth electrode and a sixth electrode that are spaced apart from each other along the first direction and extend along the second direction, and a seventh electrode and an eighth electrode that are spaced apart from each other along the first direction between the fifth and sixth electrodes, and extend along the second direction.

The integrated bank pattern may extend from the first light emitting area through the second separation area to the second light emitting area, and may overlap the third, fourth, seventh, and eighth electrodes.

The integrated bank pattern may partially overlap the third and fourth electrodes in the first light emitting area, and may partially overlap the seventh and eighth electrodes in the second light emitting area, and the integrated bank pattern may completely overlap an end portion of each of the seventh and eighth electrodes in the first separation area.

The integrated bank pattern may completely overlap an end portion of each of the third, fourth, seventh, and eighth electrodes in the second separation area.

Each of the pixels may include a third bank pattern portion overlapping the fifth electrode, a fourth bank pattern portion overlapping the sixth electrode, at least one first light emitting element disposed between the first electrode and the third electrode, at least one second light emitting element disposed between the fifth electrode and the seventh electrode and electrically connected to an end portion of the at least one first light emitting element, at least one third light emitting element disposed between the sixth electrode and the eighth electrode and electrically connected to an end portion of the at least one second light emitting element, and at least one fourth light emitting element disposed between the second electrode and the fourth electrode and electrically connected to an end portion of the at least one third light emitting element.

Particularities of other embodiments are included in the detailed description and drawings.

According to embodiments of the disclosure, it may be possible to prevent a short circuit defect from occurring along a circumference of bank pattern portions between pixel electrodes disposed on an upper portion of the bank pattern portions. Accordingly, it may be possible to secure electrical stability of the pixel electrodes and to improve a yield of the display device.

Effects of embodiments of the disclosure are not limited by what may be illustrated in the above, and various additional effects are included in the specification.

BRIEF DESCRIPTION OF THE DRAWINGS

The above and other aspects and features of the disclosure will become more apparent by describing in detail embodiments thereof with reference to the attached drawings, in which:

FIG. 9A and FIG. 9B respectively illustrate a schematic cross-sectional view of a pixel according to an embodiment of the disclosure.

DETAILED DESCRIPTION OF THE EMBODIMENTS

Figure 1:
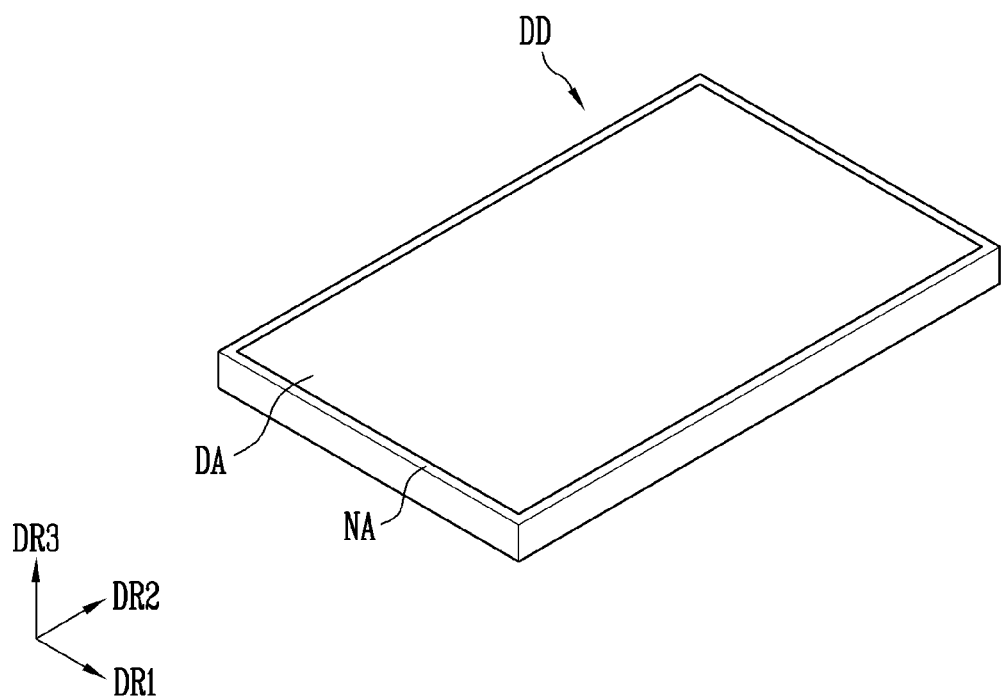
FIG. 1 illustrates a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the description below, singular forms may include plural forms unless the context clearly indicates only the singular, and vice versa. Terms such as "comprise", "has", "have", and "include", will be understood to imply the inclusion of stated elements but not the exclusion of any other elements.

The disclosure is not limited to the embodiments disclosed hereinafter and may be implemented in various forms. Each embodiment disclosed below may be implemented alone, or may be implemented in combination with another embodiment.

Some of the elements not directly related to the features of the disclosure in the drawing may be omitted in order to clearly illustrate the disclosure. Some of the elements in the drawings can be shown in somewhat exaggerated sizes, ratios, and the like. For the same or similar elements throughout the drawings, the same reference numerals and symbols are to be given as much as possible even if they are displayed on different drawings. Duplicate descriptions may be omitted.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", "left", "right" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 2A:
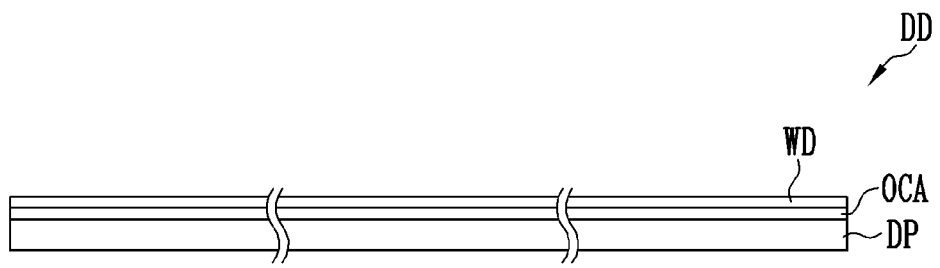
FIG. 2A and FIG. 2B respectively illustrate a schematic cross-sectional view of a display device according to an embodiment of the disclosure.
Figure 2B:
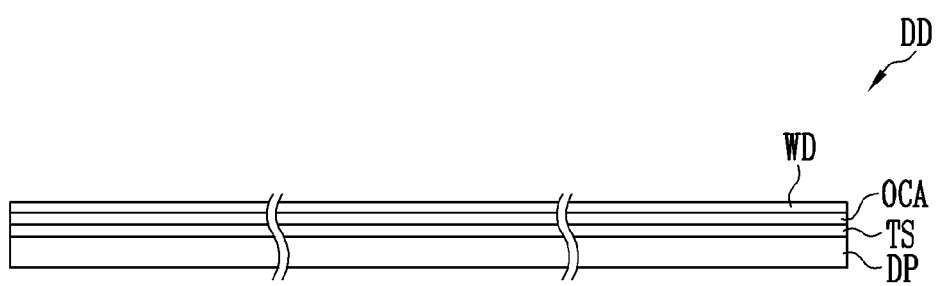
Figure 3A:
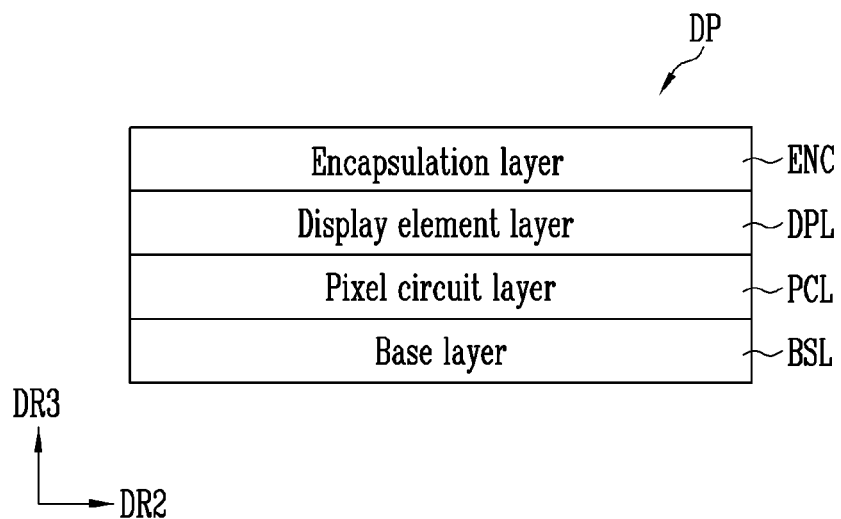
FIG. 3A and FIG. 3B respectively illustrate a schematic cross-sectional view of a display panel configuration according to an embodiment of the disclosure.
Figure 3B:
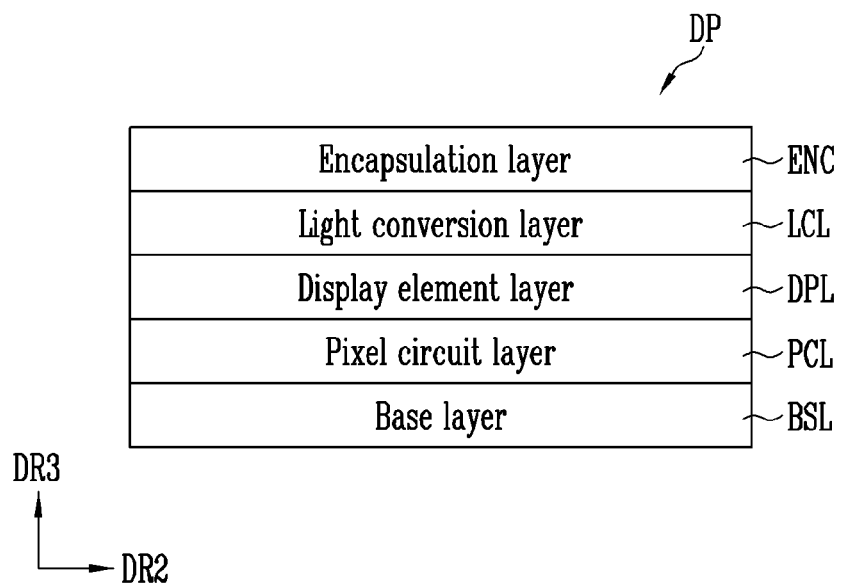

FIG. 1 illustrates a schematic perspective view of a display device DD according to an embodiment of the disclosure. FIG. 2A and FIG. 2B respectively illustrate a schematic cross-sectional view of the display device DD according to an embodiment of the disclosure. FIG. 3A and FIG. 3B respectively illustrate a schematic cross-sectional view of a display panel DP according to an embodiment of the disclosure.

First, referring to FIG. 1, the display device DD may include a display area DA and a non-display area NA (also referred to as a "bezel area"). The display area DA may be an area displaying an image by including pixels. The non-display area NA may be an area excluding the display area DA, and no image may be displayed in the non-display area NA.

The display area DA may have various shapes, and may include pixels. For example, the display area DA may have various shapes including a rectangular shape, a circular shape, or an ellipse, and the pixels may be arranged in the display area DA.

The display area DA may be formed on at least one surface of the display device DD. For example, the display area DA may be formed on a front surface of the display device DD, and may be additionally formed on a side surface and/or a rear surface of the display device DD.

The non-display area NA may be disposed adjacent to (e.g., around) the display area DA to, e.g., surround at least one area of the display area DA. The non-display area NA may include wires, pads, and/or a driving circuit that may be connected to the pixels of the display area DA.

The display device DD may be provided in various shapes. For example, the display device DD may be provided in a rectangular plate shape, but is not limited thereto. For example, the display device DD may have a shape such as a circle or an ellipse. In FIG. 1, the display device DD including an angled corner is illustrated, but the disclosure is not limited thereto. For example, the display device DD may include a curved line type corner.

For convenience, FIG. 1 illustrates that the display device DD has a plate shape of a rectangular shape including a pair of short sides and a pair of long sides, wherein an extension direction of the short side may be referred to as a first direction DR1, an extension direction of the long side may be referred to as a second direction DR2, and a direction (for example, in a thickness or height direction of the display device DD) perpendicular to the extension directions of the long side and the short side may be referred to as a third direction DR3. However, this may be changed according to the shapes of the display device DD.

The display device DD may have flexibility to enable deformation in at least one area, or may not be flexible so that substantial deformation may not occur in an entire area thereof. For example, the display device DD may be a flexible display device or a rigid display device. In case that the display device DD is flexible in at least one area, it may be deformed into a form that may be folded, bent, or rolled in a portion having flexibility.

Referring to FIG. 2A, the display device DD may include the display panel DP, and a window WD that may be disposed above the display panel DP. In an embodiment, the window WD and the display panel DP may be integrally manufactured with each other. For example, the window WD may be directly formed on a surface of the display panel DP. In another embodiment, after the window WD may be separately manufactured from the display panel DP, it may be combined with the display panel DP through an optically clear adhesive member (OCA).

The display panel DP may include pixels for displaying an image, and may be a display panel of various types and/or structures. In an embodiment, the display panel DP may be a self-luminance display panel provided with pixels including ultra-small inorganic light emitting diodes of nano-scale or micro-scale, but is not limited thereto.

The window WD may be disposed on the display panel DP to protect the display panel DP from external impact, and may provide an input surface and/or a display surface to a user. The window WD may be made of various materials including glass or plastic, and may be flexible in at least one area, or may not be flexible in an entire area thereof.

Referring to FIG. 2B, the display device DD may further include a touch sensor TS. The display device DD may include various types and/or shapes of other sensors (for example, a fingerprint sensor, a pressure sensor, a temperature sensor, etc.) and/or an input sensing device.

The touch sensor TS may be disposed on at least one surface of the display panel DP to detect a touch input by a user. For example, the touch sensor TS may be provided on a front surface (an upper surface on which an image may be displayed) of the display panel DP so as to be disposed between the display panel DP and the window WD, but is not limited thereto.

In an embodiment, the touch sensor TS and the display panel DP may be integrally manufactured with each other. For example, sensor electrodes and/or sensor elements for configuring the touch sensor TS may be directly formed on at least one surface of the display panel DP.

In another embodiment, the touch sensor TS may be separately manufactured from the display panel DP, and may be adjacent to (e.g., provided around) the display panel DP. For example, the touch sensor TS may be disposed on and/or attached to at least one surface of the display panel DP.

Referring to FIG. 3A, the display panel DP may include a base layer BSL, and a pixel circuit layer PCL, a display element layer DPL, and an encapsulation layer ENC that may be sequentially disposed on a surface of the base layer BSL. However, the structure of the display panel DP may be variously changed according to embodiments.

For example, in case that the display panel DP is a passive display panel, the pixel circuit layer PCL may be omitted. Wires for driving pixels may be disposed under the display element layer DPL, or the wires may be directly connected to and/or formed in the display element layer DPL.

The base layer BSL may be a rigid or flexible substrate (or film). In an embodiment, in case that the base layer BSL is a rigid substrate, the base layer BSL may be at least one of a glass substrate, a quartz substrate, a glass ceramic substrate, and a crystalline glass substrate. In another embodiment, in case that the base layer BSL is a flexible substrate, the base layer BSL may be at least one of a film substrate including a polymer organic material and a plastic substrate. The base layer BSL may include fiber glass reinforced plastic (FRP).

The pixel circuit layer PCL may be provided on a surface of the base layer BSL. The pixel circuit layer PCL may include circuit elements for configuring a pixel circuit of each pixel and various wires connected to the circuit elements. For example, the pixel circuit layer PCL may include transistors and storage capacitors configuring the pixel circuit of each pixel, and gate lines, data lines, and power lines connected to each pixel circuit. In some embodiments, the gate lines may include at least scan lines, and may optionally further include other types of control lines. The pixel circuit layer PCL may further include at least one insulation layer including a passivation layer covering the circuit elements and/or wires.

The display element layer DPL may be disposed on the pixel circuit layer PCL. The display element layer DPL may include a light emitting element configuring a light source of each pixel. In an embodiment, the light emitting element may be an inorganic light emitting diode (for example, an ultra-small inorganic light emitting diode having a nano- or micro-scale size), but is not limited thereto.

The encapsulation layer ENC may be disposed on the display element layer DPL. The encapsulation layer ENC may be an encapsulation substrate (or upper substrate), or a single-layered or multi-layered encapsulation layer (for example, a thin film encapsulation layer). The encapsulation layer ENC may protect the pixels by preventing external air and moisture from penetrating into the display element layer DPL and the pixel circuit layer PCL.

In case that the encapsulation layer ENC is an encapsulation substrate, the encapsulation substrate may be combined with the base layer BSL by a sealing material or the like. For example, the encapsulation substrate may be attached to a side of the base layer BSL provided with pixels by a sealing material.

In case that the encapsulation layer ENC is a single-layered or multi-layered encapsulation layer, it may include at least one inorganic and/or organic film. In an embodiment, in case that the encapsulation layer ENC is a multi-layered encapsulation layer (for example, a multi-layered thin film encapsulation layer), the multi-layered encapsulation layer may include an inorganic film and/or an organic film. For example, the encapsulation layer ENC may have a multi-layered structure in which an inorganic layer, an organic layer, and an inorganic layer may be sequentially stacked on each other.

Referring to FIG. 3B, the display panel DP may further include a light conversion layer LCL for converting light emitted from the display element layer DPL. For example, in case that the display panel DP emits light in an upper direction of the display element layer DPL (for example, the third direction DR3) to display an image on the front of the display panel DP, the light conversion layer LCL may be disposed on the display element layer DPL. For example, the light conversion layer LCL may be provided between the display element layer DPL and the encapsulation layer ENC.

The light conversion layer LCL may include a color filter containing a color filter material of a color corresponding to a color of each pixel PXL and/or color conversion particles (for example, quantum dots) corresponding to the color, and thus light generated in each pixel area of the display element layer DPL may be converted. For example, the light conversion layer LCL may selectively transmit light of a specific wavelength band among the light generated in the display element layer DPL, and/or may convert the wavelength band of the light generated in the display element layer DPL.

Figure 4A:
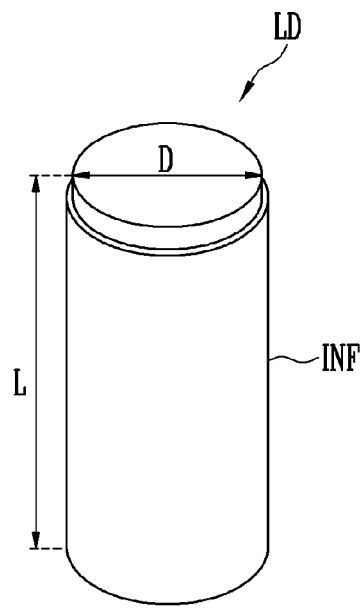
FIG. 4A illustrates a schematic perspective view of a light emitting element according to an embodiment of the disclosure.
Figure 4B:
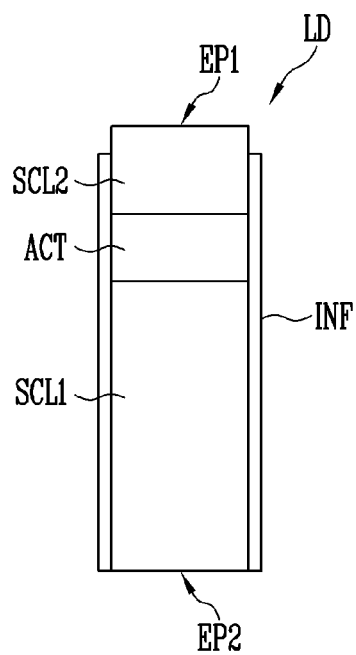
FIG. 4B to FIG. 4D respectively illustrate a schematic cross-sectional view of a light emitting element according to an embodiment of the disclosure.
Figure 4C:
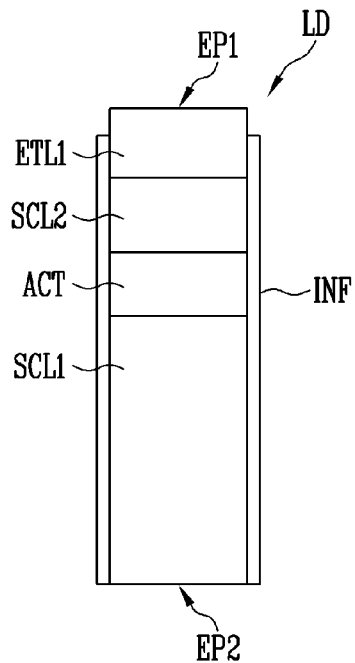
Figure 4D:
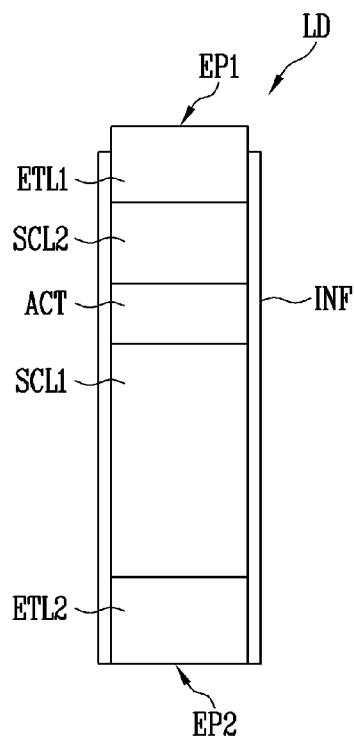

FIG. 4A illustrates a schematic perspective view of a light emitting element LD according to an embodiment of the disclosure. FIG. 4B to FIG. 4D respectively illustrate a schematic cross-sectional view of a light emitting element LD according to an embodiment of the disclosure. For example, FIG. 4B to FIG. 4D illustrate embodiments of different configurations from that of the light emitting element LD of FIG. 4A. FIG. 4A to FIG. 4D illustrate a rod-like light emitting element LD of a circular cylinder shape, but a type and/or shape of the light emitting element LD according to the disclosure is not limited thereto.

Referring to FIG. 4A to FIG. 4D, the light emitting element LD may include a first semiconductor layer SCL1 and a second semiconductor layer SCL2, and an active layer ACT interposed between the first and second semiconductor layers SCL1 and SCL2. For example, the light emitting element LD may include the first semiconductor layer SCL1, the active layer ACT, and the second semiconductor layer SCL2 sequentially stacked on each other along a length L direction.

The light emitting element LD may be provided to have a rod shape extending along a direction. In case that the extending direction of the light emitting element LD is the length L direction, the light emitting element LD may have a first end portion EP1 and a second end portion EP2 along the length L direction.

One of the first and second semiconductor layers SCL1 and SCL2 may be disposed on the first end portion EP1 of the light emitting element LD. Another of the first and second semiconductor layers SCL1 and SCL2 may be disposed on the second end portion EP2 of the light emitting element LD. For example, the second semiconductor layer SCL2 and the first semiconductor layer SCL1 may be disposed on the first end portion EP1 and the second end portion EP2 of the light emitting element LD, respectively.

In some embodiments, the light emitting element LD may be a rod-shaped light emitting diode manufactured in a rod shape through an etching method or the like. In the specification, "rod shape" refers to a rod-like shape or bar-like shape (for example, with an aspect ratio greater than 1) that may be long in the length L direction, such as a circular cylinder or a polygonal cylinder, but a shape of a cross section thereof is not particularly limited. For example, the length L of the light emitting element LD may be larger than a diameter D thereof (or a width of a lateral cross-section thereof).

The light emitting element LD may have a size as small as nano-scale or micro-scale. For example, each light emitting element LD may have a diameter D (or width) and/or length L ranging from a nano scale to a micro scale. However, the size of a light emitting element LD in the disclosure is not limited thereto. For example, the size of the light emitting element LD may be changed according to design conditions of various devices using a light emitting device using the light emitting element LD as a light source, for example, the display device DD.

The first semiconductor layer SCL1 may be a first conductive semiconductor layer. For example, the first semiconductor layer SCL1 may include an N-type semiconductor layer. For example, the first semiconductor layer SCL1 may include a semiconductor material of at least one of InAlGaN, GaN, AlGaN, InGaN, AlN, and InN, and may include a N-type semiconductor layer doped with a first conductive dopant such as Si, Ge, Sn, or the like, or a combination thereof. The first semiconductor layer SCL1 may be formed of various materials.

The active layer ACT may be disposed on the first semiconductor layer SCL1, and may be formed to have a single-quantum or multi-quantum well structure. The position of the active layer ACT may be changed according to the type and/or structure of the light emitting element LD. The active layer ACT may emit light having a wavelength of about 400 nm to about 900 nm, and may have a double hetero-structure. In some embodiments, a material such as AlGaN and AlInGaN may be used to form the active layer ACT, and in addition, various materials may form the active layer ACT.

The second semiconductor layer SCL2 may be disposed on the active layer ACT, and may include a semiconductor layer of a type different from that of the first semiconductor layer SCL1. For example, the second semiconductor layer SCL2 may include a P-type semiconductor layer. For example, the second semiconductor layer SCL2 may include at least one semiconductor material of InAlGaN, GaN, AlGaN, InGaN, AlN, and InN, and may include a P-type semiconductor layer doped with a second conductive dopant such as Mg. The second semiconductor layer SCL2 may be formed of various materials.

In an embodiment, the first semiconductor layer SCL1 and the second semiconductor layer SCL2 may have different lengths (or thicknesses) in the length L direction of the light emitting element LD. For example, the first semiconductor layer SCL1 may have a longer length (or thicker thickness) than that of the second semiconductor layer SCL2 along the length L direction of the light emitting element LD. Accordingly, the active layer ACT of the light emitting element LD may be disposed closer to the first end portion EP1 than to the second end portion EP2.

In case that a voltage of a threshold voltage or more is applied to respective ends of the light emitting element LD, the light emitting device LD emits light while electron-hole pairs may be combined in the active layer ACT. By controlling the light emission of the light emitting element LD by using this principle, the light emitting element LD may be used as a light source for various light emitting devices in addition to the pixels of the display device DD.

In an embodiment, the light emitting element LD may further include an additional constituent element in addition to the first semiconductor layer SCL1, the active layer ACT, the second semiconductor layer SCL2, and/or an insulating film INF surrounding them (to be discussed later). For example, the light emitting element LD may additionally include one or more of a phosphor layer, an active layer, a semiconductor layer, and/or an electrode layer disposed on an end side of the first semiconductor layer SCL1, the active layer ACT, and/or the second semiconductor layer SCL2.

For example, the light emitting element LD may further include an electrode layer ETL1 disposed at an end side of the second semiconductor layer SCL2 as shown in FIG. 4C. The electrode layer ETL1 may be disposed at a first end portion EP1 of the light emitting element LD.

The light emitting element LD may further include another electrode layer ETL2 disposed at an end side of the first semiconductor layer SCL1 as shown in FIG. 4D. For example, the electrode layers ETL1 and ETL2 may be disposed at the first and second end portions EP1 and EP2 of the light emitting element LD.

The electrode layers ETL1 and ETL2 may be an ohmic contact electrode, but are not limited thereto. For example, the electrode layers ETL1 and ETL2 may be a short Schottky contact electrode.

The electrode layers ETL1 and ETL2 may include a metal or conductive oxide. For example, the electrode layers ETL1 and ETL2 may be formed by singly using or mixing chromium (Cr), titanium (Ti), aluminum (Al), gold (Au), nickel (Ni), an oxide thereof or alloy thereof, and an indium tin oxide (ITO). Materials included in respective electrode layers ETL1 and ETL2 may be the same or different from each other.

The electrode layers ETL1 and ETL2 may be substantially transparent or translucent. Accordingly, light generated by the light emitting element LD may pass through the electrode layers ETL1 and ETL2 and may be emitted to the outside of the light emitting element LD. In another embodiment, in case that the light generated by the light emitting element LD does not transmit through the electrode layers ETL1 and ETL2 and is emitted to the outside of the light emitting element LD through an area excluding respective end portions of the light emitting element LD, the electrode layers ETL1 and ETL2 may be opaque.

In an embodiment, the light emitting element LD may further include an insulating film INF provided on a surface thereof. The insulating film INF may be formed on the surface of the light emitting device LD so as to surround at least an outer circumferential surface of the active layer ACT, and may further surround a region of the first and second semiconductor layers SCL1 and SCL2.

In case that the light emitting element LD includes the electrode layers ETL1 and ETL2, the insulating film INF may at least partially or may not cover external circumferential surfaces of the electrode layers ETL1 and ETL2. For example, the insulating film INF may be selectively formed on the surfaces of the electrode layers ETL1 and ETL2.

The insulating film INF may expose respective end portions of the light emitting element LD in the length (L) direction of the light emitting element LD. For example, the insulating film INF may expose at least one of the first and second semiconductor layers SCL1 and SCL2 and of the electrode layers ETL1 and ETL2 at the first and second end portions EP1 and EP2 of the light emitting element LD. In another embodiment, the insulating film INF may not be provided on the light emitting element LD.

In case that the insulating film INF is provided to cover a surface of the light emitting element LD, particularly, an external circumferential surface of the active layer ACT, it may be possible to prevent the active layer ACT from being short-circuited to at least one electrode that is not shown (for example, a pixel electrode and/or a contact electrode to be described later) to prevent short-circuit defects. Accordingly, electrical stability of the light emitting element LD may be secured. In describing embodiments of the disclosure, the term "connection (or coupling)" may comprehensively mean a physical and/or electrical connection (or coupling). This may substantially mean a direct or indirect connection (or coupling), and an integrated or non-integrated connection (or coupling).

The insulating film INF may include a transparent insulating material. For example, the insulating film INF may include at least one insulating material of $SiO_2$ or a silicon oxide (SiOx), $Si_3N_4$ or a silicon nitride (SiNx), $Al_2O_3$ or an aluminum oxide (AlxOy), and $TiO_2$ or a titanium oxide (TixOy), but is not limited thereto.

In case that the insulating film INF is provided on the surface of the light emitting element LD, it may be possible to minimize surface defects of the light emitting element LD. Accordingly, it may be possible to improve the life-span and efficiency of the light emitting element LD.

In embodiment of the disclosure, the light emitting element LD may be manufactured through a surface treatment process. For example, the insulating film INF itself may be formed as a hydrophobic film using a hydrophobic material, or a hydrophobic film made of a hydrophobic material may be additionally formed on the insulating film INF. Accordingly, in case that multiple light emitting elements LD are mixed with a fluid solution (or solvent) and supplied to each light emitting area, the light emitting elements LD may not non-uniformly aggregate in the solution, but they may be uniformly dispersed therein.

A light emitting device including the light emitting element LD may be used in various types of devices that require the display device DD and a light source. For example, multiple light emitting elements LD may be disposed in each pixel of the display panel DP, and the light emitting elements LD may be used as a light source of each pixel. However, an application field of the light emitting element LD is not limited to the above-described example. For example, the light emitting element LD may be used in other types of devices that may require a light source, such as a lighting device.

Figure 5:
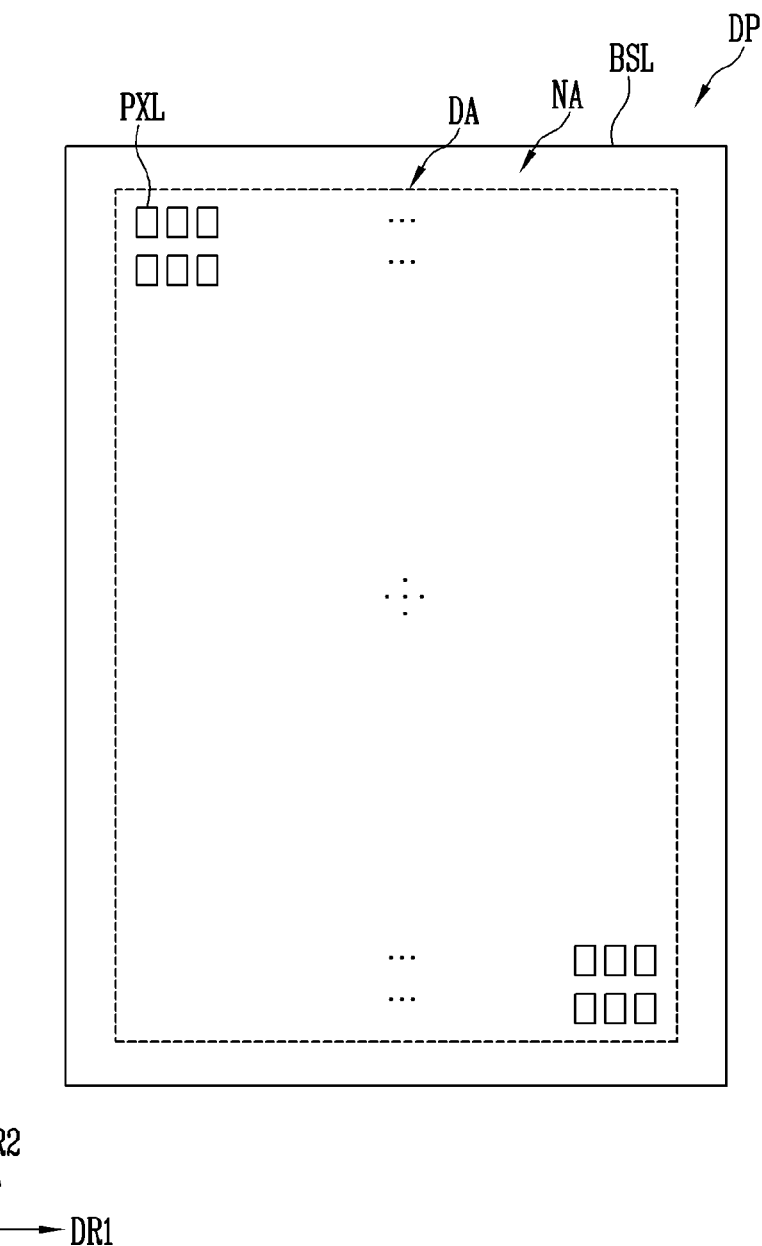
FIG. 5 illustrates a schematic plan view of a display panel according to an embodiment of the disclosure.

FIG. 5 illustrates a schematic plan view of the display panel DP according to an embodiment of the disclosure. In some embodiments, the display panel DP of FIG. 5 may use the light emitting element LD described in the embodiments of FIG. 4A to FIG. 4D as a light source for pixels. For example, each pixel PXL of the display panel DP may include at least one light emitting element LD.

For convenience, FIG. 5 briefly illustrates a structure of the display panel DP based on the display area DA. However, in some embodiments, at least one driving circuit portion, wires, and/or pads, which are not shown, may be further disposed in the display panel DP.

Referring to FIG. 5, the display panel DP may include a base layer BSL, and the pixels PXL provided on the base layer BSL.

The display panel DP and the base layer BSL for forming the display panel may include the display area DA for displaying an image and the non-display area NA excluding the display area DA. The display area DA may configure a screen on which an image may be displayed, and the non-display area NA may be the remaining area except for the display area DA.

The pixels PXL may be disposed in the display area DA on the base layer BSL. For example, the display area DA may include pixel areas in which respective pixels PXL may be disposed. The non-display area NA may be disposed around the display area DA, and various wires and pads connected to the pixels PXL of the display area DA and/or an embedded circuit may be disposed in the non-display area NA.

In some embodiments, at least two types of pixels PXL emitting light of different colors may be disposed in the display area DA. Each pixel unit configured of pixels PXL of different colors disposed adjacent to each other may display various colors.

In an embodiment, each pixel PXL may be set to a pixel of a color, and may include a light emitting element LD that generates light of the color. In another embodiment, at least some of the pixels PXL may include a light emitting element LD that generates light of a first color, and a light conversion layer LCL for converting the light of the first color into light of a second color may be disposed at an upper portion of the pixel PXL. Accordingly, the light of the second color may be generated by using at least some of the pixels PXL.

The pixel PXL may include at least one light source driven by a control signal (for example, a scan signal and a data signal) and/or a power source (for example, a first power source and a second power source). In an embodiment, the light source may include at least one light emitting element LD according to the embodiments of FIG. 4A to FIG. 4D, for example, at least one rod-shaped light emitting element LD having a size as small as nanoscale to microscale. Various types of light emitting elements may be used as a light source of the pixel PXL. For example, in another embodiment, a light source for each pixel PXL may be configured by using a light emitting element having a core-shell structure.

The pixel PXL may have a structure according to at least one of the embodiments to be described below. For example, each pixel PXL may have a structure to which one of embodiments to be described later may be applied, or a structure to which at least two embodiments may be applied in combination.

In an embodiment, the pixel PXL may be configured as an active pixel, but is not limited thereto. For example, the pixel PXL may be configured as a pixel of a passive or active light emitting display device of various structures and/or driving methods.

Figure 6A:
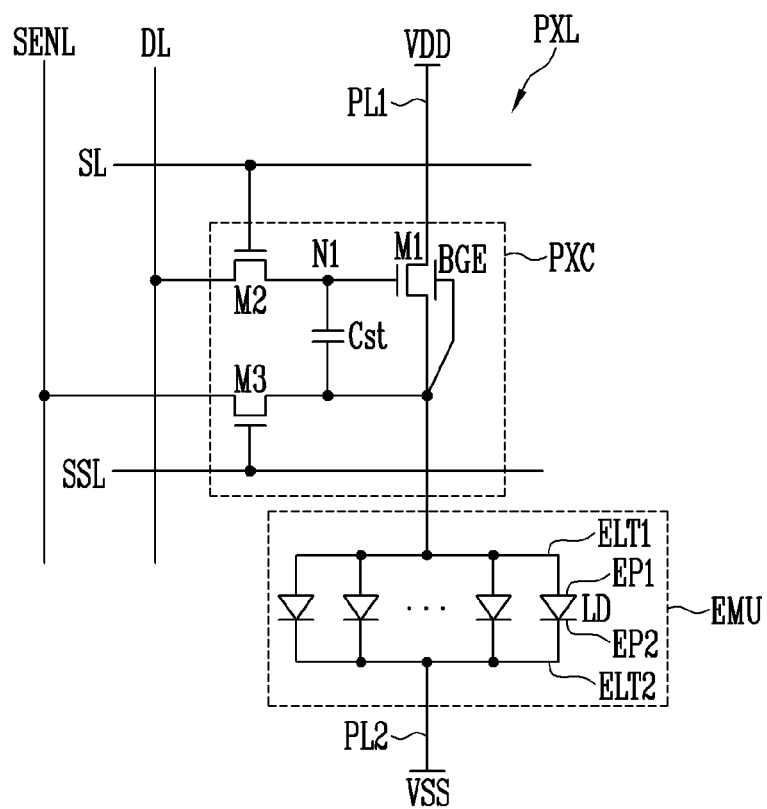
FIG. 6A and FIG. 6B respectively illustrate a schematic circuit diagram of a pixel according to an embodiment of the disclosure.
Figure 6B:
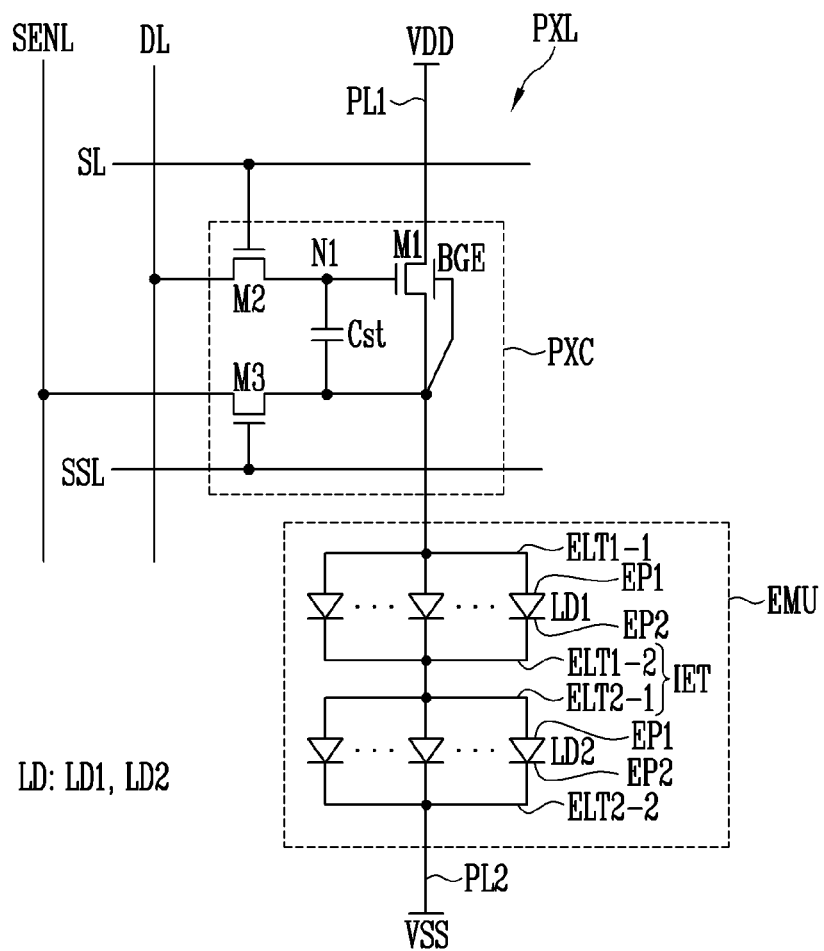

FIG. 6A and FIG. 6B respectively illustrate a schematic circuit diagram of a pixel PXL according to an embodiment of the disclosure. For example, FIG. 6A and FIG. 6B illustrate embodiments of a pixel PXL that may be applied to an active display device, and illustrate different embodiments from each other with respect to a structure of a light emitting part EMU.

In some embodiments, each pixel PXL illustrated in FIG. 6A and FIG. 6B may be one of the pixels PXL disposed in the display area DA of FIG. 5. In an embodiment, the pixels PXL disposed in the display area DA may have substantially the same or similar structure.

Referring to FIG. 6A and FIG. 6B, the pixel PXL may include the light emitting part EMU for generating light with luminance corresponding to a data signal. The pixel PXL may further include a pixel circuit PXC for driving the light emitting part EMU.

The pixel circuit PXC may be connected between a first power source VDD and the light emitting part EMU. The pixel circuit PXC may be connected to a scan line SL and a data line DL of the pixel PXL to control an operation of the light emitting part EMU in response to a scan signal and a data signal supplied from the scan line SL and the data line DL. The pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and the first electrode ELT1 (or a (1-1)-th electrode ELT1-1) of the light emitting part EMU. A gate electrode of the first transistor M1 may be connected to a first node N1. The first transistor M1 may control a driving current supplied to the light emitting part EMU in response to a voltage of the first node N1. For example, the first transistor M1 may be a driving transistor that controls a driving current of the pixel PXL.

In an embodiment, the first transistor M1 may include a back gate electrode BGE. The gate electrode of the first transistor M1 and the back gate electrode BGE may overlap each other with an insulation layer interposed therebetween.

The second transistor M2 may be connected between the data line DL and the first node N1. A gate electrode of the second transistor M2 may be connected to the scan line SL. In case that a scan signal of a gate-on voltage (for example, a high level voltage) is supplied from the scan line SL, the second transistor M2 may be turned on to electrically connect the data line DL and the first node N1.

For each frame period, a data signal of the corresponding frame may be supplied to the data line DL, and the data signal may be transmitted to the first node N1 through the turned-on second transistor M2 during a period in which the scan signal of the gate-on voltage may be supplied. For example, the second transistor M2 may be a switching transistor for transmitting each data signal to the inside of the pixel PXL.

An electrode of the storage capacitor Cst may be connected to the first node N1, and another electrode thereof may be connected to a second electrode of the first transistor M1. The storage capacitor Cst may be charged with a voltage corresponding to the data signal supplied to the first node N1 during each frame period.

The third transistor M3 may be connected between the second electrode of the first transistor M1 and the sensing line SENL. A gate electrode of the third transistor M3 may be connected to the sensing signal line SSL. The third transistor M3 may transmit a voltage applied to the second electrode of the first transistor M1 to the sensing line SENL according to a sensing signal supplied to the sensing signal line SSL during a sensing period. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert image data so that a characteristic deviation between the pixels PXL may be compensated.

FIG. 6A and FIG. 6B illustrate the transistors included in the pixel circuit PXC, for example, all of the first, second, third transistors M1, M2, and M3 as N-type transistors, but the disclosure is not limited thereto. For example, at least one of the first, second, and third transistors M1, M2, and M3 may be changed to be a P-type transistor.

The structure and driving method of the pixel PXL may be variously changed. For example, the pixel circuit PXC may be configured as a pixel circuit having various structures and/or driving methods in addition to those of the embodiments shown in FIG. 6A and FIG. 6B.

For example, the pixel circuit PXC may not include the third transistor M3. The pixel circuit PXC may further include other circuit elements such as a compensation transistor for compensating for a threshold voltage of the first transistor M1, an initialization transistor for initializing the voltage of the first node N1 and/or the first electrode ELT1 (or the (1-1)-th electrode ELT1-1) of the light emitting part EMU, a light emission control transistor for controlling a period in which a driving current may be supplied to the light emitting part EMU, and/or a boosting capacitor for boosting the voltage of the first node N1.

In another embodiment, in case that the pixel PXL is a pixel of a passive light emitting display device, the pixel circuit PXC may be omitted. The light emitting part EMU may be directly connected to the scan line SL, the data line DL, a first power line PL1, a second power line PL2, and/or another signal line or power line.

The light emitting part EMU may include at least one light emitting element LD connected between the first power source VDD and a second power source VSS, for example, multiple light emitting elements LD.

For example, the light emitting part EMU may include the first electrode ELT1 connected to the first power source VDD via the pixel circuit PXC and the first power line PL1, the second electrode ELT2 connected to the second power source VSS through the second power line PL2, and the light emitting elements LD connected between the first and second electrodes ELT1 and ELT2, as in an embodiment of FIG. 6A. The first and second electrodes ELT1 and ELT2 may configure pixel electrodes of each pixel PXL.

The first and second power sources VDD and VSS may have different potentials so that the light emitting elements LD may emit light. For example, the first power source VDD may be set as a high-potential power source, and the second power source VSS may be set as a low-potential power source that may be lower by a threshold voltage of the light emitting elements LD than the first power source VDD.

Each light emitting element LD may include a first end portion EP1 (for example, a P-type end portion thereof) connected to the first power source VDD through the first electrode ELT1 and/or the pixel circuit PXC, and a second end portion EP2 (for example, an N-type end portion thereof) connected to the second power source VSS through the second electrode ELT2. For example, the light emitting elements LD may be connected in parallel in a forward direction between the first and second electrodes ELT1 and ELT2.

Each light emitting element LD that may be connected in a forward direction between the first power source VDD and the second power source VSS may configure each effective light source. The effective light sources may be combined to form the light emitting part EMU of the pixel PXL.

FIG. 6A illustrates an embodiment in which the pixel PXL includes the light emitting part EMU having an in-parallel structure, but the disclosure is not limited thereto. For example, the pixel PXL may include a light emitting part EMU of a serial structure or a serial/in-parallel structure. For example, the light emitting part EMU may include light emitting elements LD that may be divided into two serial stages and connected to each other, as in an embodiment of FIG. 6B.

Referring to FIG. 6B, the light emitting part EMU may include a first serial stage that may include the (1-1)-th electrode ELT1-1, the (1-2)-th electrode ELT1-2, and at least one first light emitting element LD1 connected in a forward direction between the (1-1)-th electrode ELT1-1 and the (1-2)-th electrode ELT1-2, and a second serial stage that may include the (2-1)-th electrode ELT2-1, the (2-2)-th electrode ELT2-2, and at least one second light emitting element LD2 connected in a forward direction between the (2-1)-th electrode ELT2-1 and the (2-2)-th electrode ELT2-2. The (1-1)-th and (1-2)-th electrodes ELT1-1 and ELT1-2 may configure the pixel electrodes of the first serial stage, and the (2-1)-th and (2-2)-th electrodes ELT2-1 and ELT2-2 may configure the pixel electrodes of the second serial stage.

The first electrode of the light emitting part EMU, for example, the (1-1)-th electrode ELT1-1 may be an anode electrode of the light emitting part EMU. The last electrode of the light emitting part EMU, for example, the (2-2)-th electrode ELT2-2 may be a cathode electrode of the light emitting part EMU. The electrodes that may be directly connected between the two serial stages of the light emitting part EMU, for example, the (1-2)-th and (2-1)-th electrodes ELT1-2 and ELT2-1 may be integrally or non-integrally connected to each other to configure an intermediate electrode IET. The (1-2)-th and (2-1)-th electrodes ELT1-2 and ELT2-1 may be combined to be regarded as one intermediate electrode IET.

The number of serial stages configuring each light emitting part EMU may be variously changed according to embodiments. For example, the light emitting part EMU may include light emitting elements LD that may be separated into three or more serial stages and connected to each other.

Each serial stage may include a pair of pixel electrodes and at least one light emitting element LD connected between the pair of pixel electrodes. The number of the light emitting elements LD configuring respective serial stages may be the same or different from each other, but the number of the light emitting elements LD is not particularly limited.

FIG. 6A and FIG. 6B illustrate embodiments in which the light emitting elements LD may be connected in the in-parallel structure or the serial/in-parallel structure, but the disclosure is not limited thereto. For example, in another embodiment, the light emitting elements LD configuring the light emitting part EMU of each pixel PXL may be connected only in series to each other.

In case that the light emitting part EMU is configured by using the light emitting elements LD of the same condition (for example, the same size and/or number) as an effective light source, and in case that the light emitting elements LD are connected in a serial structure or in a serial/parallel structure, power efficiency may be improved. In the pixel PXL in which the light emitting elements LD may be connected in a serial structure or in a serial/parallel structure, even if a short circuit defect occurs at some of the serial stages, since a degree of luminance may be displayed through the light emitting elements LD in the remaining serial stages, the possibility of dark spot defects of the pixel PXL may be reduced.

Each light emitting element LD may include at least one pixel electrode (for example, the (1-1)-th electrode ELT1-1), the first end portion EP1 (for example, a P-type end portion) connected to the first power source VDD via the pixel circuit PXC and/or the first power line PL1, and the second end portion EP2 (for example, an N-type end portion) connected to the second power source VSS via at least one other pixel electrode (for example, the (2-2)-th electrode ELT2-2) and the second power line PL2. For example, the light emitting elements LD may be connected in a forward direction between the first power source VDD and the second power source VSS. Respective light emitting elements LD connected in the forward direction as described above may configure respective effective light sources, and these effective light sources may be combined to form the light emitting part EMU of the pixel PXL.

In case that a driving current is supplied through the corresponding pixel circuit PXC, the light emitting elements LD may emit light with luminance corresponding to the driving current. For example, during each frame period, the pixel circuit PXC may supply a driving current corresponding to a gray value to be displayed in the corresponding frame to the light emitting part EMU. Accordingly, while the light emitting elements LD may emit light with luminance corresponding to the driving current, the light emitting part EMU may display the luminance corresponding to the driving current.

In an embodiment, the light emitting part EMU may further include at least one ineffective light source in addition to the light emitting elements LD configuring each effective light source. For example, in at least one serial stage, at least one ineffective light emitting element that may be arranged in a reverse direction or of which at least one end portion floats may be further connected. The ineffective light emitting element may maintain a deactivated state even in case that a driving voltage of a forward direction is applied between the pixel electrodes, thereby substantially maintaining a non-light emitting state.

Figure 7:
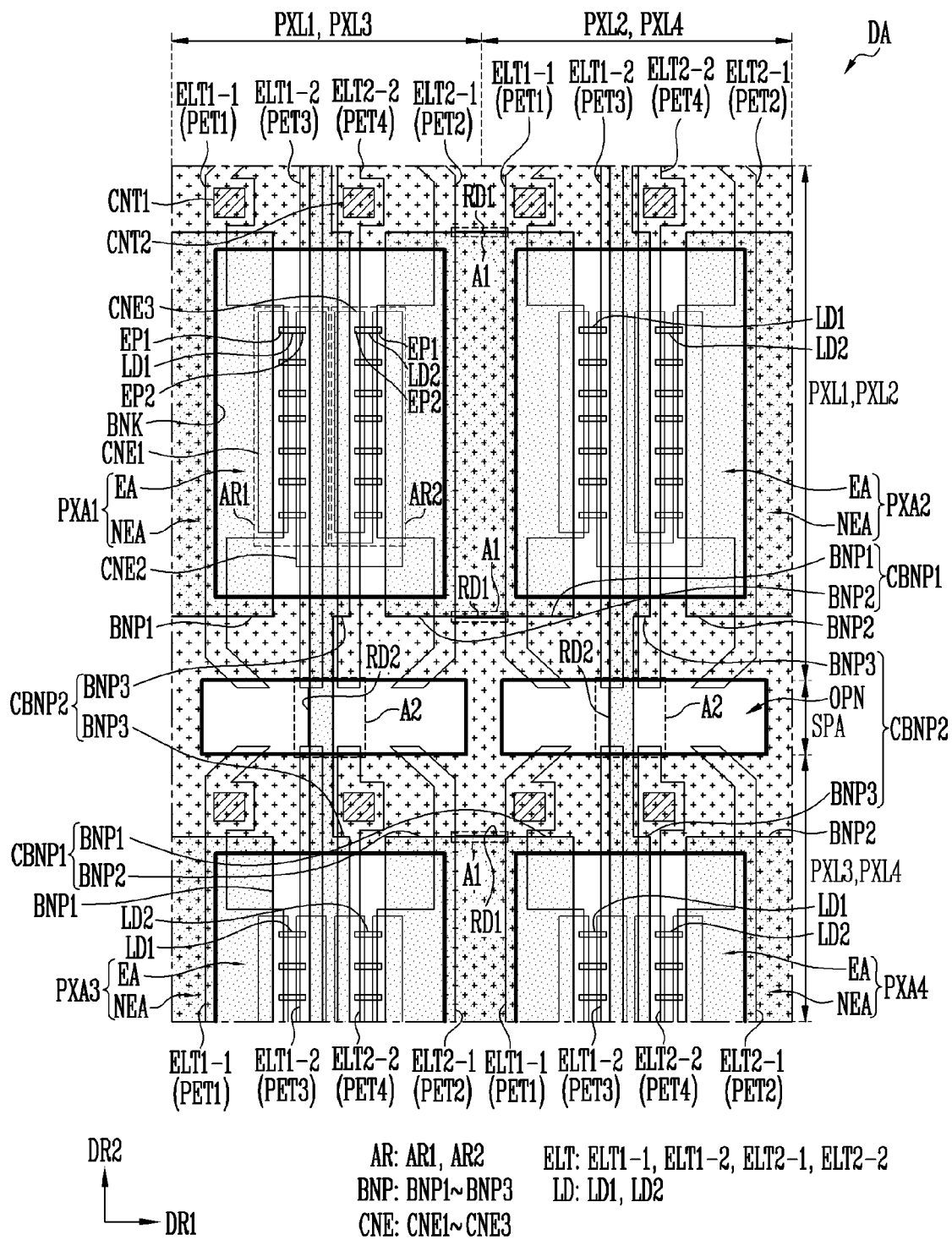
FIG. 7 and FIG. 8 respectively illustrate a schematic plan view of pixels and display areas including the same according to an embodiment of the disclosure.
Figure 8:
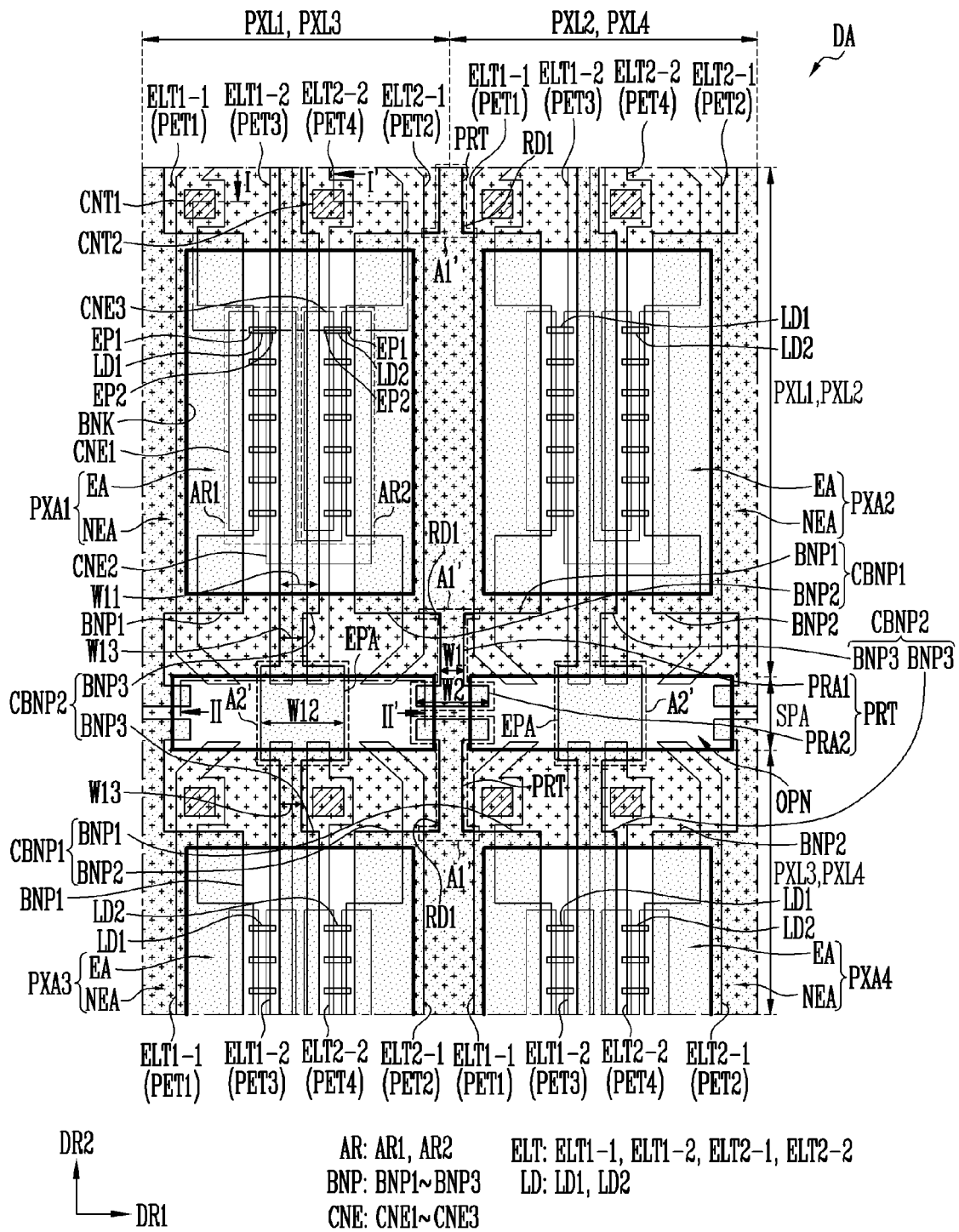

FIG. 7 and FIG. 8 respectively illustrate a schematic plan view of pixels PXL and a display area DA including the same according to an embodiment of the disclosure. For example, FIG. 7 and FIG. 8 illustrates different embodiments with respect to bank pattern portions BNP disposed under pixel electrodes ELT.

FIG. 7 and FIG. 8 illustrate the structure of the display area DA according to each embodiment based on an area in which first to fourth pixels PXL1 to PXL4 may be arranged in a 2*2 matrix format. For example, FIG. 7 and FIG. 8 illustrate only one area of the display area DA, and the display area DA may include pixels PXL disposed along the first direction DR1 and the second direction DR2 in a form in which the structure shown in FIG. 7 or FIG. 8 may be repeated.

FIG. 7 and FIG. 8 illustrate an embodiment in which the first to fourth pixels PXL1 to PXL4 each may include the light emitting part EMU of a two-stage serial/parallel structure as in an embodiment of FIG. 6B, but the disclosure is not limited thereto. FIG. 7 and FIG. 8 illustrate a structure of each pixel PXL based on the light emitting parts EMU of the first to fourth pixels PXL1 to PXL4. In some embodiments, the first to fourth pixels PXL1 to PXL4 may have a substantially equivalent or similar structure, and accordingly, FIG. 7 and FIG. 8 illustrate only one area of light emitting parts EMU with respect to the third and fourth pixels PXL3 and PXL4.

Hereinafter, when arbitrarily referring to at least one of the first to fourth pixels PXL1 to PXL4 or when comprehensively referring to the first to fourth pixels PXL1 to PXL4, it will be referred to as "pixel(s) PXL". Similarly, when arbitrarily referring to at least one of the first to fourth pixel areas PXA1 to PXA4 in which the first to fourth pixels PXL1 to PXL4 may be respectively disposed or when comprehensively referring to the first to fourth pixel areas PXA1 to PXA4, it will be referred to as "pixel areas PXA".

FIG. 7 and FIG. 8 illustrate an embodiment in which each pixel area PXA in which each pixel PXL may be disposed may have a rectangular plate shape, and extension directions of the short side and the long side thereof may be respectively denoted to the first direction DR1 and the second direction DR2. However, this may be changed according to the size and/or shape of the pixel area PXA.

Referring to FIG. 5 to FIG. 8, each pixel PXL may include multiple light emitting element arrangement areas AR corresponding to each serial stage of the light emitting part EMU. For example, the pixel PXL may include a first light emitting element arrangement area AR1 corresponding to the first serial stage and a second light emitting element arrangement area AR2 corresponding to the second serial stage. The first and second light emitting element arrangement areas AR1 and AR2 may be disposed to be spaced apart from each other inside each pixel area PXA.

In some embodiments, in each pixel area PXA, an area including the at least one light emitting element arrangement area AR may form a light emitting area EA of the corresponding pixel PXL. The remaining area of the pixel area PXA except for the light emitting area EA may be a non-light emitting area NEA. In some embodiments, the non-light emitting area NEA may be disposed around the light emitting area EA so as to surround the light emitting area EA.

For example, the pixel area PXA may include the light emitting elements LD, and thus the pixel area PXA may include the light emitting area EA that may emit light, and the non-light emitting area NEA excluding the light emitting area EA. The light emitting area EA may include at least one light emitting element arrangement area AR corresponding to at least one serial stage.

Each light emitting element arrangement area AR may include at least a pair of pixel electrodes ELT and at least one light emitting element LD connected between the pixel electrodes ELT.

For example, the first light emitting element arrangement area AR1 may be an area corresponding to the first serial stage, and may include the (1-1)-th electrode ELT1-1 and the (1-2)-th electrode ELT1-2, and at least one first light emitting element LD1 disposed and/or connected between the (1-1)-th electrode ELT1-1 and the (1-2)-th electrode ELT1-2. Similarly, the second light emitting element arrangement area AR2 may be an area corresponding to the second serial stage, and may include the (2-1)-th electrode ELT2-1 and the (2-2)-th electrode ELT2-2, and at least one second light emitting element LD2 disposed and/or connected between the (2-1)-th electrode ELT2-1 and the (2-2)-th electrode ELT2-2.

Each light emitting element arrangement area AR may further include contact electrodes CNE for stably connecting each pixel electrode ELT to the light emitting element LD adjacent thereto, and/or connecting two consecutive serial stages. In describing an embodiment, the (1-1)-th electrode ELT1-1 and the (1-2)-th electrode ELT1-2, and the (2-1)-th electrode ELT2-1 and the (2-2)-th electrode ELT2-2 may be defined as pixel electrodes ELT, and the contact electrodes CNE will be described as separate elements from the pixel electrodes ELT. However, the disclosure is not limited thereto. For example, the (1-1)-th electrode ELT1-1 and the (1-2)-th electrode ELT1-2, the (2-1)-th electrode ELT2-1 and the (2-2)-th electrode ELT2-2, and the contact electrodes CNE may also be regarded as electrodes ELT.

In some embodiments, the first and second light emitting element arrangement areas AR1 and AR2 may have substantially similar or same structure to each other, but are not limited thereto. The number of light emitting elements LD disposed in the first and second light emitting element arrangement areas AR1 and AR2, and the shape of the pixel electrodes ELT and/or the contact electrodes CNE may be the same or different.

In a more general view of the structure of the pixel PXL, the pixel PXL may include multiple pixel electrodes ELT formed in the pixel area PXA, the light emitting elements LD arranged between the pixel electrodes ELT in each light emitting element arrangement area AR, and the contact electrodes CNE for stably connecting the light emitting elements LD between the pixel electrodes ELT.

The pixel PXL may further include a bank BNK surrounding each light emitting area EA, and bank pattern portions BNP disposed under the pixel electrodes ELT. The bank BNK may be disposed in the non-light emitting area NEA so as to surround each light emitting area EA. The bank pattern portions BNP may be disposed in at least light emitting area EA to overlap an area of the pixel electrodes ELT, and may extend to the non-light emitting area NEA.

In some embodiments, based on a surface of the base layer BSL on which the pixels PXL may be formed, and the bank pattern portions BNP, the pixel electrodes ELT, the bank BNK, the light emitting elements LD, and the contact electrodes CNE may be sequentially disposed. A detailed description of the cross-sectional structure of the pixel PXL will be described later.

The pixel electrodes ELT may include at least a pair of electrodes disposed in each light emitting element arrangement area AR. For example, the pixel electrodes ELT may include the (1-1)-th electrode ELT1-1 and the (1-2)-th electrode ELT1-2 disposed to face each other in the first light emitting element arrangement area AR1, and the (2-1)-th electrode ELT2-1 and the (2-2)-th electrode ELT2-2 disposed to face each other in the second light emitting element arrangement area AR2.

The pixel electrodes ELT may be spaced apart from each other along the first direction DR1 in each light emitting area EA, and may respectively extend along the second direction DR2. In an embodiment, the first direction DR1 may be a row direction (or horizontal direction) of the display area DA, and the second direction DR2 may be a column direction (or vertical direction) of the display area DA, but they are not limited thereto.

In each pixel area PXA, the pixel electrodes ELT may have a uniform width or a non-uniform width, and may or may not include a curved portion. For example, the structure of each shape and/or mutual arrangement of the pixel electrodes ELT may be variously changed according to embodiments.

In the entire display area DA, some of the pixel electrodes ELT may be first formed as an alignment wire, and may be disconnected in an area (for example, a separation area SPA disposed at an upper end and/or a lower end of each pixel area PXA) between the adjacent pixels PXL and divided into respective pixel electrodes ELT. Accordingly, while reducing the number of alignment signals for aligning the light emitting elements LD in each light emitting area EA, it may be possible to divide each pixel electrode ELT into ones capable of individual driving.

FIG. 7 and FIG. 8 illustrate an embodiment in which multiple light emitting element arrangement areas AR may be included in the light emitting area EA of each pixel PXL only along the first direction DR1, but the disclosure is not limited thereto. For example, the light emitting area EA of each pixel PXL may include multiple light emitting element arrangement areas AR that may be sequentially arranged in the second direction DR2, and at least one additional separation area may be disposed between the light emitting element arrangement areas AR that may be sequentially arranged along the second direction DR2. For example, in another embodiment, the light emitting part EMU having a four-stage serial structure may be configured by disposing two light emitting element arrangement areas AR along the first direction DR1 and the second direction DR2, respectively. As in the separation area SPA illustrated in FIG. 7 and FIG. 8, at least one alignment wire may be disconnected to be divided into respective pixel electrodes ELT even in the additional separation area.

A pair of pixel electrodes ELT configuring each serial stage may be disposed to be close to each other in each light emitting element arrangement area AR, and may be disposed at a relatively long distance in the remaining areas. For example, a pair of pixel electrodes ELT may be disposed to face each other with a relatively narrow gap in each light emitting element arrangement area AR, and may be disposed to face each other with a relatively wide gap in the non-light emitting area NEA. To this end, at least one pixel electrode ELT may be formed to be curved, or a width of the at least one pixel electrode ELT may be changed for each area.

Accordingly, in a process of supplying and aligning the light emitting elements LD in each pixel area PXA, it may be possible to arrange the light emitting elements LD in a desired area. For example, in case of aligning the light emitting elements LD in each pixel area PXA by applying an alignment signal to the pixel electrodes ELT (or, alignment wires before being separated into the pixel electrodes ELT), while a stronger electric field may be generated in the light emitting element arrangement areas AR in which the pixel electrodes ELT may be close to each other, the light emitting elements LD may be arranged inside the light emitting element arrangement areas AR.

A pixel electrode ELT, for example, the (1-1)-th electrode ELT1-1, may be connected to the pixel circuit (PXC) and/or the first power line PL1 through a first contact portion CNT1. Another of the pixel electrodes ELT, for example, the (2-2)-th electrode ELT2-2 may be connected to the second power line PL2 through a second contact portion CNT2.

In some embodiments, the pixel electrodes ELT may be connected to the light emitting elements LD through the contact electrodes CNE. For example, each pixel electrode ELT may be connected to the first end portion EP1 or a second end portion EP2 of at least one light emitting element LD adjacent thereto through each contact electrode CNE.

The light emitting elements LD may be separated and arranged in each light emitting element arrangement area AR. The light emitting elements LD may be arranged between a pair of pixel electrodes ELT disposed in each light emitting element arrangement area AR. Here, that the light emitting elements LD may be arranged between the pair of pixel electrodes ELT may mean that at least one area of the light emitting elements LD may be arranged in an area between the pair of pixel electrodes ELT and/or in an upper/lower area thereof.

For example, the light emitting elements LD may include the first and second light emitting elements LD1 and LD2 which may be separated into and arranged in the first and second light emitting element arrangement areas AR1 and AR2. The first light emitting elements LD1 may be arranged and connected between the (1-1)-th and (1-2)-th electrodes ELT1-1 and ELT1-2, and the second light emitting elements LD2 may be arranged and connected between the (2-1)-th and (2-2)-th electrodes ELT2-1 and ELT2-2.

In an embodiment, the light emitting elements LD may be connected to each pixel electrode ELT by each contact electrode CNE. The light emitting elements LD disposed in two consecutive serial stages may be connected in series with each other by at least one contact electrode CNE.

For example, the pixel PXL may include contact electrodes CNE that may be disposed on each pixel electrode ELT and that connect the first or second end portion EP1 or EP2 of at least one light emitting element LD adjacent to the pixel electrode ELT to the pixel electrode ELT. For example, the pixel PXL may include first to third contact electrodes CNE1 to CNE3.

The first contact electrode CNE1 may be disposed on the first end portions EP1 of the first light emitting elements LD1 and the (1-1)-th electrode ELT1-1. The first contact electrode CNE1 may connect the first end portions EP1 of the first light emitting elements LD1 to the (1-1)-th electrode ELT1-1.

The second contact electrode CNE2 may be disposed on the second end portions EP2 of the first light emitting elements LD1 and the (1-2)-th electrode ELT1-2 to connect the second end portions EP2 of the first light emitting elements LD1 to the (1-2)-th electrode ELT1-2. The second contact electrode CNE2 may be disposed on the first end portions EP1 of the second light emitting elements LD2 and the (2-1)-th electrode ELT2-1 to connect the first end portions EP1 of the second light emitting elements LD2 to the (2-1)-th electrode ELT2-1.

To this end, the second contact electrode CNE2 may extend from the first light emitting element arrangement area AR1 to the second light emitting element arrangement area AR2 to connect the (1-2)-th electrode ELT1-2 to the (2-1)-th electrode ELT2-1. In another embodiment, the second contact electrode CNE2 may be configured of multiple separate electrodes that may be disposed in the first and second light emitting element arrangement areas AR1 and AR2, respectively, and the separate electrodes may be connected to each other through a bridge pattern or the like. The first serial stage and the second serial stage may be connected by the second contact electrode CNE2.

The third contact electrode CNE3 may be disposed on the second end portions EP2 of the second light emitting elements LD2 and the (2-2)-th electrode ELT2-2 to connect the second end portions EP2 of the second light emitting elements LD2 to the (2-2)-th electrode ELT2-2.

As such, the pixel electrodes ELT and the light emitting elements LD may be connected in a desired form by using the contact electrodes CNE. For example, the first light emitting elements LD1 and the second light emitting elements LD2 may be connected in series by using the contact electrodes CNE.

In order to increase a utilization rate of the light emitting elements LD supplied to each light emitting element arrangement area AR, by adjusting an alignment signal for aligning the light emitting elements LD or by forming a magnetic field, the light emitting elements LD may be deflected and aligned so that a larger number (or ratio) of the light emitting elements LD in each light-emitting element arrangement area AR may be aligned in a specific direction. It may be possible to connect the pixel electrodes ELT according to an arrangement direction of a larger number of light emitting elements LD by using the contact electrodes CNE. Accordingly, it may be possible to improve the utilization rate of light emitting elements LD and improve the light efficiency of the pixel PXL.

For example, a first alignment signal may be applied to first and second alignment wires disposed in first and second side areas (for example, left and right areas) positioned at both sides in the first direction DR1 in each pixel area PXA, and a second alignment signal may be applied to a third alignment wire(s) disposed in a central area between the first and second side areas. The light emitting elements LD may be deflected and aligned so that the first end portions EP1 of the first light emitting elements LD1 may be further directed to the first side area, and the first end portions EP1 of the second light emitting elements LD2 may be further directed to the second side areas.

Thereafter, the alignment wires may be cut in each separation area SPA to be separated into each pixel electrodes ELT, and the pixel electrodes ELT and light emitting elements LD may be connected in a desired direction by using contact electrodes CNE. For example, the pixel electrodes ELT of the adjacent pixels PXL along the second direction DR2 may be disconnected and separated from each other in the separation area SPA between the pixels PXL.

For example, a first pixel electrode PET1 disposed in the first side area (for example, the left area) of each pixel area PXA may be formed as the (1-1)-th electrode ELT1-1, and a second pixel electrode PET2 disposed in the second side area (for example, the right area) of the pixel area PXA may be formed as the (2-1)-th electrode ELT2-1. A third pixel electrode PET3 disposed in the first light emitting element arrangement area AR1 to face the (1-1)-th electrode ELT1-1 may be formed as the (1-2)-th electrode ELT1-2, and a fourth pixel electrode PET4 disposed in the second light emitting element arrangement area AR2 to face the (2-1)-th electrode ELT2-1 may be formed as the (2-2)-th electrode ELT2-2.

Each contact electrode CNE may be directly formed on the first or second end portions EP1 or EP2 of the adjacent light emitting elements LD, thereby being connected to the first or second end portions EP1 and EP2 of the light emitting elements LD. Each contact electrode CNE may be directly formed on each pixel electrode(s) ELT, and thus it may be connected to the pixel electrode(s) ELT, or may be connected to each pixel electrode(s) ELT through at least one contact hole and/or bridge pattern.

The bank BNK may be a structure defining the light emitting area EA of each pixel PXL, and may be, for example, a pixel defining layer. For example, the bank BNK may be disposed around the light emitting area EA so as to surround the light emitting area EA of each pixel PXL. For example, the bank BNK may be disposed in a boundary area of each pixel area PXA and/or an area between adjacent pixel areas PXA.

In an embodiment, the bank BNK may have an opening OPN corresponding to each separation area SPA. Accordingly, it may be possible to easily separate the pixel electrodes ELT from the separation area SPA.

The bank BNK may or may not partially overlap the pixel electrodes ELT. For example, each pixel electrode ELT may extend to the non-light emitting area NEA so as to overlap the bank BNK, or may be disconnected within the light emitting area EA so as to not overlap the bank BNK.

The bank BNK may or may not overlap the first and/or second contact portions CNT1 and CNT2. For example, the first and/or second contact portions CNT1 and CNT2 may be formed in the non-light emitting area NEA so as to overlap the bank BNK, or may be formed in the light emitting area EA so as to not overlap the bank BNK.

The bank BNK may include at least one light-blocking and/or reflective material to prevent light leakage between adjacent pixels PXL. For example, the bank BNK may include at least one black matrix material (for example, at least one light-blocking material) among various types of black matrix materials, and/or a color filter material of a specific color. For example, the bank BNK may be formed in a black opaque pattern to block light transmission. In an embodiment, a reflective layer (not shown) may be formed on a surface (for example, a side wall) of the bank BNK to further increase a light efficiency of the pixel PXL.

The bank BNK may function as a dam structure that defines each light emitting area EA in which the light emitting elements LD should be supplied at the supplying the light emitting elements LD to each pixel PXL. For example, each light emitting area EA may be partitioned by the bank BNK, so that a desired type and/or amount of light emitting element ink may be supplied into the light emitting area EA.

In an embodiment, the bank BNK may be simultaneously formed on the same layer as the bank pattern portions BNP in the process of forming the bank pattern portions BNP. In another embodiment, the bank BNK may be formed in the same or different layer as the bank pattern portions BNP through a process separate from the process of forming the bank pattern portions BNP. For example, the bank BNK may be formed on the bank pattern portions BNP. The position of the bank BNK may vary according to embodiments. The bank BNK may or may not partially overlap the bank pattern portions BNP.

The bank pattern portions BNP may be disposed under the pixel electrodes ELT. For example, the bank pattern portions BNP may be disposed under the pixel electrodes ELT so as to overlap an area of each of the pixel electrodes ELT.

A wall structure may be formed around the light emitting elements LD by the bank pattern portions BNP. Specifically, as the bank pattern portions BNP may be disposed under an area of each of the pixel electrodes ELT, the pixel electrodes ELT may protrude in an upward direction in an area in which the bank pattern portions BNP may be formed. Accordingly, the bank pattern portions BNP may form a reflective wall structure together with the pixel electrodes ELT. For example, the pixel electrodes ELT and/or the bank pattern portions BNP may be formed of a reflective material, or at least one reflective film having reflective properties may be formed on a protruding sidewall of the pixel electrodes ELT and/or the bank pattern portions BNP. Accordingly, the light emitted from the first and second end portions EP1 and EP2 of the light emitting elements LD facing the pixel electrodes ELT may be induced to be more directed toward a front direction of the display panel DP. As such, in case that an area of the pixel electrodes ELT is protruded in the upward direction by using the bank pattern portions BNP, the light efficiency of the pixels PXL may be improved.

In an embodiment, the bank pattern portions BNP may be formed to have a height or more to improve the light efficiency of the pixels PXL. For example, the bank pattern portions BNP may be formed to have a height of approximately 3 µm or more, but the height is not limited thereto.

In some embodiments, the bank pattern portions BNP may include first, second, and third bank pattern portions BNP1, BNP2, and BNP3. Based on each pixel area PXA, the first bank pattern portion BNP1 and the second bank pattern portion BNP2 may be disposed to face each other at respective sides of the pixel area PXA in the first direction DR1, and the third bank pattern portion BNP3 may be disposed in a central area of the pixel area PXA to be disposed between the first and second bank pattern portions BNP1 and BNP2.

The first bank pattern portion BNP1 may be disposed in the first side area (for example, the left area) of the pixel area PXA, and may partially overlap the (1-1)-th electrode ELT1-1 (also referred to as the "first pixel electrode PET1") first arranged in the first direction DR1 among the pixel electrodes ELT. For example, the first bank pattern portion BNP1 may overlap the left area of the (1-1)-th electrode ELT1-1 in each light emitting area EA, so that it allows the left area of the (1-1)-th electrode ELT1-1 to protrude in the upper direction of the pixel PXL. Accordingly, a reflective wall structure may be formed around the first end portions EP1 of the first light emitting elements LD1.

The second bank pattern portion BNP2 may be disposed in the second side area (for example, the right area) of the pixel area PXA, and may partially overlap the (2-1)-th electrode ELT2-1 (also referred to as the "second pixel electrode PET2") lastly arranged in the first direction DR1 among the pixel electrodes ELT. For example, the second bank pattern portion BNP2 may overlap the right area of the (2-1)-th electrode ELT2-1 in each light emitting area EA, so that it allows the right area of the (2-1)-th electrode ELT2-1 to protrude in the upper direction of the pixel PXL. Accordingly, a reflective wall structure may be formed around the first end portions EP1 of the second light emitting elements LD2.

The third bank pattern portion BNP3 may be disposed in the central area of the pixel area PXA to partially overlap at least one pixel electrode ELT disposed between the (1-1)-th electrode ELT1-1 and the (2-1)-th electrode ELT2-1. For example, the third bank pattern portion BNP3 may partially overlap each of the (1-2)-th electrode ELT1-2 (also referred to as a "third pixel electrode PET3") and the (2-2)-th electrode ELT2-2 (also referred to as a "fourth pixel electrode PET4"). As an example, the third bank pattern portion BNP3 may overlap the right area of the (1-2)-th electrode ELT1-2 and the left area of the (2-2)-th electrode ELT2-2 in each light emitting area EA, so that it allows an area of each of the (1-2)-th electrode ELT1-2 and the (2-2)-th electrode ELT2-2 to protrude in the upper direction of the pixel PXL. Accordingly, a reflective wall structure may be formed around the second end portions EP2 of the first and second light emitting elements LD1 and LD2.

In some embodiments, the adjacent pixels PXL in the first direction DR1 may share at least one bank pattern portion BNP. The first pixel PXL1 and the second pixel PXL2 adjacent in the first direction DR1, for example, the second bank pattern portion BNP2 of the first pixel PXL1 and the first bank pattern portion BNP1 of the second pixel PXL2 may be integrally connected to each other to form a first integrated bank pattern CBNP1. Similarly, the second bank pattern portion BNP2 of the third pixel PXL3 and the first bank pattern portion BNP1 of the fourth pixel PXL4 that may be adjacent in the first direction DR1, may be integrally connected to each other to form another first integrated bank pattern CBNP1.

In this way, two pixels PXL adjacent along the first direction DR1 in the display area DA may share a first integrated bank pattern CBNP1. For example, each first integrated bank pattern CBNP1 may have a width extending along the first direction DR1 from a boundary area between two pixels PXL adjacent along the first direction DR1 so as to overlap a pixel electrode of each of the two pixels PXL. Each pixel row may include multiple first integrated bank patterns CBNP1 disposed in the boundary area of the pixels PXL.

Each first integrated bank pattern CBNP1 may be formed as an individual pattern disposed in the boundary area between two adjacent pixels PXL in the first direction DR1. For example, each first integrated bank pattern CBNP1 may be disconnected in upper and lower areas of each pixel row.

The adjacent pixels PXL in the second direction DR2 may also share at least another bank pattern portion BNP. The first pixel PXL1 and the third pixel PXL3 adjacent in the second direction DR2, for example, the third pattern portion BNP3 of the first pixel PXL1 and the third bank pattern portion BNP3 of the third pixel PXL3 may be integrally connected to each other to form a second integrated bank pattern CBNP2. Similarly, the third bank pattern portion BNP3 of the second pixel PXL2 and the third bank pattern portion BNP3 of the fourth pixel PXL4 that may be adjacent in the second direction DR2, may be integrally connected to each other to form another second integrated bank pattern CBNP2.

In this way, at least two pixels PXL adjacent along the second direction DR2 in the display area DA may share the second integrated bank pattern CBNP2. For example, each second integrated bank pattern CBNP2 may be commonly formed in the pixels PXL arranged in each pixel column of the display area DA.

Each second integrated bank pattern CBNP2 may extend along the second direction DR2 in the display area DA, and may be disposed in each pixel column. As an example, each second integrated bank pattern CBNP2 may extend along the second direction DR2 in the display area DA so as to commonly overlap the pixel electrodes ELT disposed in the central area of the pixels PXL (for example, the (1-2)-th and (2-2)-th electrodes ELT1-2 and ELT2-2) arranged in each pixel column of the display area DA along the second direction DR2.

In an embodiment of FIG. 7, both end portions of the first integrated bank pattern CBNP1 in the second direction DR2, for example, circumferences of the upper and lower areas thereof may be connected in a straight line along the first direction DR1. As an example, the first integrated bank pattern CBNP1 may have a rectangular shape in a plan view.

A short-circuit defect may occur between adjacent pixel electrodes ELT of two adjacent pixels PXL in the first direction DR1. For example, in a process of forming a conductive film in the display area DA and patterning the conductive film to form the pixel electrodes ELT, residues RD1 of the conductive film may be connected along the circumference of the first integrated bank pattern CBNP1, in the areas A1 between the (2-1)-th electrode ELT2-1 of the first pixel PXL1 and the (1-1)-th electrode ELT1-1 of the second pixel PXL2 due to a step formed by the first integrated bank pattern CBNP1. Accordingly, a short circuit defect may occur between the (2-1)-th electrode ELT2-1 of the first pixel PXL1 and the (1-1)-th electrode ELT1-1 of the second pixel PXL2. For the same reason, a short circuit defect may also occur between the (2-1)-th electrode ELT2-1 of the third pixel PXL3 and the (1-1)-th electrode ELT1-1 of the fourth pixel PXL4. In case that a short circuit defect occurs in the pixel electrodes ELT, since the pixel electrodes ELT may not be individually controlled, a driving failure may occur.

In an embodiment of FIG. 8, the first integrated bank pattern CBNP1 has a shape in which a circumference thereof may be extended between adjacent pixel electrodes ELT of two adjacent pixels PXL in the first direction DR1. For example, the first integrated bank pattern CBNP1 may include protrusions PRT of which both end portions extend in the second direction DR2 in the boundary area (particularly, the central area) between the first and second pixels PXL1 and PXL2.

For example, in areas A1' between the (2-1)-th electrode ELT2-1 of the first pixel PXL1 and the (1-1)-th electrode ELT1-1 of the second pixel PXL2, the first integrated bank pattern CBNP1 disposed in the boundary area of the first and second pixels PXL1 and PXL2 may include protrusions protruding in directions of a previous pixel row and a next pixel row from both ends of the upper and lower end thereof, respectively. When viewed in a plan view, each protrusion PRT may be disposed in an area between the (2-1)-th electrode ELT2-1 of the first pixel PXL1 and the (1-1)-th electrode ELT1-1 of the second pixel PXL2.

Similarly, in areas A1' between the (2-1)-th electrode ELT2-1 of the third pixel PXL3 and the (1-1)-th electrode ELT1-1 of the fourth pixel PXL4, the first integrated bank pattern CBNP1 disposed in the boundary area of the third and fourth pixels PXL3 and PXL4 may include protrusions protruding in directions of a previous pixel row and a next pixel row from both ends of the upper and lower end thereof, respectively. When viewed in a plan view, each protrusion PRT may be disposed in an area between the (2-1)-th electrode ELT2-1 of the third pixel PXL3 and the (1-1)-th electrode ELT1-1 of the fourth pixel PXL4.

In this way, each first integrated bank pattern CBNP1 may protrude along the second direction DR2 in the boundary area between two adjacent pixels PXL in the first direction DR1. Accordingly, a path for formation of the residues of the conductive film between adjacent pixel electrodes ELT of the two adjacent pixels PXL in the first direction DR1 becomes longer. For example, in the areas A1' between the (2-1)-th electrode ELT2-1 of the first pixel PXL1 and the (1-1)-th electrode ELT1-1 of the second pixel PXL2, and in the areas A1' between the (2-1)-th electrode ELT2-1 of the third pixel PXL3 and the (1-1)-th electrode ELT1-1 of the fourth pixel PXL4, the path for formation of the residues of the conductive film becomes longer.

Therefore, even if the residues RD1 of the conductive film occurs along the circumference of the first integrated bank pattern CBNP1, a middle of the residues RD1 of the conductive film may be disconnected. Accordingly, a short circuit defect between the pixel electrodes ELT due to residual RD1 of the conductive film along the first direction DR1 may be prevented.

In an embodiment, the protrusions PRT of the first integrated bank pattern CBNP1 may include at least one corner portion (for example, angled corner portion). For example, respective protrusions PRT may include a first area PRA1 and a second area PRA2 that may be sequentially disposed along the second direction DR2 and respectively have a first width W1 and a second width W2 along the first direction DR1.

In an embodiment, the first area PRA1 and the second area PRA2 may have a rectangular shape, respectively, and the second width W2 may be larger than the first width W1. Both side areas of the protrusion PRT may have a step shape whose width may be extended at ends thereof.

As described above, in case that each protrusion PRT includes a corner portion (for example, an angled corner portion), even if the residues RD1 of the conductive film occurs during a patterning process of the pixel electrodes ELT, a middle portion of the residues RD1 of the conductive film may be disconnected. For example, in case that each protrusion PRT includes an angled corner portion, the disconnection effect of the residue RD1 may be further improved.

According to an embodiment of FIG. 8, even if the first integrated bank pattern BNP1 includes an end portion crossing the area between the adjacent pixel electrodes ELT along the first direction DR1, the path for the formation of the residues of the conductive film may be increased by protrusions PRT, and thus a short circuit defect between the pixel electrodes ELT may be prevented.

The separation area SPA may be disposed between the adjacent pixels PXL along the second direction DR2. The pixel electrodes ELT may be first formed in a form of alignment wires extending along the second direction DR2 in the display area DA, and after the alignment of the light emitting elements LD may be completed, they may be etched in each separation area SPA to be separated into pixel electrodes ELT. For example, the pixel electrodes ELT may be formed by disposing a photo mask on the remaining areas of the display area DA excluding each separation area SPA and etching the alignment wires in the separation area SPA.

As in an embodiment of FIG. 7, in case that at least one side of the second integrated bank pattern CBNP2 passing through each separation area SPA overlaps at least one pixel electrode ELT in the separation area SPA and extends in the second direction DR2, a short circuit defect may occur between adjacent pixel electrodes ELT of two adjacent pixels PXL in the second direction DR2. For example, the residues RD2 of the conductive film may be connected along the left circumference of the second integrated bank pattern CBNP2, in the area A2 between the (1-2)-th electrode ELT1-2 of the first pixel PXL1 and the (1-2)-th electrode ELT1-2 of the third pixel PXL3 due to the step formed by the second integrated bank pattern CBNP2. Accordingly, a short circuit defect may occur between the (1-2)-th electrode ELT1-2 of the first pixel PXL1 and the (1-2)-th electrode ELT1-2 of the third pixel PXL3. For the same reason, a short circuit defect may also occur between the (1-2)-th electrode ELT1-2 of the second pixel PXL3 and the (1-2)-th electrode ELT1-2 of the fourth pixel PXL4. Since the pixel electrodes ELT in which short circuit defects occur may not be individually controlled, a driving failure may occur.

Accordingly, in an embodiment of FIG. 8, the residues RD2 of the conductive film that may occur in the separation area SPA may be prevented as in an embodiment of FIG. 7, by forming an extension EPA in the second integrated bank pattern CBNP2 passing through the separation area SPA.

Specifically, in an embodiment of FIG. 8, each second integrated bank pattern CBNP2 configuring each third bank pattern portion BNP3 and/or multiple third bank pattern portions BNP3 may include the extension EPA having an extended width in correspondence with the separation area SPA. For example, the third bank pattern portions BNP3 formed in the first and third pixels PXL1 and PXL3 and the second integrated bank pattern CBNP2 configured of the third bank pattern portions BNP3 may have a first width W11 that may partially overlap only the (1-2)-th electrodes ELT1-2 of the first and third pixels PXL1 and PXL3 in the light emitting area EA of each of the first and third pixels PXL1 and PXL3, and may have a second width W12 that may completely overlap the (1-2)-th electrodes ELT1-2 of the first and third pixels PXL1 and PXL3 (or the end portions of the (1-2)-th electrodes ELT1-2) in the separation area SPA between the first and third pixels PXL1 and PXL3.

In an embodiment, the second integration bank pattern CBNP2 may have a width (the second width W12) wider than a distance from the left end portion of the (1-2)-th electrode ELT1-2 of each of the first and third pixels PXL1 and PXL3 to the right end portion of the (2-2)-th electrode ELT2-2 of each of the first and third pixels PXL1 and PXL3 (or, a width in the first direction DR1 corresponding thereto), in the separation area SPA between the first and third pixels PXL1 and PXL3.

For example, in the separation area SPA between the first and third pixels PXL1 and PXL3, the second integrated bank pattern CBNP2 may completely cover the lower portions of the (1-2)-th and (2-2)-th electrodes ELT1-2 and ELT2-2 of the first and third pixels PXL1 and PXL3 while completely overlapping the (1-2)-th and (2-2)-th electrodes ELT1-2 and ELT2-2 of the first and third pixels PXL1 and PXL3. Accordingly, in the separation area SPA (for example, an area A2'), the (1-2)-th and (2-2)-th electrodes ELT1-2 and ELT2-2 of the first and third pixels PXL1 and PXL3 may be disconnected on a flat upper surface of the second integrated bank pattern CBNP2.

Similarly, the second integrated bank pattern CBNP2 formed in the second and fourth pixels PXL2 and PXL4 may have the second width W12 that may completely overlap the (1-2)-th electrodes ELT1-2 of the second and fourth pixels PXL2 and PXL4 (or, the end portions of the (1-2)-th electrodes ELT1-2) in the separation area SPA between the second and fourth pixels PXL2 and PXL4. The second integration bank pattern CBNP2 may have a width (the second width W12) wider than a distance from the left end portion of the (1-2)-th electrode ELT1-2 of each of the second and fourth pixels PXL2 and PXL4 to the right end portion of the (2-2)-th electrode ELT2-2 of each of the second and fourth pixels PXL2 and PXL4 (or, a width in the first direction DR1 corresponding thereto), in the separation area SPA between the second and fourth pixels PXL2 and PXL4. Accordingly, in the separation area SPA, the (1-2)-th and (2-2)-th electrodes ELT1-2 and ELT2-2 of the second and fourth pixels PXL2 and PXL4 may be disconnected on the flat upper surface of the second integrated bank pattern CBNP2.

In an embodiment, each second integrated bank pattern CBNP2 may be commonly formed in the pixels PXL arranged in the same pixel column of the display area DA. Each second integrated bank pattern CBNP2 may have multiple extensions EPA corresponding to the separation areas SPA between the pixels PXL arranged in a corresponding pixel column.

The widths of each third bank pattern portion BNP3 and/or second integrated bank pattern CBNP2 may be reduced so as to have a third width W13 (or a minimum width) that may be narrower than the first width W11 and the second width W12, in an area between each light emitting area EA and at least one separation area SPA adjacent thereto (for example, at least one section of an upper area and/or a lower area of the light emitting area EA). For example, each third bank pattern portion BNP3 and/or second integrated bank pattern CBNP2 may have a width that may be reduced so as to not overlap the second contact portion CNT2 and the (2-2)-th electrode ELT2-2 around the area in which each second contact portion CNT2 may be formed.

Therefore, it may be possible to easily form the second contact portion CNT2 and secure physical and/or electrical stability of the second contact portion CNT2. In the patterning process of the conductive film for forming the pixel electrodes ELT, it may be possible to prevent the (1-2)-th electrode ELT1-2 and the (2-2)-th electrode ELT2-2 from being short-circuited due to the residues of the conductive film.

According to an embodiment of FIG. 8, the alignment wires overlapping the second integrated bank pattern CBNP2 may be etched on the flat upper surface of the second integrated bank pattern CBNP2 to be separated into respective pixel electrodes ELT. Accordingly, it may be possible to prevent the residues of the conductive film (RD2 in FIG. 7) from occurring in each separation area SPA. Therefore, it may be possible to prevent a short circuit defect from occurring between the pixel electrodes ELT along the second direction DR2.

Figure 9B:
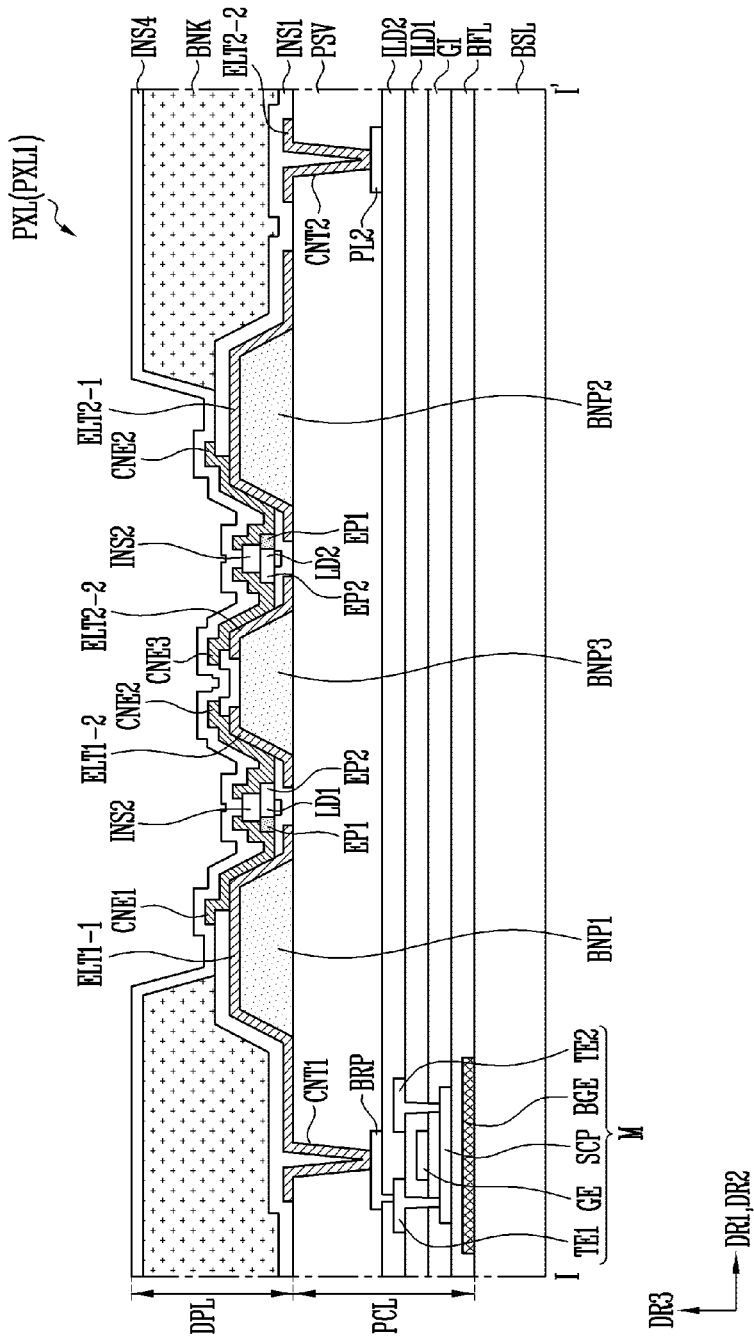
Figure 9C:
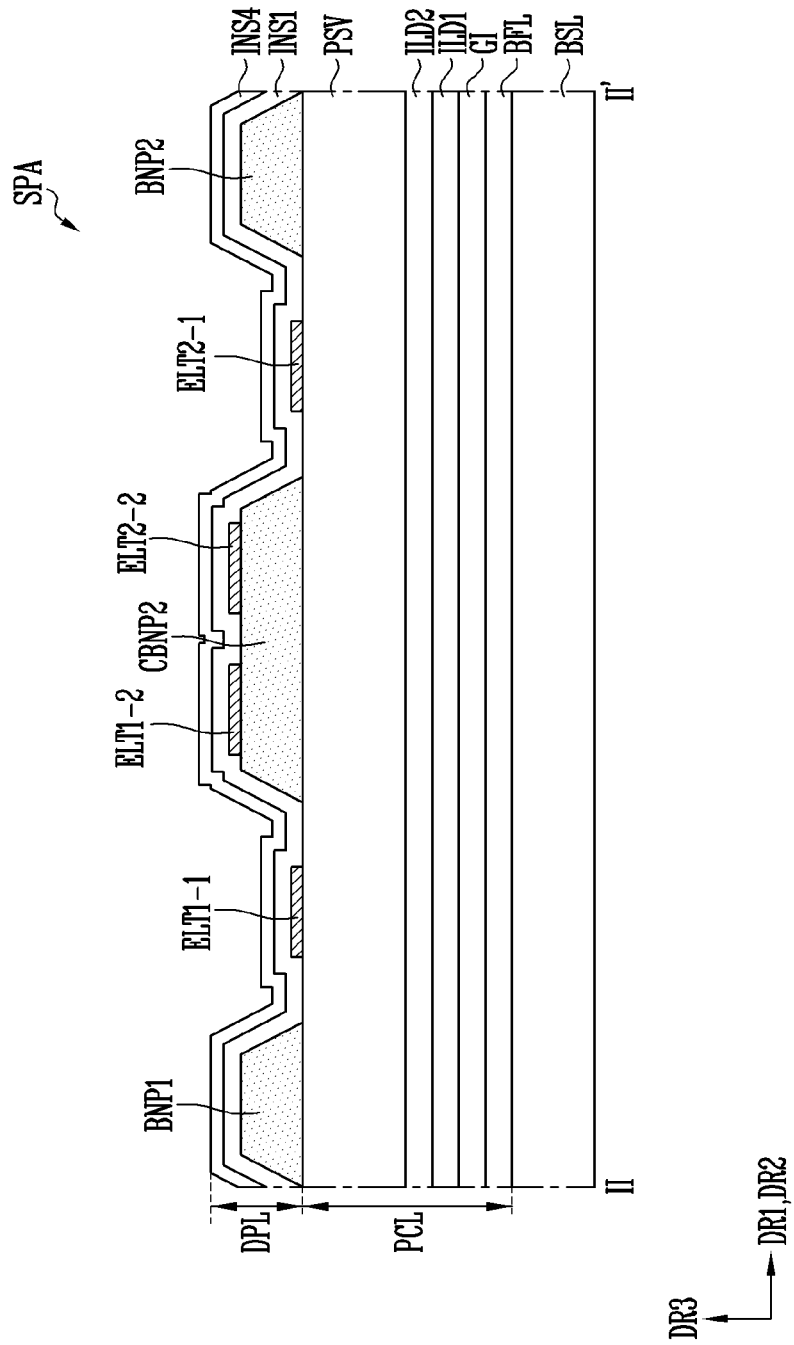
FIG. 9C illustrates a schematic cross-sectional view of a separation area according to an embodiment of the disclosure.

FIG. 9A and FIG. 9B illustrate schematic cross-sectional views of a pixel PXL according to an embodiment of the disclosure, respectively, and FIG. 9C illustrates a cross-sectional view of a separation area SPA according to an embodiment of the disclosure. For example, FIG. 9A and FIG. 9B illustrate different cross-sectional views of the pixel PXL (for example, the first pixel PXL1) taken along line I-I' of FIG. 8, and FIG. 9C illustrates a schematic cross-sectional view of an embodiment of the separation area SPA taken along line II-II' of FIG. 8.

FIG. 9A to FIG. 9C illustrate an arbitrary transistor M as an example of circuit elements that may be disposed on the pixel circuit layer PCL (for example, a transistor connected to the (1-1)-th electrode ELT1-1 through the first contact portion CNT1 and a bridge pattern BRP). As an example of a wire that may be disposed on the pixel circuit layer PCL, the second power line PL2 connected to the (2-2)-th electrode ELT2-2 through the second contact portion CNT2 is illustrated.

Referring to FIG. 5 to FIG. 9C, the pixels PXL and the display panel DP including the same according to an embodiment of the disclosure may include the pixel circuit layer PCL and the display element layer DPL disposed to overlap each other on a surface of the base layer BSL. For example, the display area DA may include the pixel circuit layer PCL disposed on a surface of the base layer BSL, and the display element layer DPL disposed on the pixel circuit layer PCL.

Circuit elements configuring the pixel circuit PXC of the corresponding pixel PXL and wires connected thereto may be disposed in each pixel area PXA of the pixel circuit layer PCL. For example, the pixel circuit layer PCL may include transistors M and a storage capacitor Cst that may be disposed in each pixel area PXA to form a pixel circuit PXC of a corresponding pixel PXL. The pixel circuit layer PCL may further include at least one power wire and/or signal wire connected to each pixel circuit PXC and/or light emitting part EMU. For example, the pixel circuit layer PCL may include signal wires including the first power line PL1, the second power line PL2, the scan lines SL, and the data lines DL.

The pixel circuit layer PCL may include insulation layers in addition to the circuit elements and the wires. For example, the pixel circuit layer PCL may include a buffer layer BFL, a gate insulation layer GI, a first interlayer insulation layer ILD1, a second interlayer insulation layer ILD2, and/or a passivation layer PSV, sequentially stacked on each other on a side of the base layer BSL. In some embodiments, the passivation layer PSV may be entirely formed in the display area DA to cover the circuit elements of each pixel PXL and the wires connected thereto, but is not limited thereto.

The pixel circuit layer PCL may further include a first conductive layer including at least one light blocking layer (or a back gate electrode BGE of the transistor M) that may be disposed under at least some of the transistors M.

The buffer layer BFL may be disposed on a surface of the base layer BSL on which the first conductive layer may be selectively formed. The buffer layer BFL may prevent impurities from diffusing into each circuit element.

A semiconductor layer may be disposed on the buffer layer BFL. The semiconductor layer may include a semiconductor pattern SCP of each transistor M. The semiconductor pattern SCP may include a channel region overlapping a gate electrode GE, and first and second conductive regions (for example, source and drain regions) disposed at both sides of the channel region.

In some embodiments, the semiconductor pattern SCP may be a semiconductor pattern made of polysilicon, amorphous silicon, an oxide semiconductor, or the like. The channel region of the semiconductor pattern SCP may be an intrinsic semiconductor as a semiconductor pattern that may not be doped with impurities, and each of the first and second regions of the semiconductor pattern SCP may be a semiconductor pattern doped with impurities.

In an embodiment, the semiconductor patterns SCP of the transistors M included in each pixel circuit PXC may be made of substantially the same or similar material. For example, the semiconductor pattern SCP of the transistors M may be made of a material of polysilicon, amorphous silicon, and an oxide semiconductor.

In another embodiment, some of the transistors M and the remaining some thereof may include the semiconductor patterns SCP made of different materials. For example, the semiconductor pattern SCP of some of the transistors M may be made of polysilicon or amorphous silicon, and the semiconductor pattern SCP of the remaining transistors M may be made of an oxide semiconductor.

The gate insulation layer GI may be disposed on the semiconductor layer. A second conductive layer may be disposed on the gate insulation layer GI.

The second conductive layer may include the gate electrode GE of each transistor M. The gate electrode GE may be disposed to overlap each semiconductor pattern SCP with the gate insulation layer GI interposed therebetween. The second conductive layer may further include an electrode of the storage capacitor Cst and/or a wire (for example, the scan line SL).

The first interlayer insulation layer ILD1 may be disposed on the second conductive layer. A third conductive layer may be disposed on the first interlayer insulation layer ILD1.

The third conductive layer may include first and second transistor electrodes TE1 and TE2 of each transistor M. Here, the first and second transistor electrodes TE1 and TE2 may be source and drain electrodes. The third conductive layer may further include an electrode of the storage capacitor Cst and/or a wire (for example, the data line DL).

The second interlayer insulation layer ILD2 may be disposed on the third conductive layer. A fourth conductive layer may be disposed on the second interlayer insulation layer ILD2.

Each of the buffer layer BFL, the gate insulation layer GI, the first interlayer insulation layer ILD1, and the second interlayer insulation layer ILD2 may be formed as a single layer or multilayer, and may include at least one inorganic insulating material and/or organic insulating material. For example, each of the buffer layer BFL, the gate insulation layer GI, the first interlayer insulation layer ILD1, and the second interlayer insulation layer ILD2 may include various types of organic/inorganic insulating materials such as a silicon nitride ($SiN_x$), a silicon oxide ($SiO_x$), a silicon oxynitride ($SiO_xN_y$), or a combination thereof.

The fourth conductive layer may include a bridge pattern BRP and/or a wire (for example, the first power line PL1 and/or the second power line PL2) for connecting the pixel circuit layer PCL and the display element layer DPL. The bridge pattern BRP may be connected to the first pixel electrode (for example, the (1-1)-th electrode ELT1-1) of the light emitting part EMU through the first contact portion CNT1. The second power line PL2 may be connected to the last pixel electrode (for example, the (2-2)-th electrode ELT2-2) of the light emitting part EMU through the second contact portion CNT2.

Each of the conductive pattern, the electrode, and/or the wire configuring the first to fourth conductive layers may have conductivity by including at least one conductive material, but the configuration material is not particularly limited. For example, each of the conductive pattern, the electrode, and/or the wire configuring the first to fourth conductive layers may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but is not limited thereto.

Each of the conductive pattern, the electrode, and/or the wire configuring the first to fourth conductive layers may be formed as a single layer or multilayer.

The passivation layer PSV may be disposed on the fourth conductive layer. In some embodiments, the passivation layer PSV may include at least one organic insulation layer, and may substantially flatten a surface of the pixel circuit layer PCL. The display element layer DPL may be disposed on the passivation layer PSV.

The passivation layer PSV may be formed as a single layer or multilayer, and may include at least one inorganic insulating material and/or organic insulating material. For example, the passivation layer PSV may include at least one organic insulating film, and may substantially flatten a surface of the pixel circuit layer PCL. In an embodiment, the organic insulating film may be at least one of a polyacrylates resin, an epoxy resin, a phenolic resin, a polyamides resin, a polyimides resin, an unsaturated polyesters resin, a poly-phenylen ethers resin, a poly-phenylene sulfides resin, and benzocyclobutene resin, but is not limited thereto.

The display element layer DPL may be disposed on the passivation layer PSV. The display element layer DPL may include the light emitting part EMU of each pixel PXL. The light emitting part EMU may be connected to the pixel circuit PXC and/or a power line (for example, a second power line PL2) of the corresponding pixel PXL through at least one contact portion (for example, the first and second contact portions CNT1 and CNT2) penetrating the passivation layer PSV. Each contact portion may be configured in a form of at least one contact hole or via hole, but is not limited thereto.

For example, the pixel electrodes ELT, the light emitting elements LD, and the contact electrodes CNE that configure the light emitting part EMU of the corresponding pixel PXL may be disposed in each pixel area PXA of the display element layer DPL. For example, the display element layer DPL may include the pixel electrodes ELT disposed in the light emitting element arrangement areas AR of each pixel PXL; the light emitting elements LD connected in series, parallel, or in series/parallel between the pixel electrodes ELT; and the contact electrodes CNE for connecting the pixel electrodes ELT and the light emitting elements LD.

The display element layer DPL may further include the bank pattern portions BNP for protruding an area of the pixel electrodes ELT in an upper direction, and the bank BNK surrounding each light emitting area EA. The display element layer IDPL may further include at least one conductive layer and/or an insulation layer.

For example, the display element layer DPL may include the bank pattern portions BNP, the pixel electrodes ELT, a first insulation layer INS1, the light emitting elements LD, a second insulation layer INS2, the contact electrodes CNE, and a fourth insulation layer INS4, which may be sequentially disposed and/or formed on the pixel circuit layer PCL.

In an embodiment, a pair of contact electrodes CNE arranged in each light emitting element arrangement area AR may be separated and disposed in different layers as shown in FIG. 9A. The display element layer DPL may further include a third insulation layer INS3 interposed between the pair of contact electrodes CNE. In another embodiment, a pair of contact electrodes CNE arranged in each light emitting element arrangement area AR may be disposed in the same layer as shown in FIG. 9B. The third insulation layer INS3 may be omitted.

The position of the bank BNK may be changed according to embodiments in a cross-section view. In an embodiment, the bank BNK may be formed on the first insulation layer INS1. In another embodiment, the bank BNK may be disposed on the same layer as the bank pattern portions BNP. The bank BNK may or may not overlap the bank pattern portions BNP.

The bank pattern portions BNP may be disposed on a surface of the base layer BSL on which the pixel circuit layer PCL may be selectively formed. The bank pattern portions BNP may be protruded in a height direction of the base layer BSL on a surface of the base layer BSL on which the pixel circuit layer PCL may be formed. Accordingly, an area of the pixel electrodes ELT disposed on the bank pattern portions BNP may protrude in the upper direction.

The bank pattern portions BNP may contain an insulating material including at least one inorganic material and/or organic material. For example, the bank pattern portions BNP may include at least one layer of inorganic film that includes various inorganic insulating materials including a silicon nitride (SiNx), a silicon oxide (SiOx), a silicon oxynitride ($SiO_xN_y$), or a combination thereof. In other embodiments, the bank pattern portions BNP may include at least one layer of organic film including various types of organic insulating materials, or may be configured of a single-layered or multi-layered insulator including organic/inorganic materials in combination. For example, the material and cross-sectional structure of the bank pattern portions BNP may be variously changed.

In an embodiment, the bank pattern portions BNP may be formed of the same material as the passivation layer PSV. The passivation layer PSV and the bank pattern portions BNP may be simultaneously or sequentially formed. For example, by simultaneously forming the passivation layer PSV and the bank pattern portions BNP through a single mask process using a halftone mask, it may be possible to reduce a mask and simplify the manufacturing process of the pixels PXL.

A reflective partition wall (or a reflective wall) may be formed around the light emitting elements LD by the bank pattern portions BNP and the pixel electrodes ELT disposed thereon. For example, in case that the pixel electrodes ELT include a reflective electrode layer, light emitted from respective end portions of the light emitting elements LD may be reflected on the reflective electrode layer, and emitted in the upper direction of each pixel PXL.

The bank pattern portions BNP may have various shapes. In an embodiment, the bank pattern portions BNP may be formed to have an inclined surface inclined at an angle of a range with respect to the base layer BSL as shown in FIG. 9A to FIG. 9C. In another embodiment, the bank pattern portions BNP may have side walls such as a curved or stepped shape. For example, the bank pattern portions BNP may have a cross-section of a semicircle or semi-ellipse shape.

The pixel electrodes ELT of each pixel PXL may be disposed at an upper portion of the bank pattern portions BNP. In some embodiments, the pixel electrodes ELT may have a shape corresponding to the bank pattern portions BNP. For example, the pixel electrodes ELT may protrude in a height direction of the base layer BSL by the bank pattern portions BNP.

As in an embodiment of FIG. 8, in case that the second integrated bank pattern CBNP2 has the extension EPA, the end portions of the pixel electrodes ELT (for example, the (1-2)-th and (2-2)-th electrodes ELT1-2 and ELT2-2) overlapping the second integrated bank pattern CBNP2 may be disposed on the flat upper surface of the second integrated bank pattern CBNP2 in each separation area SPA as shown in FIG. 9C.

The pixel electrodes ELT may contain at least one conductive material. For example, the pixel electrodes ELT may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum doped zinc oxide (AZO), a gallium doped zinc oxide (GZO), a zinc tin oxide (ZTO), a gallium tin oxide (GTO), a fluorine doped tin oxide (FTO), or a combination thereof; and at least one conductive material among conductive polymers such as PEDOT, but are not limited thereto. For example, the pixel electrodes ELT may include other conductive materials in addition to a carbon nanotube or graphene. For example, the pixel electrodes ELT may have conductivity by including at least one of various conductive materials, but the material included in the pixel electrodes ELT is not particularly limited. The pixel electrodes ELT may include conductive materials that may be the same or different from each other.

The pixel electrodes ELT may be configured of a single layer or multilayer. For example, the pixel electrodes ELT may include a reflective electrode layer including a reflective conductive material (for example, metal). The pixel electrodes ELT may selectively further include at least one of at least one transparent electrode layer disposed at an upper portion and/or a lower portion of the reflective electrode layer and at least one conductive capping layer covering an upper portion of the reflective electrode layer and/or the transparent electrode layer.

The first insulation layer INS1 may be disposed on an area of the pixel electrodes ELT. For example, the first insulation layer INS1 may be formed to cover an area of each of the pixel electrodes ELT, and may include an opening (or a contact hole) exposing another area of each of the pixel electrodes ELT.

The pixel electrodes ELT may be electrically connected to respective contact electrodes CNE in the area in which the first insulation layer INS1 may be opened. In some embodiments, the first insulation layer INS1 may be omitted. The light emitting elements LD may be directly disposed on an end of the passivation layer PSV and/or the pixel electrodes ELT.

In an embodiment, the first insulation layer INS1 may be first formed to entirely cover the pixel electrodes ELT. After the light emitting elements LD may be supplied and arranged on the first insulation layer INS1, the first insulation layer INS1 may be partially opened to expose an area of the pixel electrodes ELT. As the pixel electrodes ELT may be formed and covered by the first insulation layer INS1 or the like, it may be possible to prevent the pixel electrodes ELT from being damaged in a subsequent process.

The light emitting elements LD may be supplied and arranged in the light emitting area EA in which the first insulation layer INS1 or the like may be formed. Before the light emitting elements LD may be supplied, the bank BNK may be formed around the light emitting area EA. For example, the bank BNK may be formed in the display area DA to surround each light emitting area EA.

In an embodiment, each light emitting element LD may directly contact an adjacent pair of pixel electrodes ELT to be connected between the pair of pixel electrodes ELT. In another embodiment, each light emitting element LD may or may not directly contact the adjacent pair of pixel electrodes ELT, and may be connected to the pair of pixel electrodes ELT by the contact electrodes CNE.

The second insulation layer INS2 may be disposed on an area of the light emitting elements LD. For example, the second insulation layer INS2 may be disposed on an area of each of the light emitting elements LD to expose the first and second end portions EP1 and EP2 of the light emitting elements LD. For example, the second insulation layer INS2 may be locally disposed only at an upper portion of an area including a central area of each of the light emitting elements LD. The second insulation layer INS2 may be formed in an independent pattern in the light emitting area EA of each pixel PXL, but is not limited thereto. In case that the second insulation layer INS2 is formed on the light emitting elements LD after the alignment of the light emitting elements LD may be completed, it may be possible to prevent the light emitting elements LD from deviating from an aligned position.

Both end portions of the light emitting elements LD that may not be covered by the second insulation layer INS2, for example, the first and second end portions EP1 and EP2, may be covered by respective contact electrodes CNE. The contact electrodes CNE may be disposed on the pixel electrodes ELT to cover the exposed areas of respective pixel electrodes ELT. For example, the contact electrodes CNE may be disposed on the pixel electrodes ELT so as to directly/indirectly contact respective pixel electrodes ELT on and/or around the bank pattern portions BNP.

Accordingly, the contact electrodes CNE may be electrically connected to respective pixel electrodes ELT. The pixel electrodes ELT may be electrically connected to at least one light emitting element LD adjacent thereto through the contact electrodes CNE.

The third insulation layer INS3 may be disposed to cover a pair of contact electrodes CNE. In case that the second and/or third insulation layers INS2 and INS3 may be formed on the upper portion of the light emitting elements LD, electrical stability between the first and second end portions EP1 and EP2 of the light emitting elements LD may be secured. Accordingly, it may be possible to prevent a short circuit defect from occurring between the first and second end portions EP1 and EP2 of the light emitting elements LD.

Each of the first to third insulation layers INS1 to INS3 may be formed as a single layer or multilayer, and may include at least one inorganic insulating material and/or organic insulating material. In an embodiment, each of the first to third insulation layers INS1 to INS3 may include an inorganic insulating film that includes at least one type of inorganic material including a silicon nitride (SiNx), a silicon oxide (SiOx), a silicon oxynitride (SiOxNy), or a combination thereof, but is not limited thereto. For example, the second insulation layer INS2 may include an organic insulating film that includes at least one type of organic insulation material including a photo resist (PR) material.

The contact electrodes CNE may contain a transparent conducting material. For example, the contact electrodes CNE may include at least one of various transparent conductive materials that include conductive oxides such as an indium tin oxide (ITO), an indium zinc oxide (IZO), an aluminum zinc oxide (AZO), a gallium doped zinc oxide (GZO), a zinc tin oxide (ZTO), a gallium tin oxide (GTO), and a fluorine doped tin oxide (FTO). Accordingly, the light emitted from the light emitting elements LD through each of the first and second ends EP1 and EP2 may pass through the contact electrodes CNE to be emitted outside of the pixel PXL.

The fourth insulation layer INS4 may be disposed on the contact electrodes CNE. For example, the fourth insulation layer INS4 may be entirely formed and/or disposed on the display area DA so as to cover the bank pattern portions BNP, the pixel electrodes ELT, the light emitting elements LD, the contact electrodes CNE, the first, second, third, and/or fourth insulation layers INS1, INS2, INS3, and/or INS4, and the bank BNK.

The fourth insulation layer INS4 may include at least one layer of an inorganic film and/or organic film. For example, the fourth insulation layer INS4 may be formed as a single layer or multilayer, and may include at least one inorganic insulating material and/or organic insulating material. For example, the fourth insulation layer INS4 may include various types of insulating materials such as a silicon nitride ($SiN_x$), a silicon oxide ($SiO_x$), a silicon oxynitride ($SiO_xN_y$), or a combination thereof.

In an embodiment, the fourth insulation layer INS4 may include a single-layered or multi-layered encapsulation layer (for example, ENC of FIG. 3A and FIG. 3B), but is not limited thereto. In some embodiments, at least one overcoat layer, filler layer, and/or upper substrate may be further disposed on the fourth insulation layer INS4.

Figure 10:
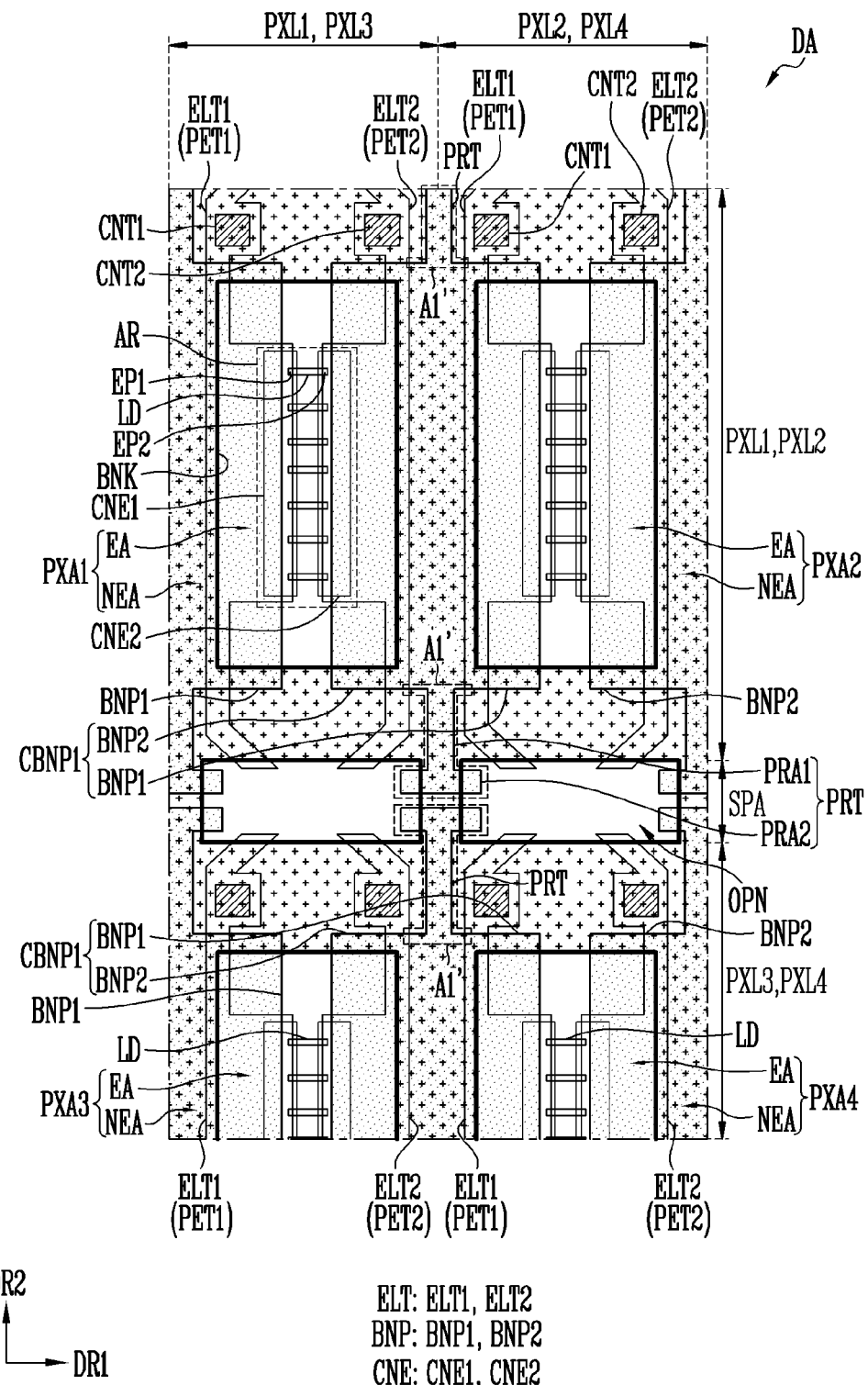
FIG. 10 to FIG. 24 respectively illustrate a schematic plan view of pixels and display areas including the same according to an embodiment of the disclosure.

FIG. 10 to FIG. 24 respectively illustrate a schematic plan view of pixels PXL and a display area DA including the same according to an embodiment of the disclosure. For example, FIG. 10 illustrates a modified embodiment of an embodiment of FIG. 8 in relation to the configuration of the light emitting part EMU, and FIG. 11 to FIG. 24 illustrate different modified embodiments of an embodiment of FIG. 8 in relation to the bank pattern portions BNP. In describing embodiments of FIG. 10 to FIG. 24, the same reference numerals are denoted to configurations similar to or identical to those of the above-described embodiments, and detailed descriptions thereof will be omitted.

Referring to FIG. 10, the light emitting part EMU may have a single-stage serial structure (for example, a parallel structure) corresponding to an embodiment of FIG. 6A. Each pixel area PXA may include at least one light emitting element arrangement area AR.

For example, as shown in FIG. 10, a single light emitting element arrangement area AR may be defined in each light emitting area EA, and the first electrode ELT1 and the second electrode ELT2 facing each other may be disposed in the light emitting element arrangement area AR. The first and second electrodes ELT1 and ELT2 may be connected to the pixel circuit layer PCL through the first and second contact portions CNT1 and CNT2, respectively.

Each pixel area PXA may not include electrodes corresponding to the (1-2)-th and (2-2)-th electrodes ELT1-2 and ELT2-2 of FIG. 8, and accordingly, may also not include the third bank pattern portion of FIG. 8. The second integrated bank pattern CBNP2 of FIG. 8 may not be disposed in the separation area SPA. In another embodiment, the first bank pattern portions BNP1 and/or second bank pattern portions BNP2 of each pixel column may be formed to be connected along the second direction DR2 in the same form as the second integrated bank pattern CBNP2 of FIG. 8. Referring to FIG. 11 to FIG. 14, the first integrated bank pattern CBNP1, particularly the shape and/or structure of protrusions PRT may be variously changed.

Figure 11:
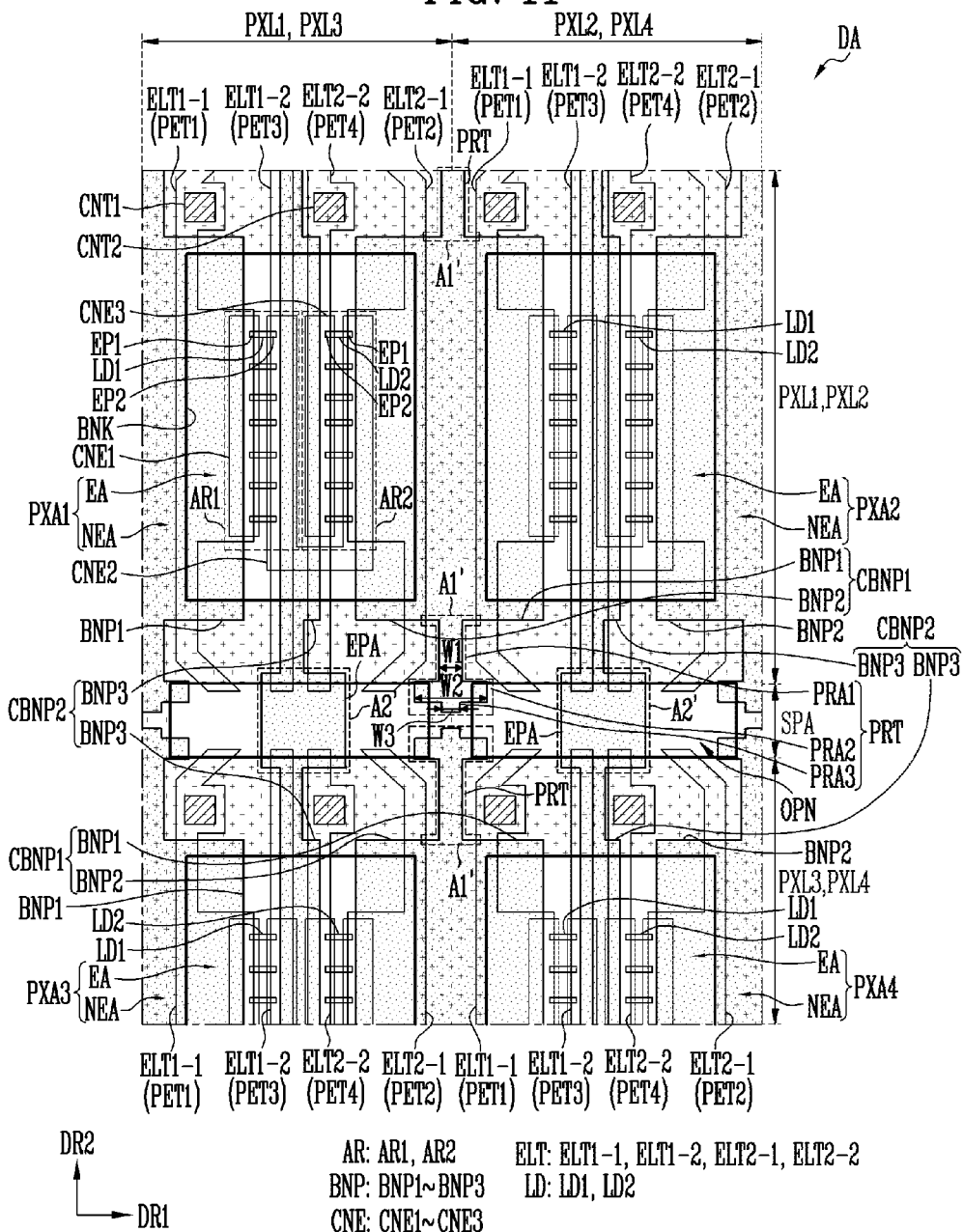
Figure 12:
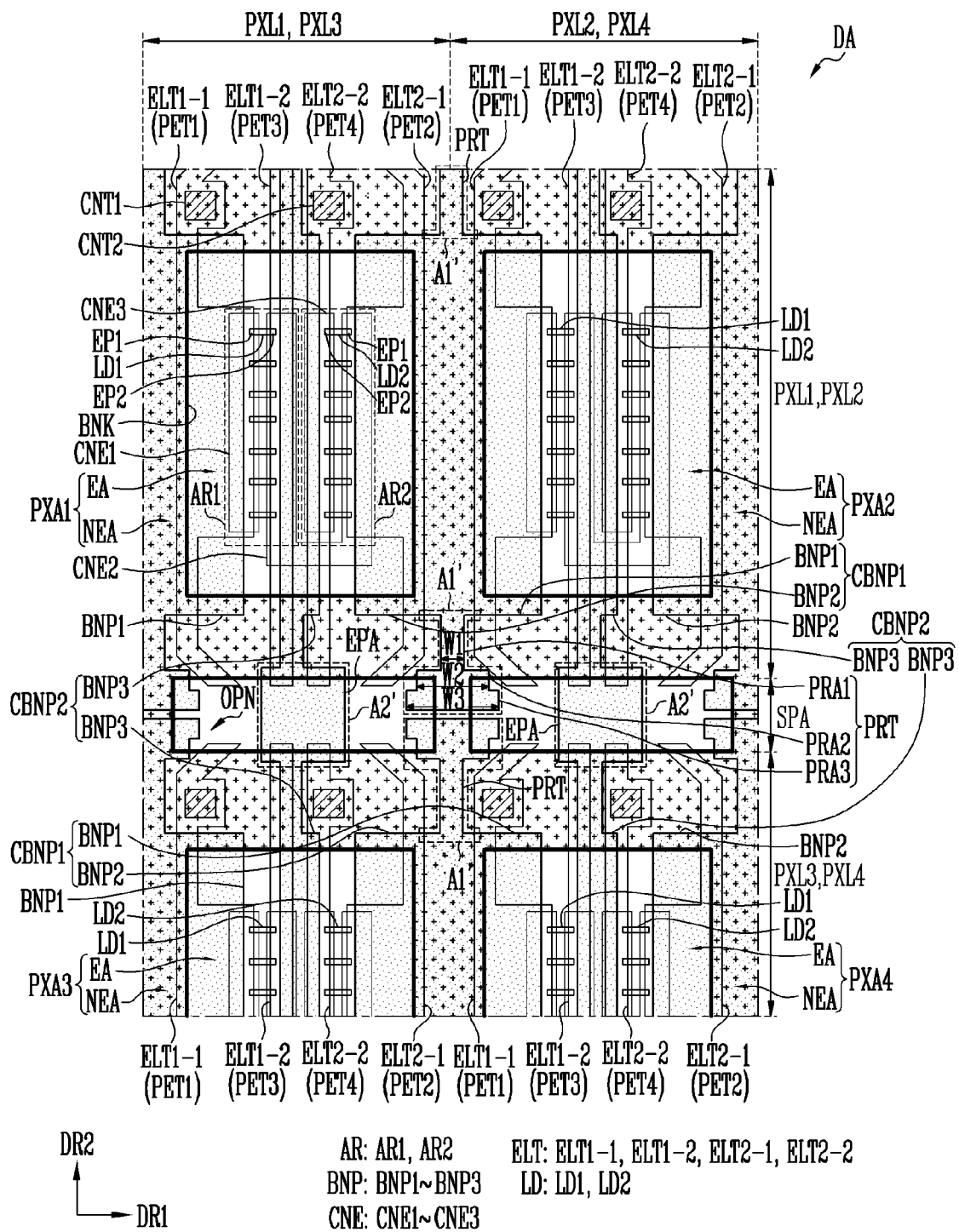

For example, as shown in FIG. 11 and FIG. 12, respective protrusions PRT may be sequentially disposed along the second direction DR2, and may include a first area PRA1, a second area PRA2, and a third area PRA3 respectively having a first width W1, a second width W2, and a third width W3 along the first direction DR1. As an example, the second area PRA2 may be disposed between the first and third areas PRA1 and PRA3 so as to contact the first and third areas PRA1 and PRA3.

In an embodiment, the first area AR1 the second area PRA2, and the third area PRA3 may have a rectangular shape, respectively, and the second width W2 may be larger than the first width W1. The third width W3 may be different from the second width W2. In an embodiment, the third width W3 may be smaller than the second width W2 as shown in FIG. 11. The first width W1 and the third width W3 may be the same or different from each other. In another embodiment, the third width W3 may be larger than the second width W2 as shown in FIG. 12.

Figure 13:
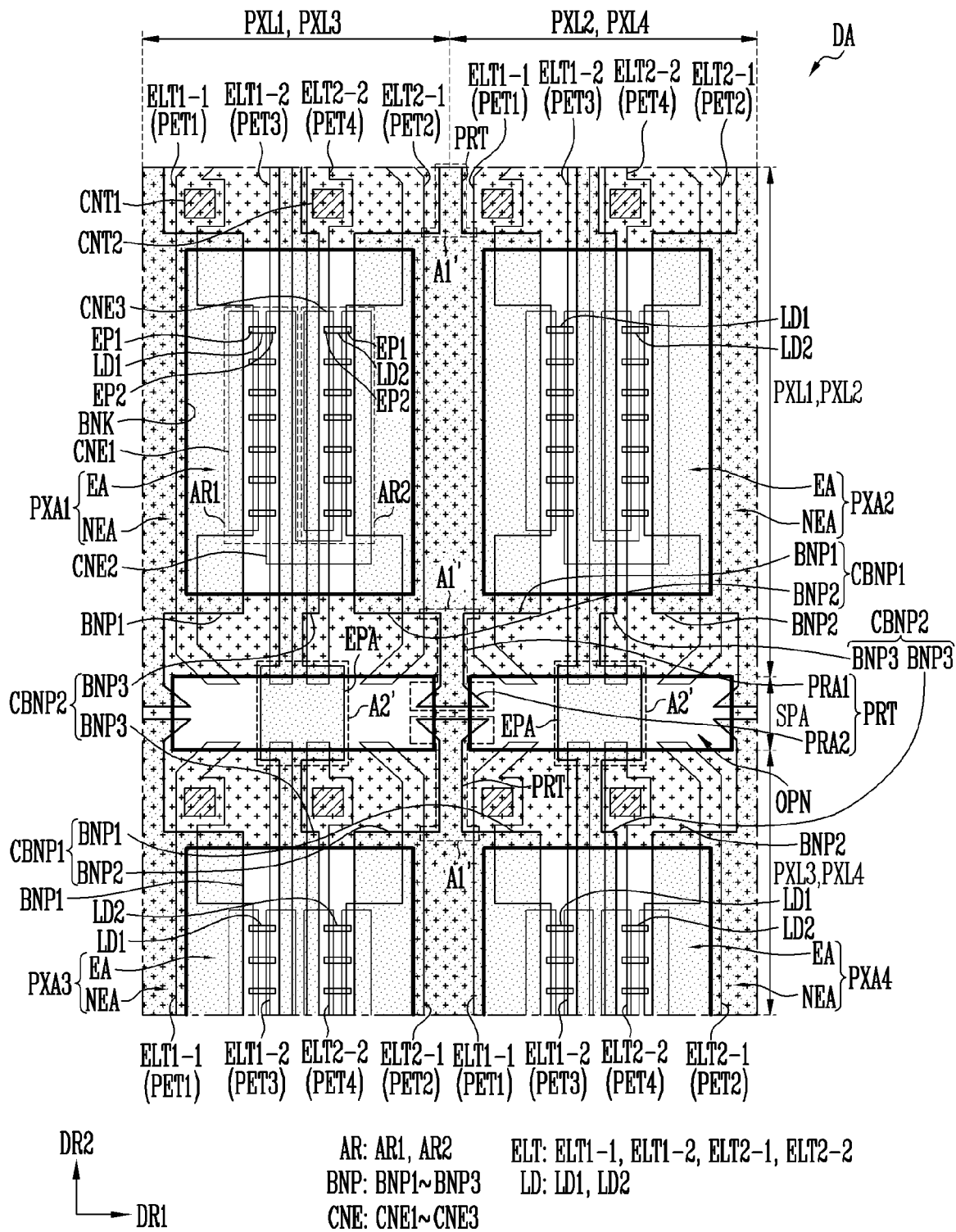

In some embodiments, each protrusion PRT may have a width that may be gradually changed in at least one area. For example, as shown in FIG. 13, each protrusion PRT includes the first area PRA1 and the second area PRA2 that may be sequentially disposed along the second direction DR2, and the second area PRA2 may have an oblique side. For example, the second area PRA2 may have a shape such as a trapezoidal shape. In another embodiment, each protrusion PRT may have various polygonal shapes including a trapezoid or triangular shape as a whole. Each protrusion PRT may have a curved line type circumference in at least some areas.

Figure 14:
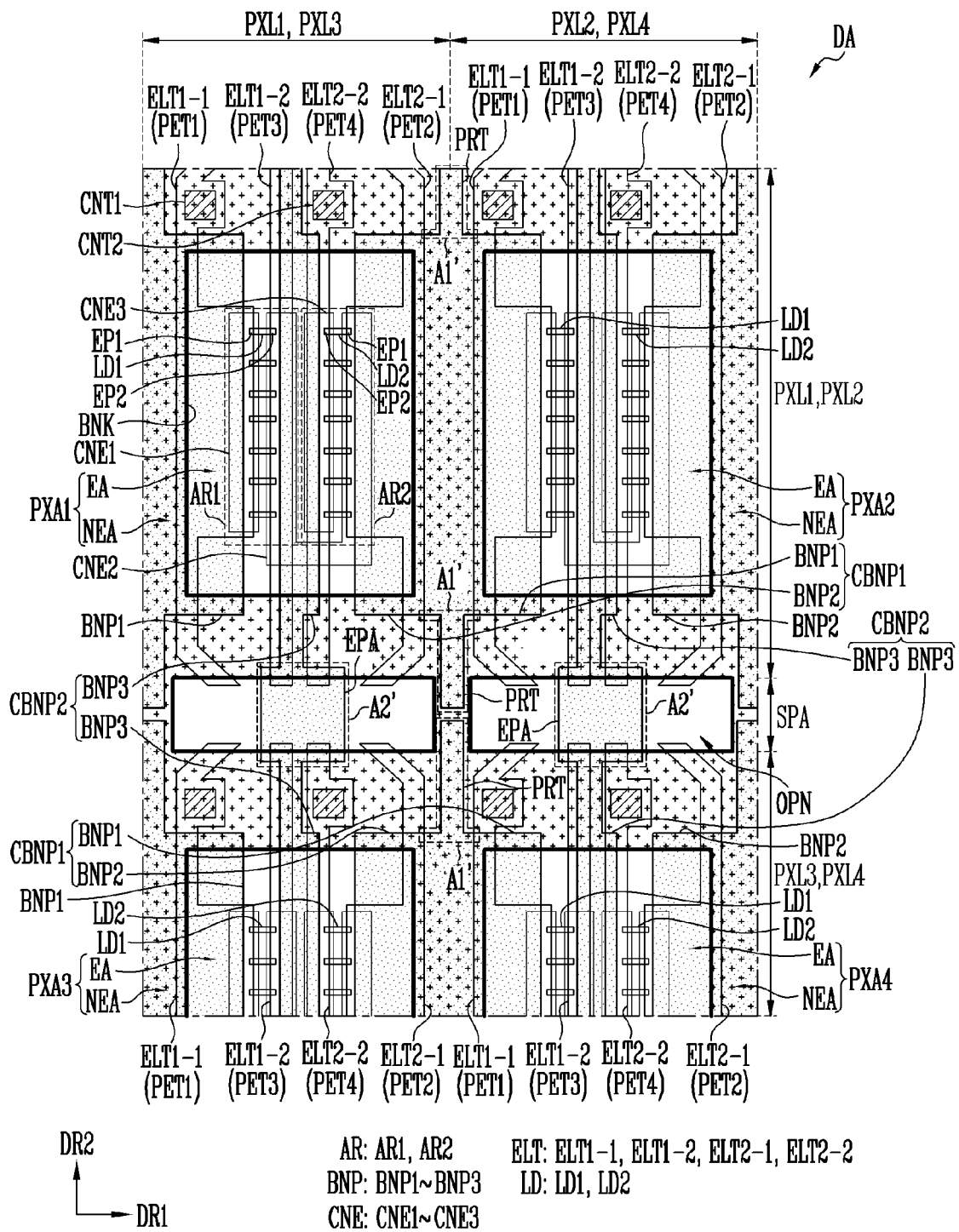

In some embodiments, each protrusion PRT may have a uniform width. For example, as shown in FIG. 14, each protrusion PRT may extend along the second direction DR2, and may have a uniform width along the first direction DR1.

Figure 15:
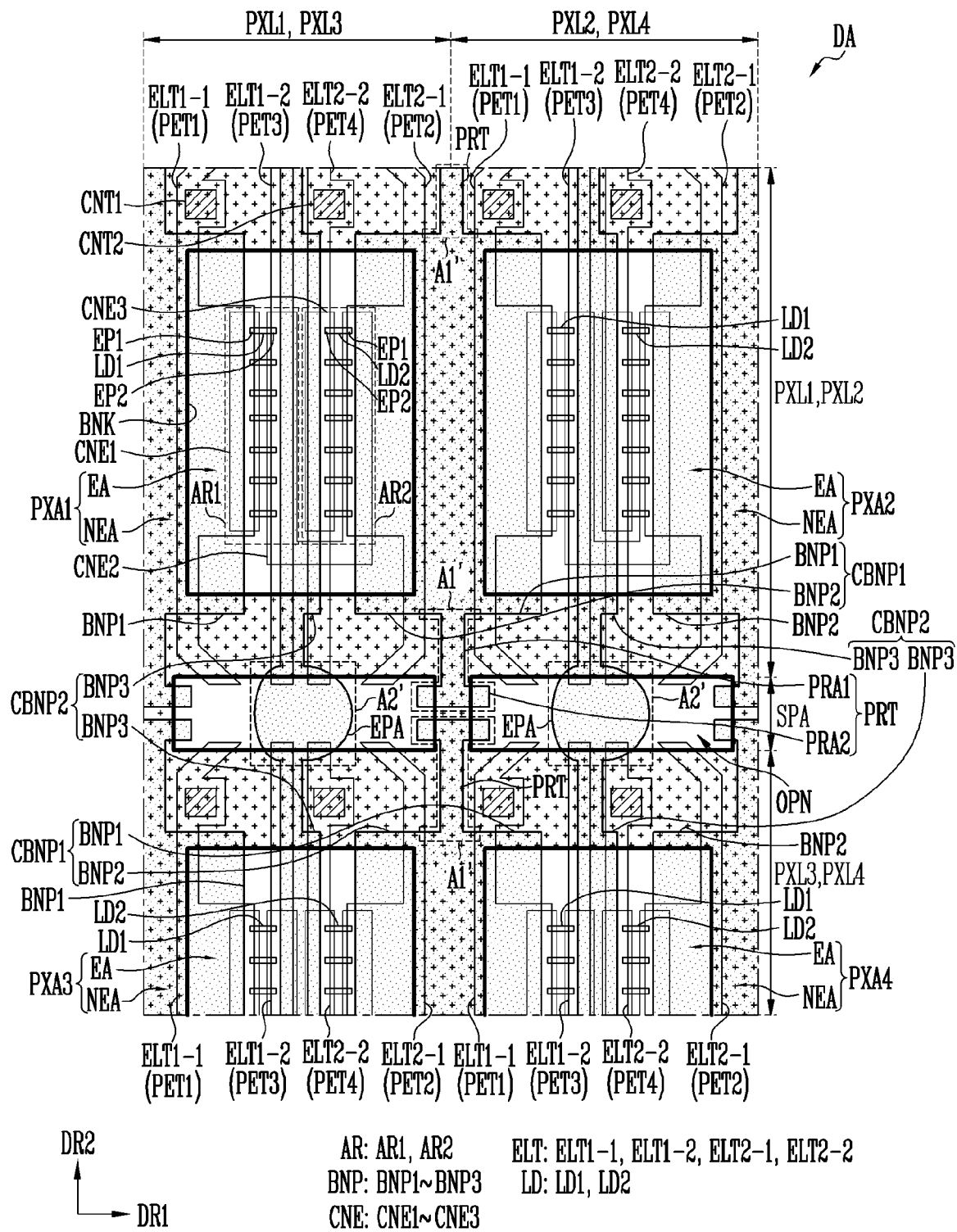
Figure 16:
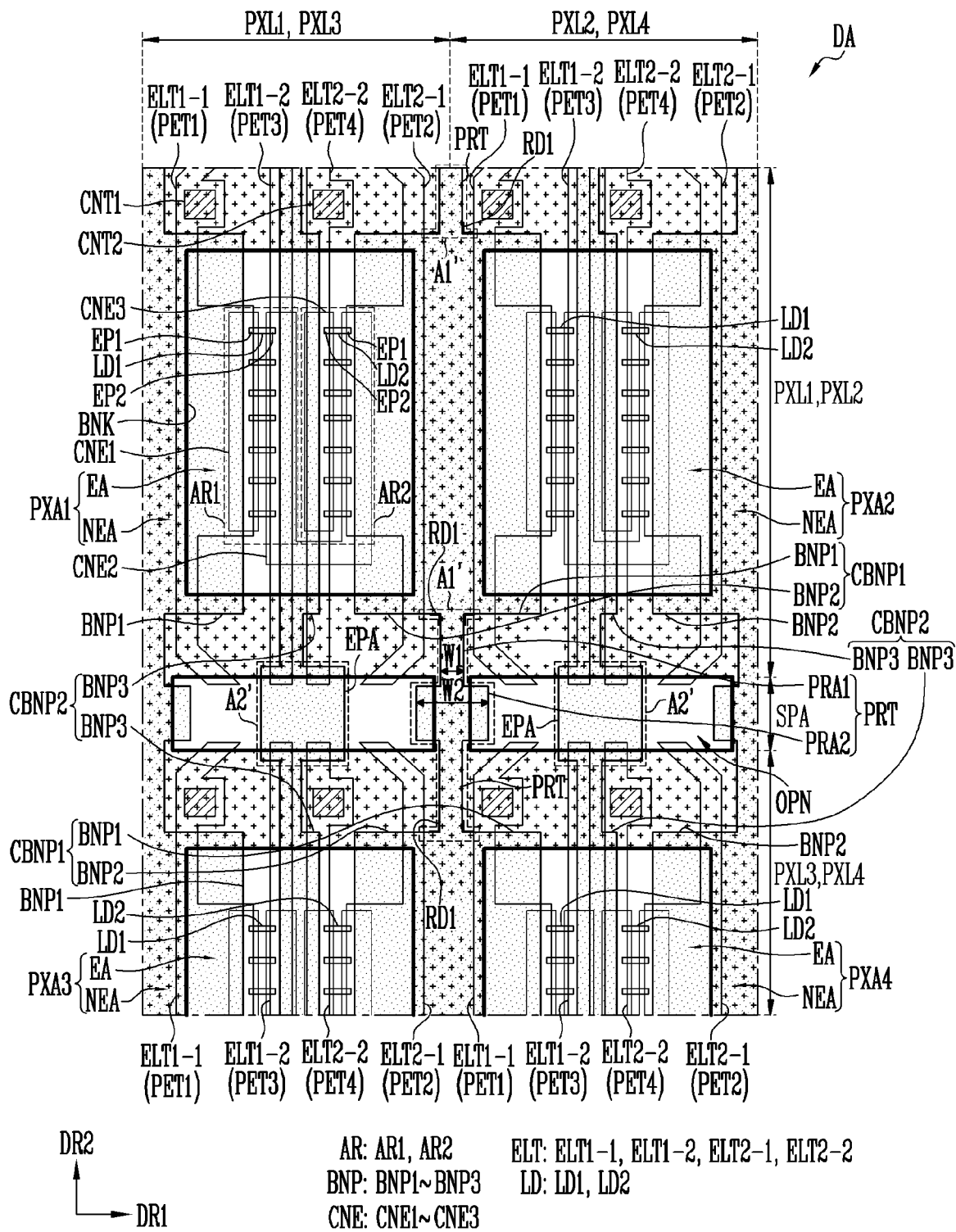
Figure 17:
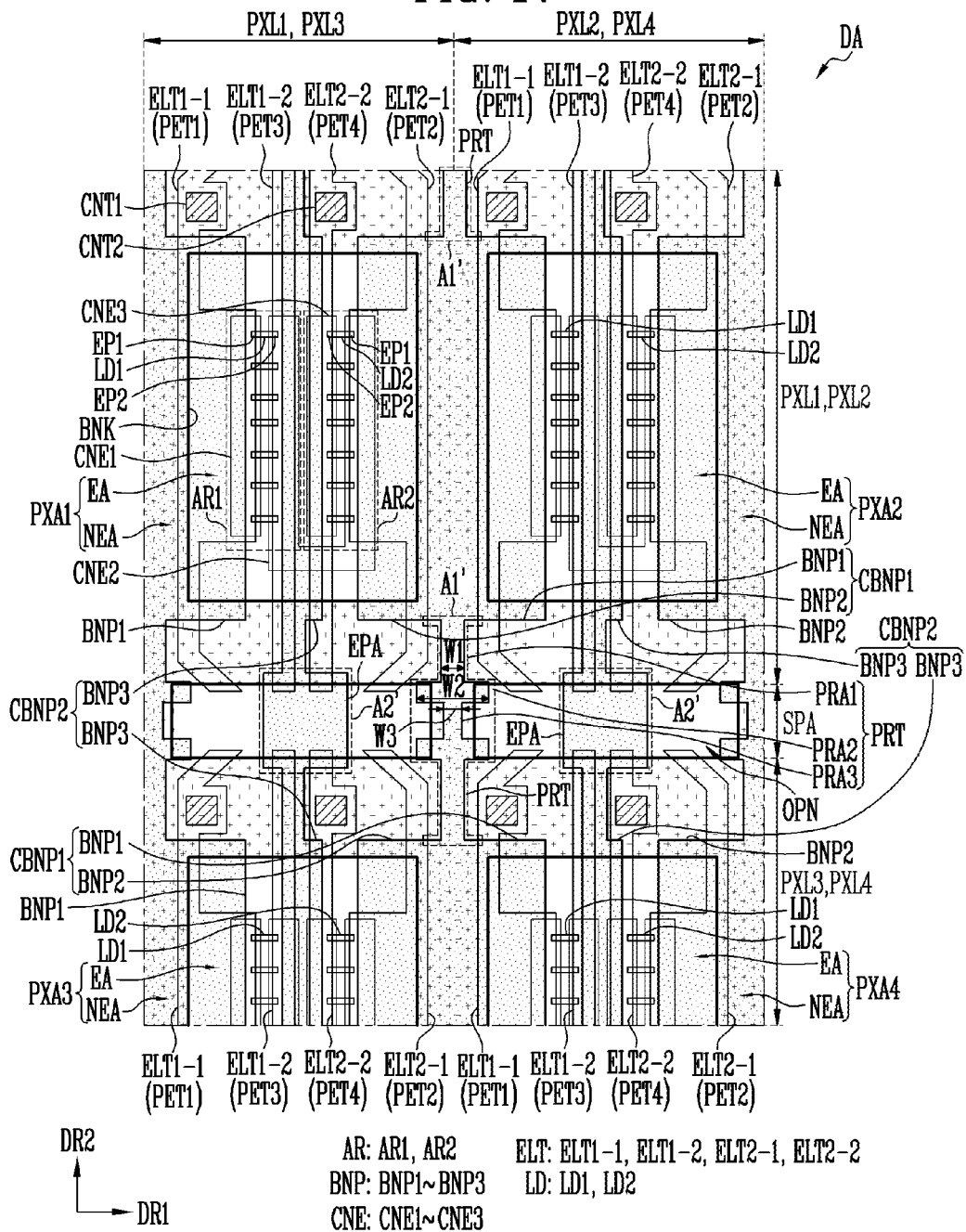
Figure 18:
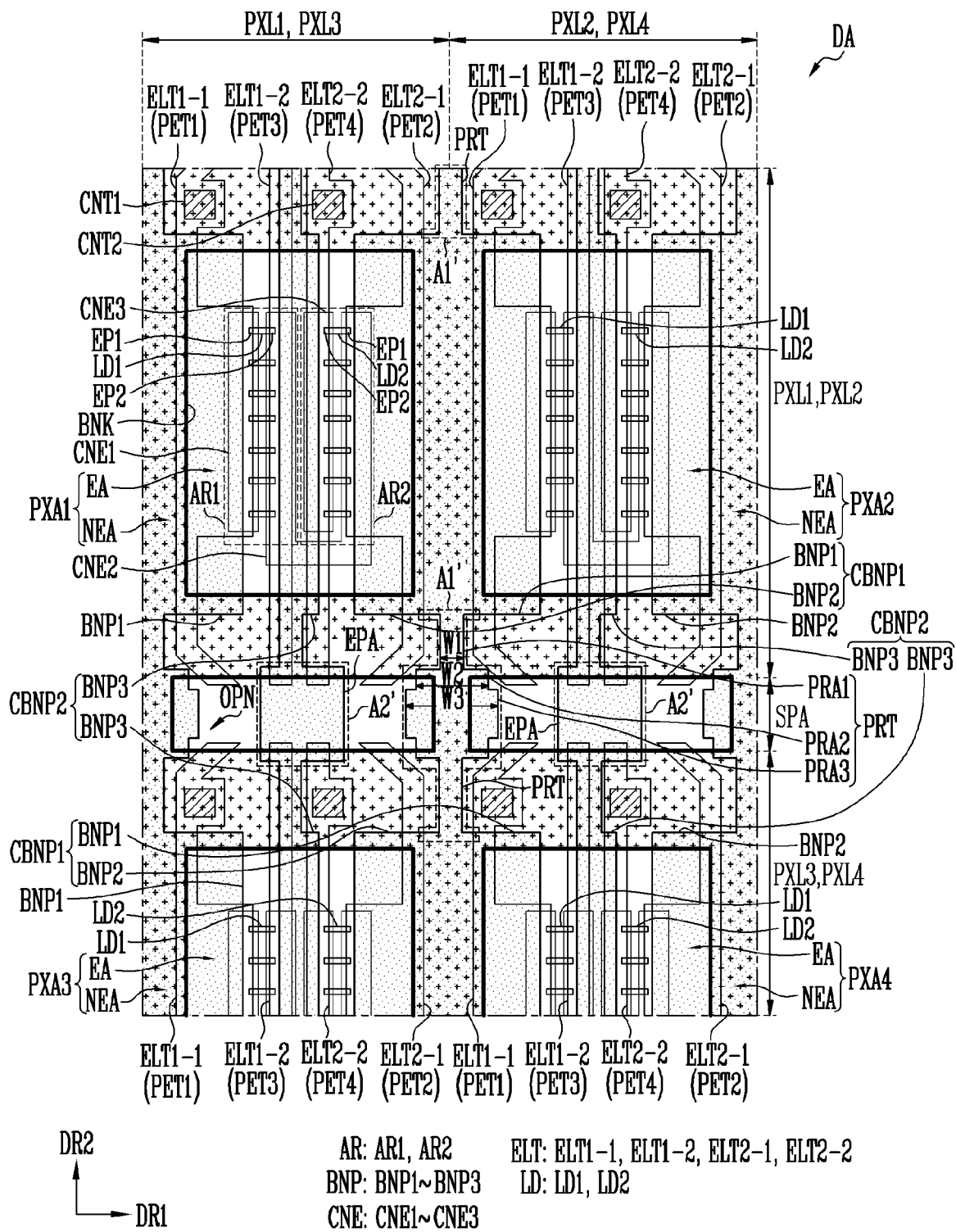

Referring to FIG. 15, the shape of the second integrated bank pattern CBNP2 may also be changed according to embodiments. For example, a circumference area of the left and/or right side of the second integrated bank pattern CBNP2 may be changed to a curved line shape. The shape of the second integrated bank pattern CBNP2 may be variously changed. For example, in another embodiment, the second integrated bank pattern CBNP2 may have various polygonal shapes including a hexagonal shape.

Referring to FIG. 16 to FIG. 21, the first integrated bank pattern CBNP1 may be integrally or non-integrally connected between at least two pixel rows sequentially disposed along the second direction DR2. For example, in the entire display area DA, each first integrated bank pattern CBNP1 may be connected along the second direction DR2. As an example, the embodiments of FIG. 16 to FIG. 21 disclose an embodiment in which the first integrated bank pattern CBNP1 may be connected to the second direction DR2 in the embodiments of FIG. 8 and FIG. 11 to FIG. 14.

For example, the first integrated bank pattern CBNP1 shared by the first and second pixels PXL1 and PXL2 may protrude in the direction of the previous pixel row and/or next pixel row at respective end portions of the upper and lower ends thereof, respectively, and may be integrally connected to the first integrated bank pattern CBNP1 of the previous pixel row and/or next pixel row. Similarly, the first integrated bank pattern CBNP1 shared by the third and fourth pixels PXL3 and PXL4 may protrude in the direction of the previous pixel row and/or next pixel row at respective end portions of the upper and lower ends thereof, respectively, and may be integrally connected to the first integrated bank pattern CBNP1 of the previous pixel row and/or next pixel row. Each protrusion PRT may be regarded as a connection portion.

Figure 19:
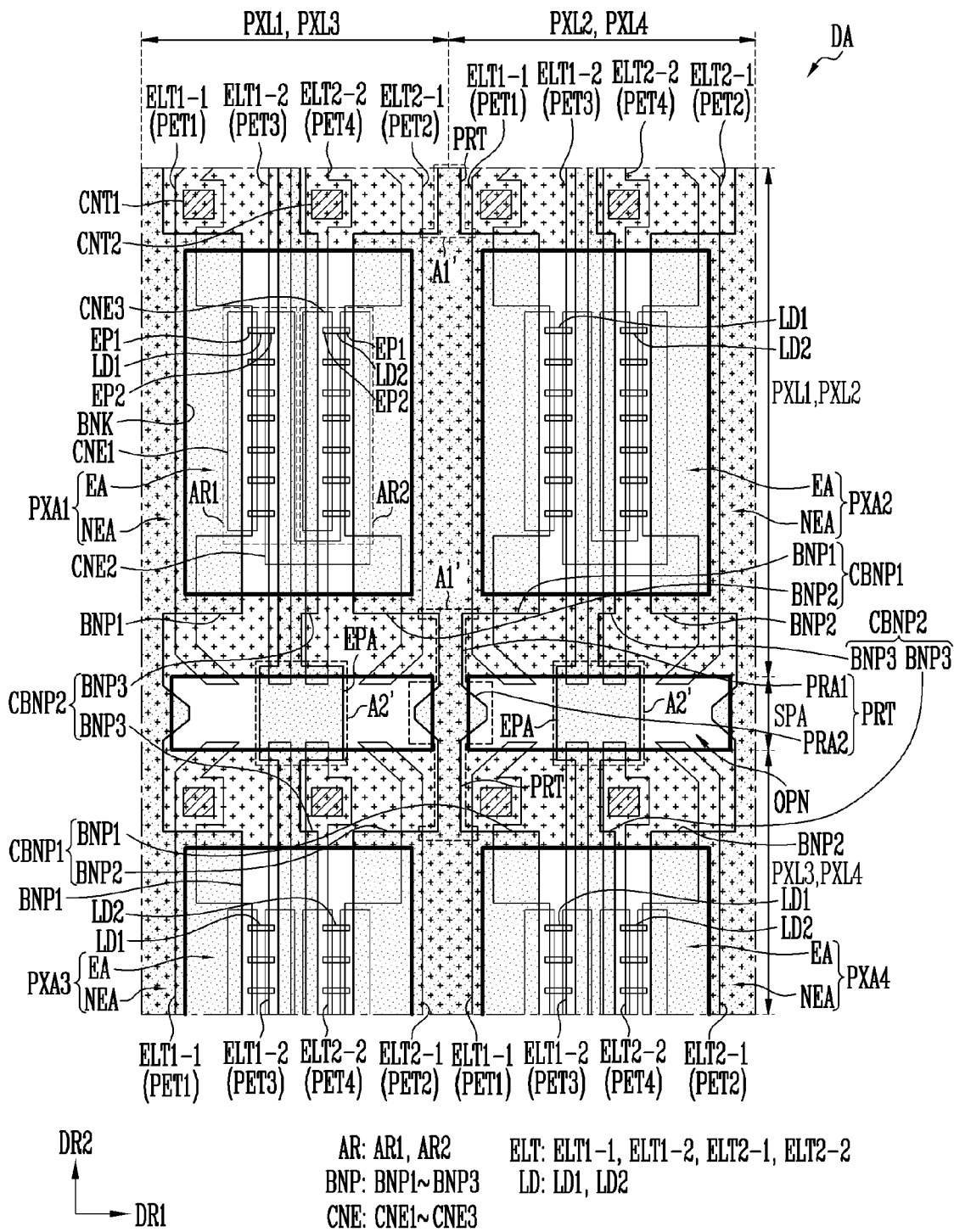
Figure 20:
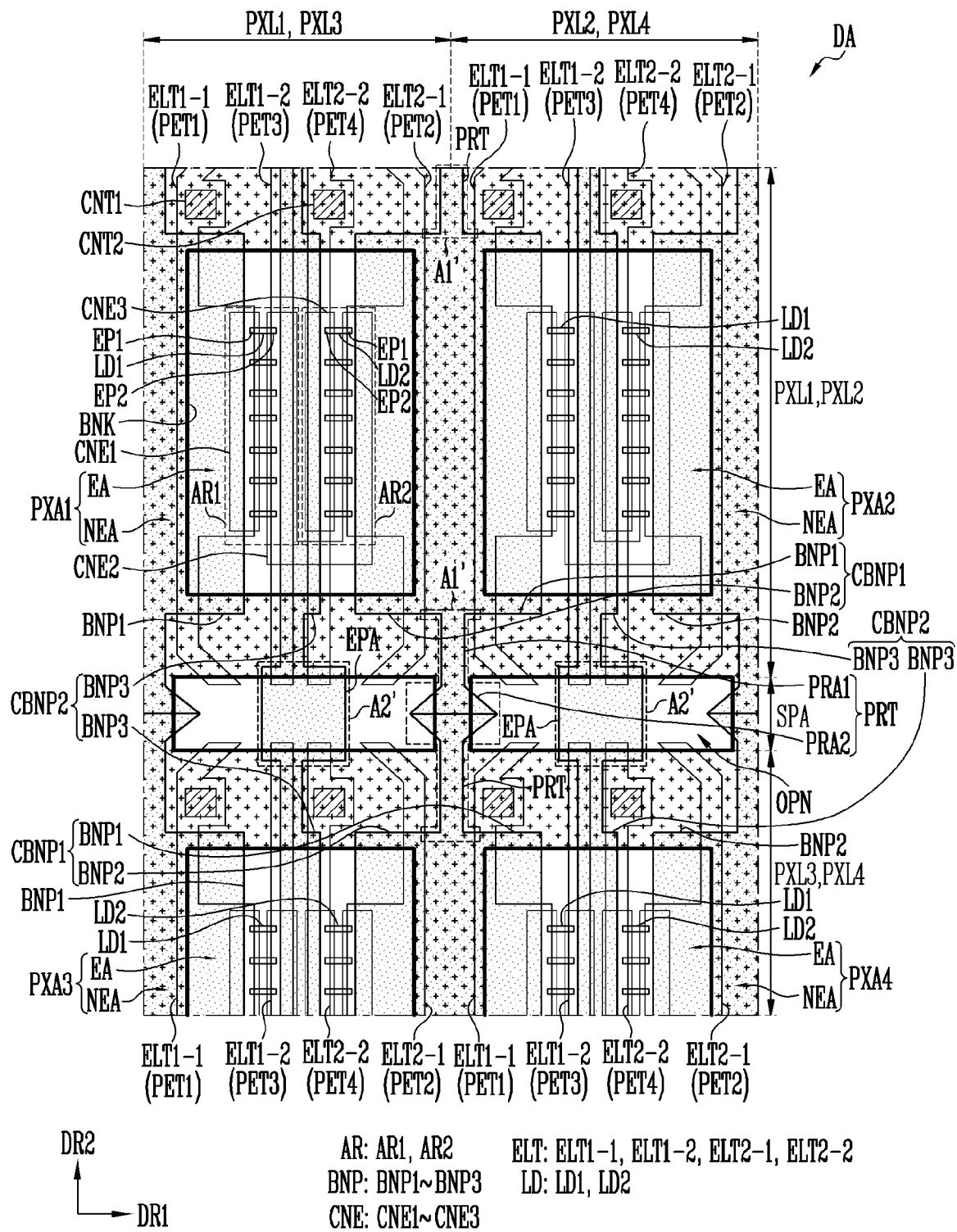
Figure 21:
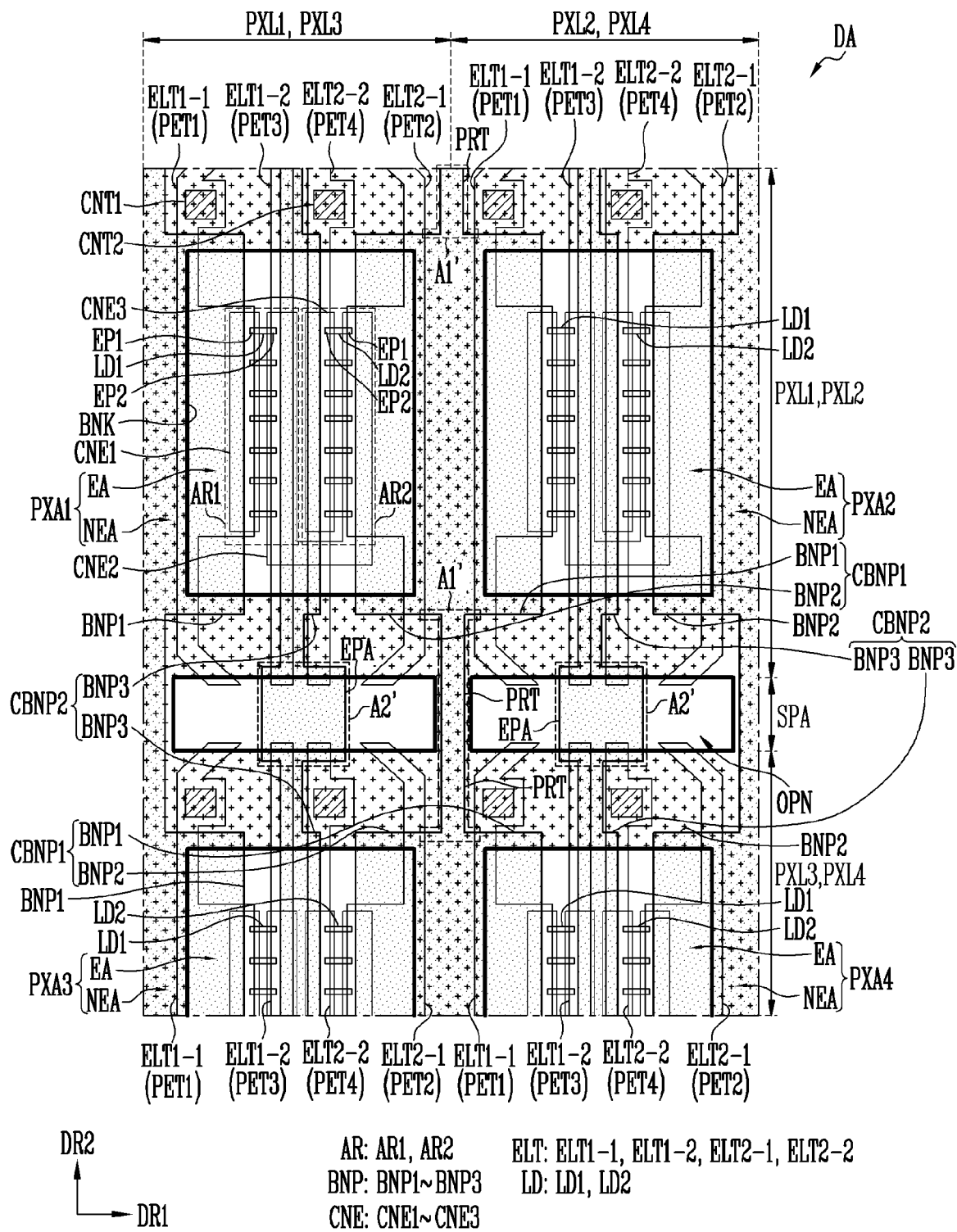

In case that each protrusion PRT has a width that may be gradually changed in at least one area as in an embodiment of FIG. 13, the protrusions PRT that may be vertically adjacent along the second direction DR2 may have a uniform width and may be connected to each other, in at least one section of intermediate areas between consecutive pixel rows as in the embodiment of FIG. 19. In other embodiments, the protrusions PRT that may be vertically adjacent along the second direction DR2 may contact each other and be connected to each other, as in an embodiment of FIG. 20. The protrusions PRT that may be vertically adjacent in the embodiments of FIG. 8, FIG. 11, FIG. 12, and FIG. 14 may also directly contact each other and be connected to each other in the same manner as in an embodiment of FIG. 20.

Figure 22:
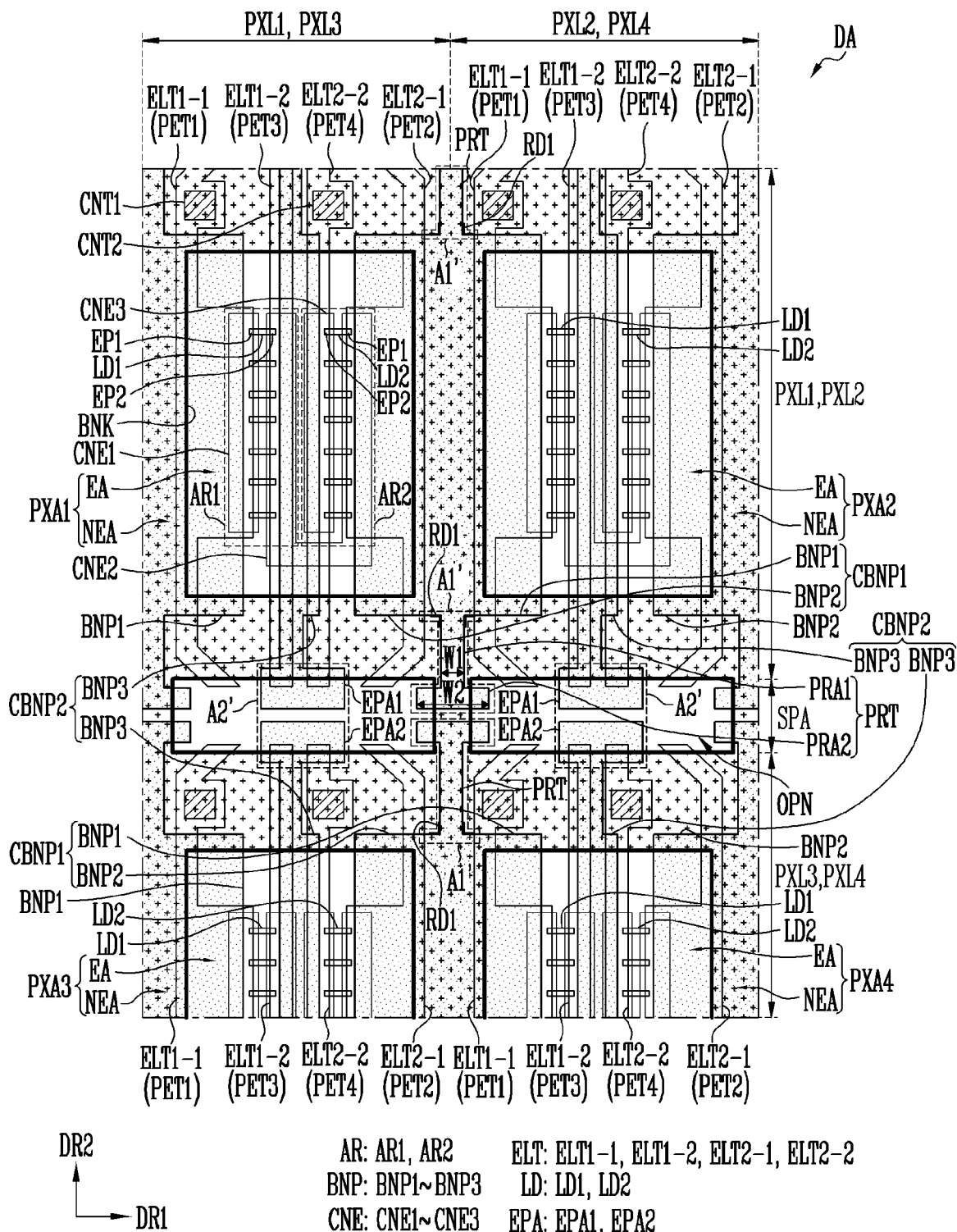
Figure 23:
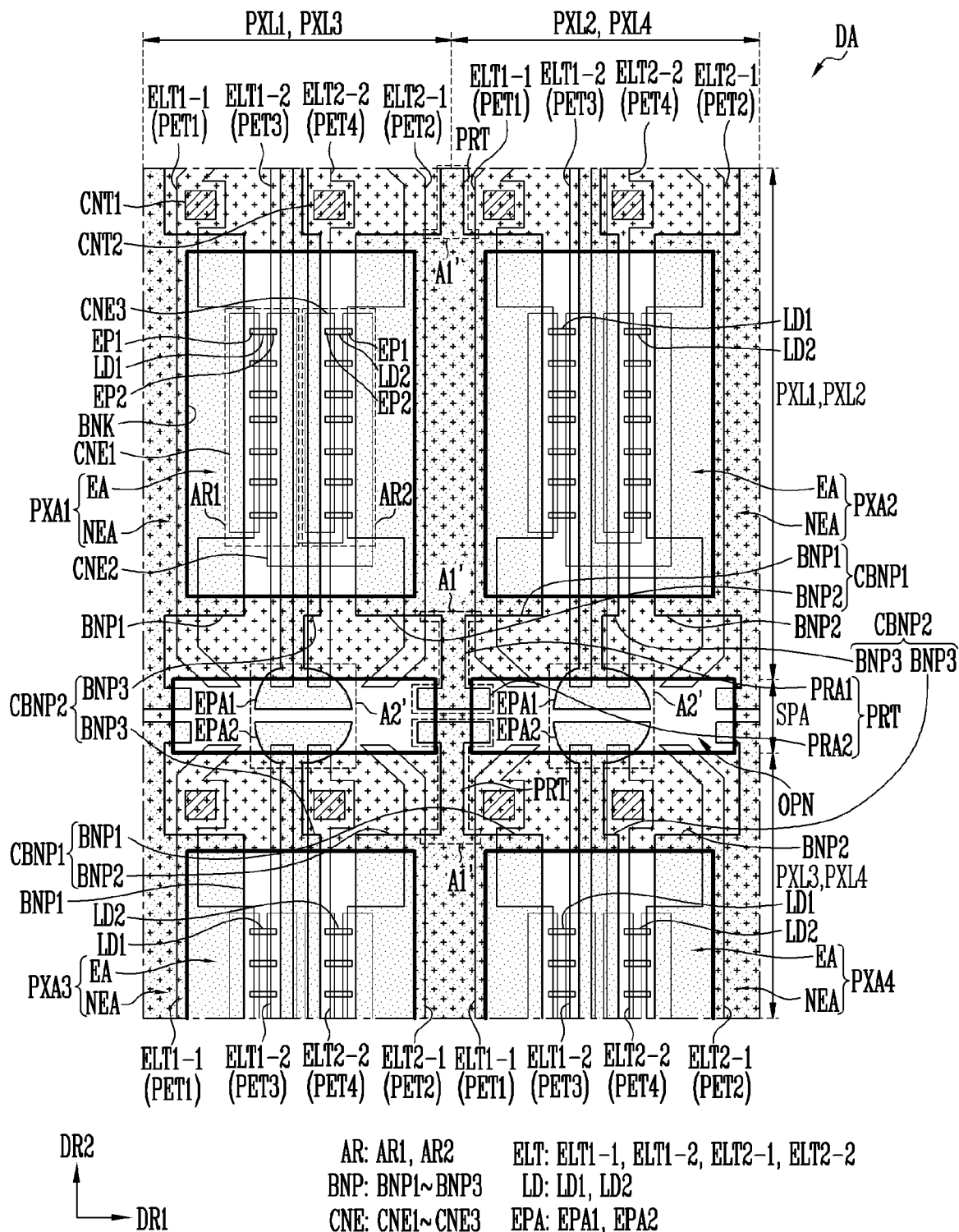

Referring to FIG. 22 and FIG. 23, the second integrated bank pattern CBNP2 according to the previous embodiments may be disconnected between at least two pixel rows sequentially disposed along the second direction DR2. For example, in the separation area SPA between the first and third pixels PXL1 and PLX3, the third bank pattern portion BNP3 of the first pixel PXL1 may have a first extension EPA1, and the third bank pattern portion BNP3 of the third pixel PXL3 may have a second extension EPA2 spaced apart from the first extension EPA1. Similarly, in the separation area SPA between the second and fourth pixels PXL2 and PXL4, the third bank pattern portion BNP3 of the second pixel PXL2 has a first extension EPA1, and the third bank pattern portion BNP3 of the fourth pixel PXL4 may have a second extension EPA2 spaced apart from the first extension EPA1. Each of the first expansion EPA1 and second expansion EPA2 may have an extended width corresponding to each separation area SPA.

Figure 24:
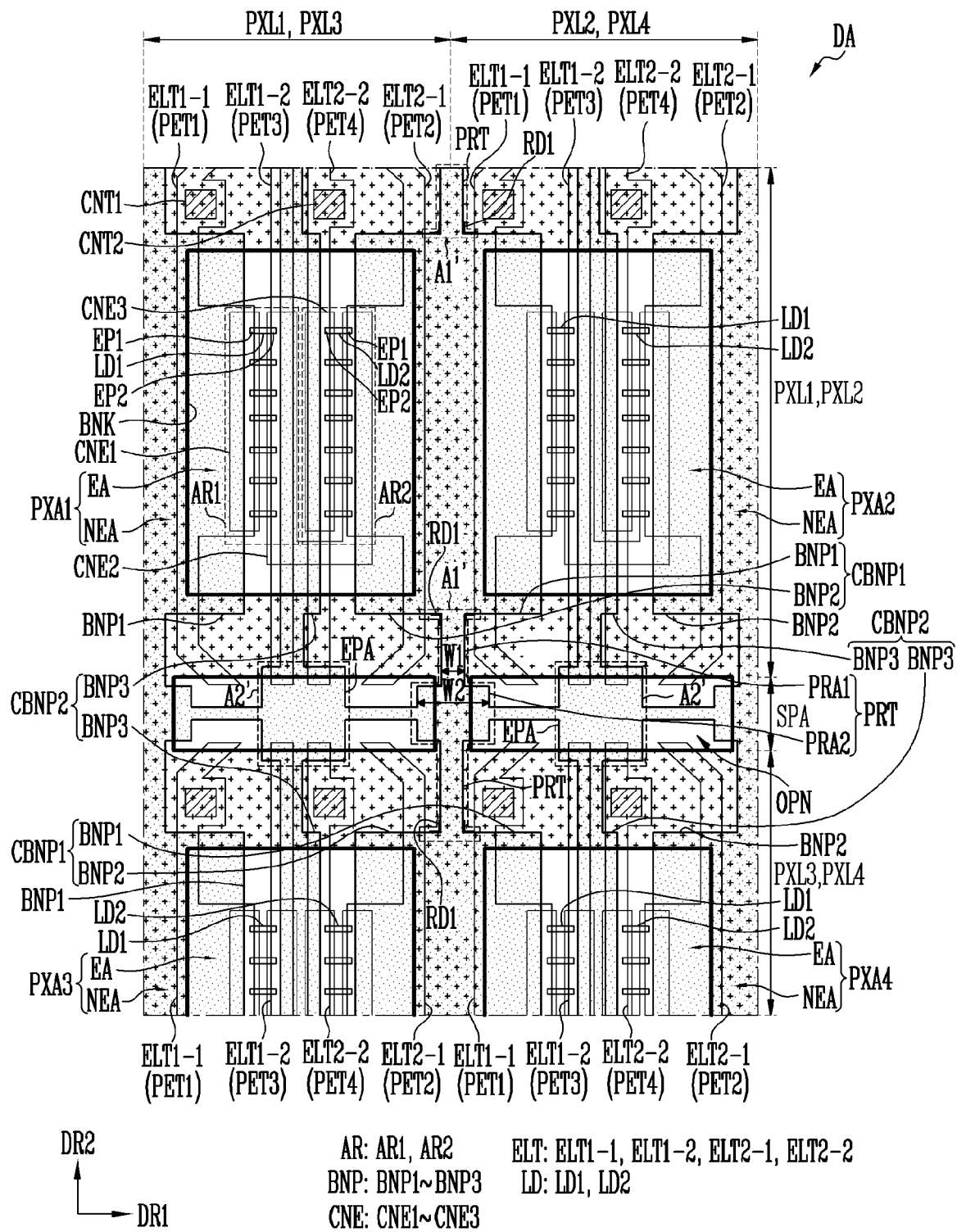

Referring to FIG. 24, in the entire display area DA, the first to third bank pattern portions BNP1, BNP2, and BNP3 may all be integrally connected. For example, a mesh-type integrated bank pattern including the first to third bank pattern portions BNP1, BNP2, and BNP3 of the pixels PXL may be provided in the display area DA. For example, in each separation area SPA and/or its peripheral area, the first to third bank pattern portions BNP1, BNP2, and BNP3 may be integrally connected.

On the other hand, in the above-described embodiments, it has been disclosed that each separation area SPA may be disposed only between the adjacent pixels PXL along the second direction DR2 (or the upper area and/or the lower area of each pixel PXL), but the disclosure is not limited thereto. For example, in another embodiment, at least one additional separation area may be further disposed in the light emitting area EA of each pixel PXL depending on the number of serial stages of the light emitting part EMU. The bank patterns BNP may have a structure according to at least one embodiment described above for the additional separation area. For example, in the additional separation area, each protrusion PRT may be formed in the first and second bank patterns BNP1 and BNP2, and/or each extension EPA may be formed in the third bank patterns BNP3.

Figure 25A:
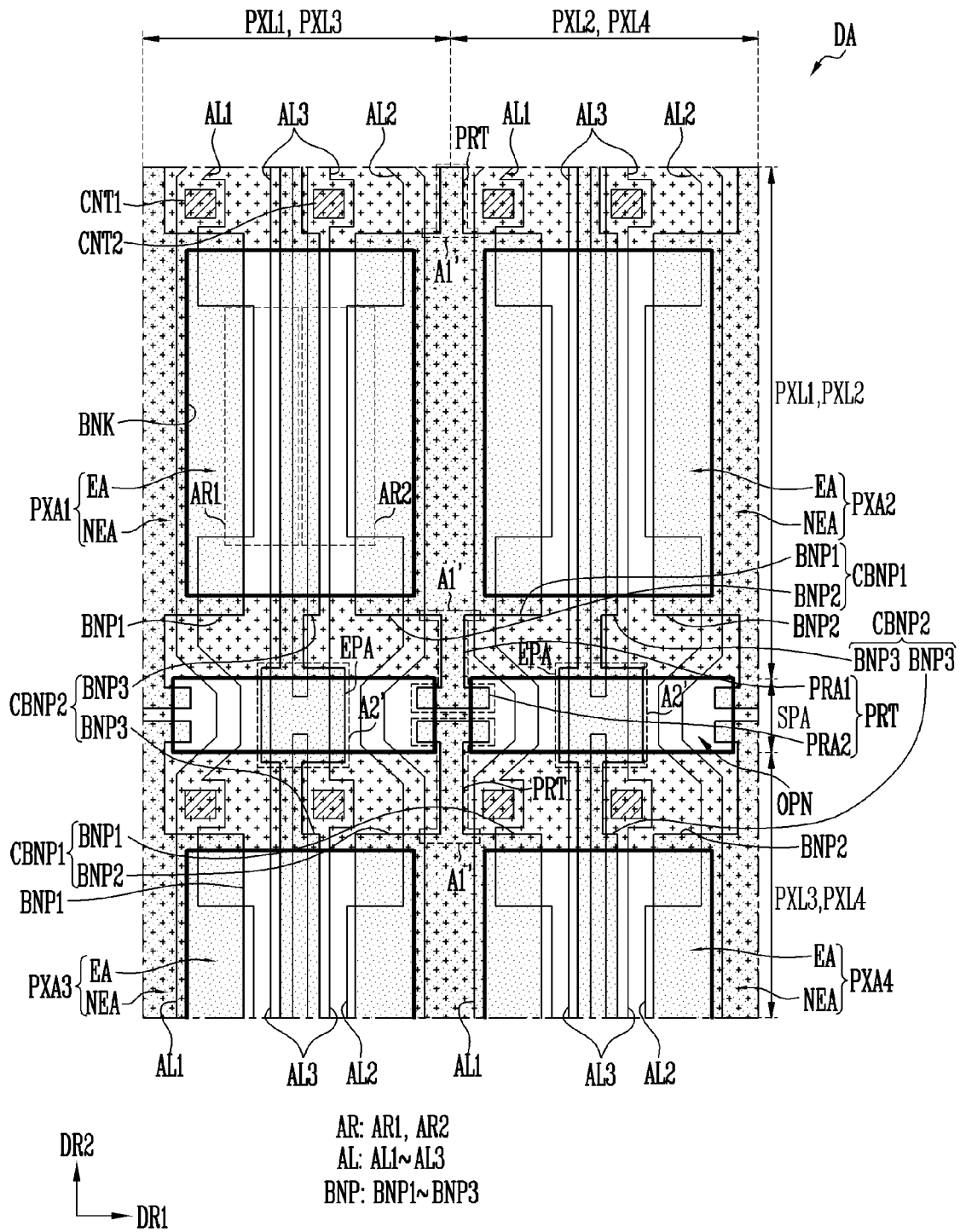
FIG. 25A to FIG. 25C illustrate schematic plan views of a manufacturing method of a display panel including pixels according to an embodiment of the disclosure.
Figure 25B:
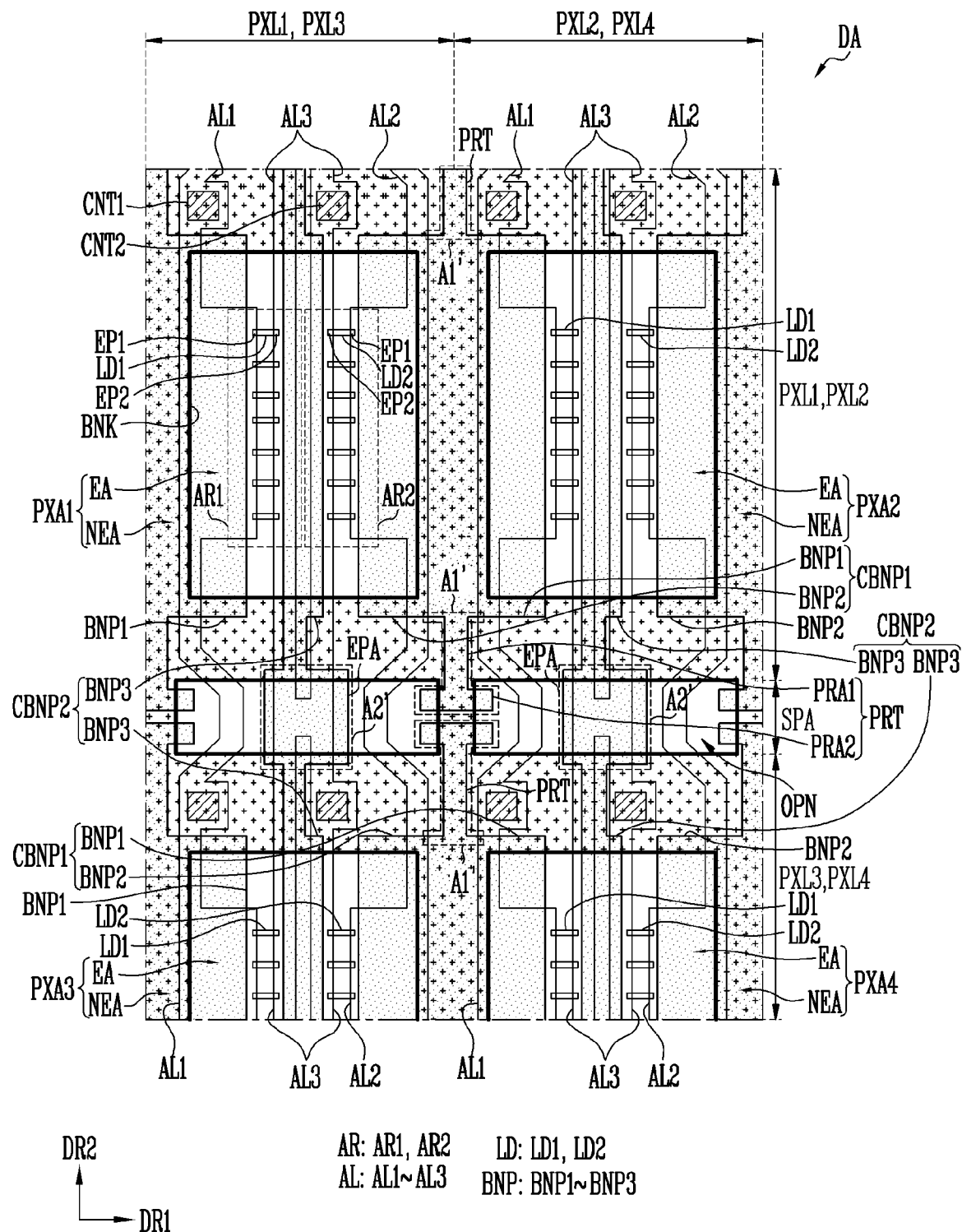
Figure 25C:
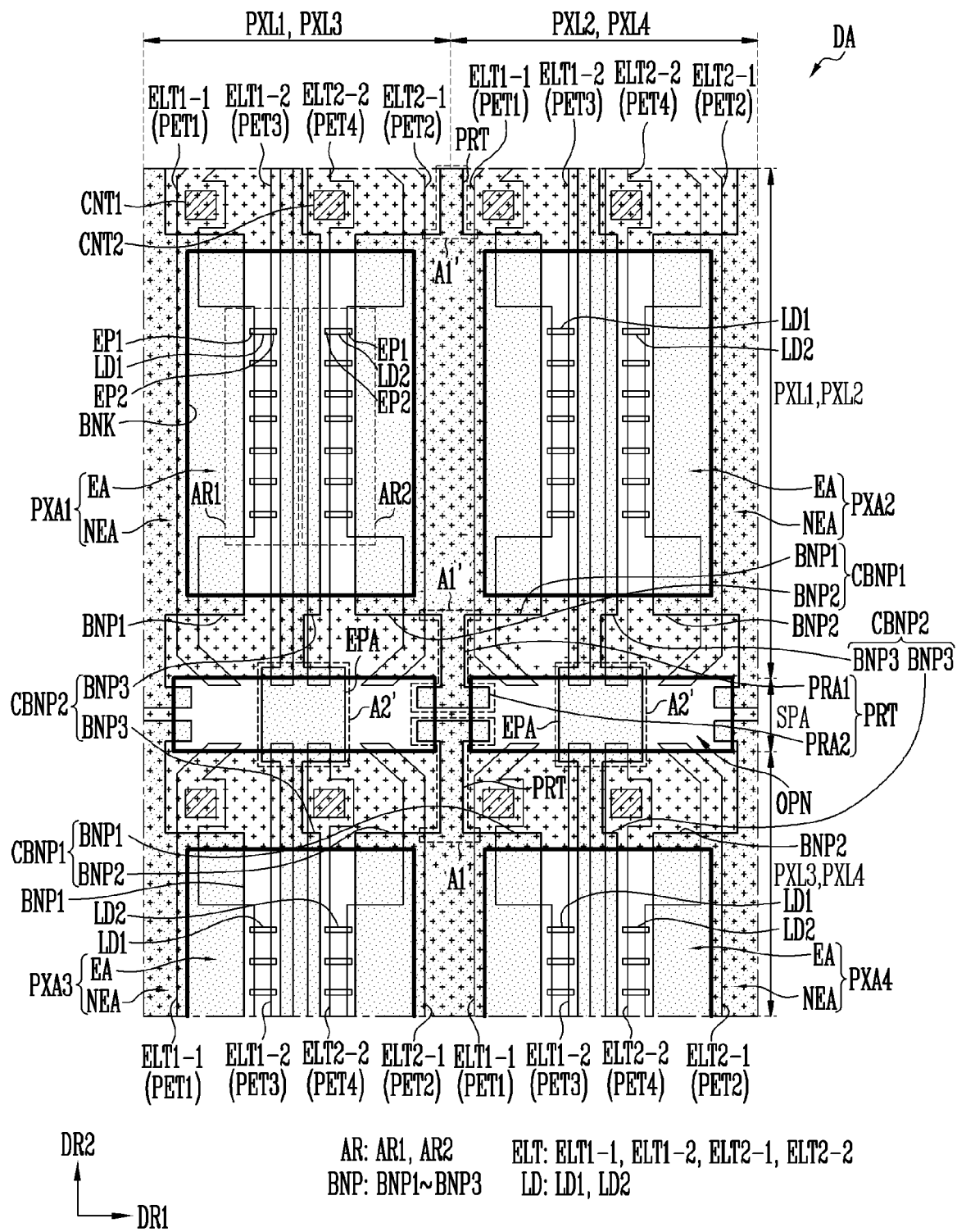

FIG. 25A to FIG. 25C illustrate schematic plan views of a manufacturing method of a display panel DP including pixels PXL according to an embodiment of the disclosure. For example, FIG. 25A to FIG. 25C sequentially illustrate arranging the light emitting elements LD and separating the pixel electrodes ELT, in manufacturing the display panel DP including the pixels PXL according to an embodiment of FIG. 8.

Referring to FIGS. 8 to 25A, alignment wires AL may be formed in each pixel area PXA on the base layer BSL in which the pixel circuit layer PCL and the bank pattern portions BNP may be formed. Each alignment wire AL may extend along the second direction DR2 in the display area DA. In some embodiments, a pair of aligned wires AL may be disposed at narrow intervals in each light emitting element arrangement area AR, and may be disposed at wide intervals in the remaining areas.

The alignment wires AL may be elements separated into the pixel electrodes ELT of each pixel PXL later. For example, before being separated into individual electrodes corresponding to a serial stage of the pixels PXL, the pixel electrodes ELT may be first formed in a form of each alignment wire AL. For example, in order to arrange the light emitting elements LD in the light emitting area EA of each pixel PXL, the pixel electrodes ELT may be separated into groups in the entire display area DA, the pixel electrodes ELT of each group may be first formed with an integrated alignment line AL, and an alignment signal may be applied.

For example, the (1-1)-th electrodes ELT1-1 of the pixels PXL may be first integrally formed in a form of a first alignment line AU, the (2-1)-th electrodes ELT2-1 of the pixels PXL may be first integrally formed in a form of a second alignment line AL2, and the (1-2)-th and (2-2)-th electrodes ELT1-2 and ELT2-2 of the pixels PXL may be integrally formed in a form of a third alignment line AL3.

In some embodiments, after entirely forming a conductive film in the display area DA, the alignment wires AL may be formed in a manner of patterning the conductive film through an etching process. As in the embodiments of FIG. 8 to FIG. 24, by forming the protrusions PRT in the first integrated bank pattern BNP1, short circuit defects of the pixel electrodes (ELT) that may occur during the patterning process of the conductive film may be prevented.

After formation of the alignment wires AL, the first insulation layer INS1 and the bank BNK may be formed on the display area DA.

Referring to FIG. 25B, the light emitting elements LD may be supplied in each pixel area PXA on the base layer BSL in which the alignment wires AL, the first insulation layer INS1, and the bank BNK may be formed, and the light emitting elements LD may be arranged between a pair of pixel electrodes ELT. In an embodiment, the light emitting elements LD may be supplied in each pixel area PXA through an inkjet method or a slit coating method, but the supply method of the light emitting elements LD is not limited thereto.

By supplying the light emitting elements LD in each pixel area PXA and simultaneously, or after supplying the light emitting elements LD, by applying alignment signals to the alignment wires AL, an electric field may be formed between the alignment wires AL. For example, a first alignment signal, a second alignment signal, and a third alignment signal may be applied to the first alignment wire AL1, the second alignment wire AL2, and the third alignment wire AL3, respectively.

The first and third alignment signals may be signals having different potential and/or phases, and accordingly, an electric field that induces alignment of the light emitting elements LD between the first and third alignment wires AL1 and AL3 may be formed. Similarly, the second and third alignment signals may be signals having different potential and/or phases, and accordingly, an electric field that induces alignment of the light emitting elements LD between the second and third alignment wires AL2 and AL3 may be formed. Accordingly, the light emitting elements LD may be aligned or arranged in each light emitting element arrangement area AR.

In some embodiments, the first and second alignment signals may be the same signal or different signals. In case that the first and second alignment signals may be different signals, the first and second alignment wires AU and AL2 may be formed to be separated from each other. In case that the first and second alignment signals may be the same signal, the first and second alignment wires AL1 and AL2 may be formed to be connected to each other to receive the same signal or to be separated from each other but to receive the same signal.

In some embodiments, in order to control an alignment direction of the light emitting elements LD, the alignment signals may be adjusted, or a magnetic field may be formed. For example, the alignment signals may be adjusted or a magnetic field may be formed so that the first end portions EP1 of the light emitting elements LD may be further directed toward the first alignment wire AU, between the first and third alignment wires AL1 and AL3. The alignment signals may be adjusted or a magnetic field may be formed so that the first end portions EP1 of the light emitting elements LD may be further directed toward the second alignment wire AL2, between the second and third alignment wires AL2 and AL3.

Referring to FIG. 25C, after the alignment of the light emitting elements LD may be completed, the alignment wires AL may be separated into individual pixel electrodes ELT by etching the alignment wires AL in each separation area SPA. As in the embodiments of FIG. 8 to FIG. 24, in an area corresponding to each separation area SPA, by forming the extensions EPA in the second integrated bank pattern CBNP2, the residues (RD2 of FIG. 7) of the pixel electrodes ELT may be prevented. Accordingly, short circuit defects of the pixel electrodes ELT may be prevented.

Thereafter, the light emitting elements LD arranged in the light emitting area EA of each pixel PXL may be connected in series, in parallel, and/or in series/parallel in a desired shape by using the contact electrodes CNE.

According to the embodiments of FIG. 8 to FIG. 25C, by forming the protrusions PRT in each first integrated bank pattern CBNP1, short circuit defects may be prevented between adjacent pixel electrodes ELT of two pixels PXL adjacent in the first direction DR1.

In the embodiments including the second integrated bank pattern CBNP2 (or, the third bank pattern portion BNP3) as in the embodiments of FIGS. 8 to 9C and FIG. 11 to FIG. 25C, by forming the expansions EPA in each second integrated bank pattern CBNP2, short circuit defects may be prevented between adjacent pixel electrodes ELT of two pixels PXL adjacent in the second direction DR2.

Figure 26:
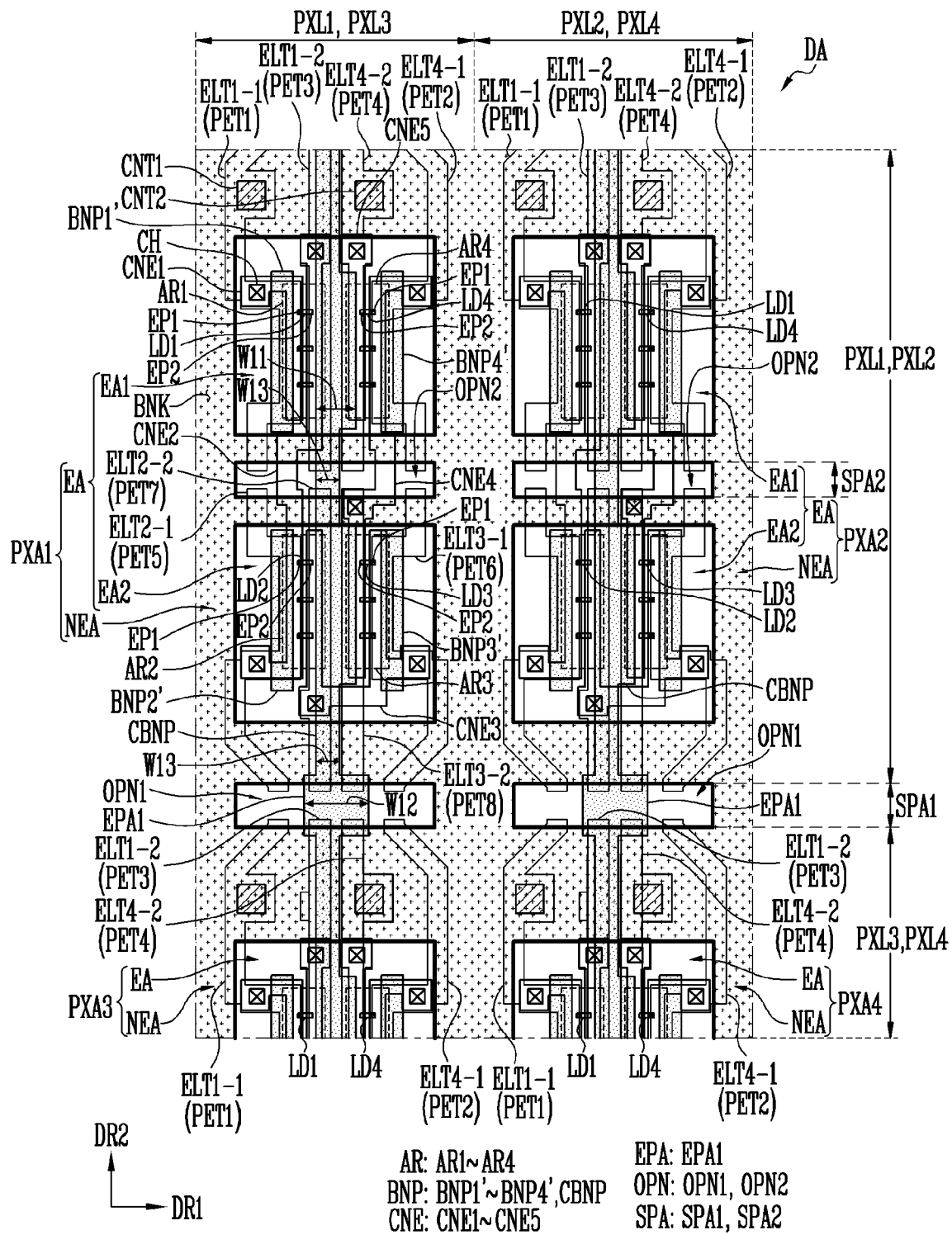
FIG. 26 and FIG. 27 respectively illustrate a schematic plan view of pixels and display areas including the same according to an embodiment of the disclosure.
Figure 27:
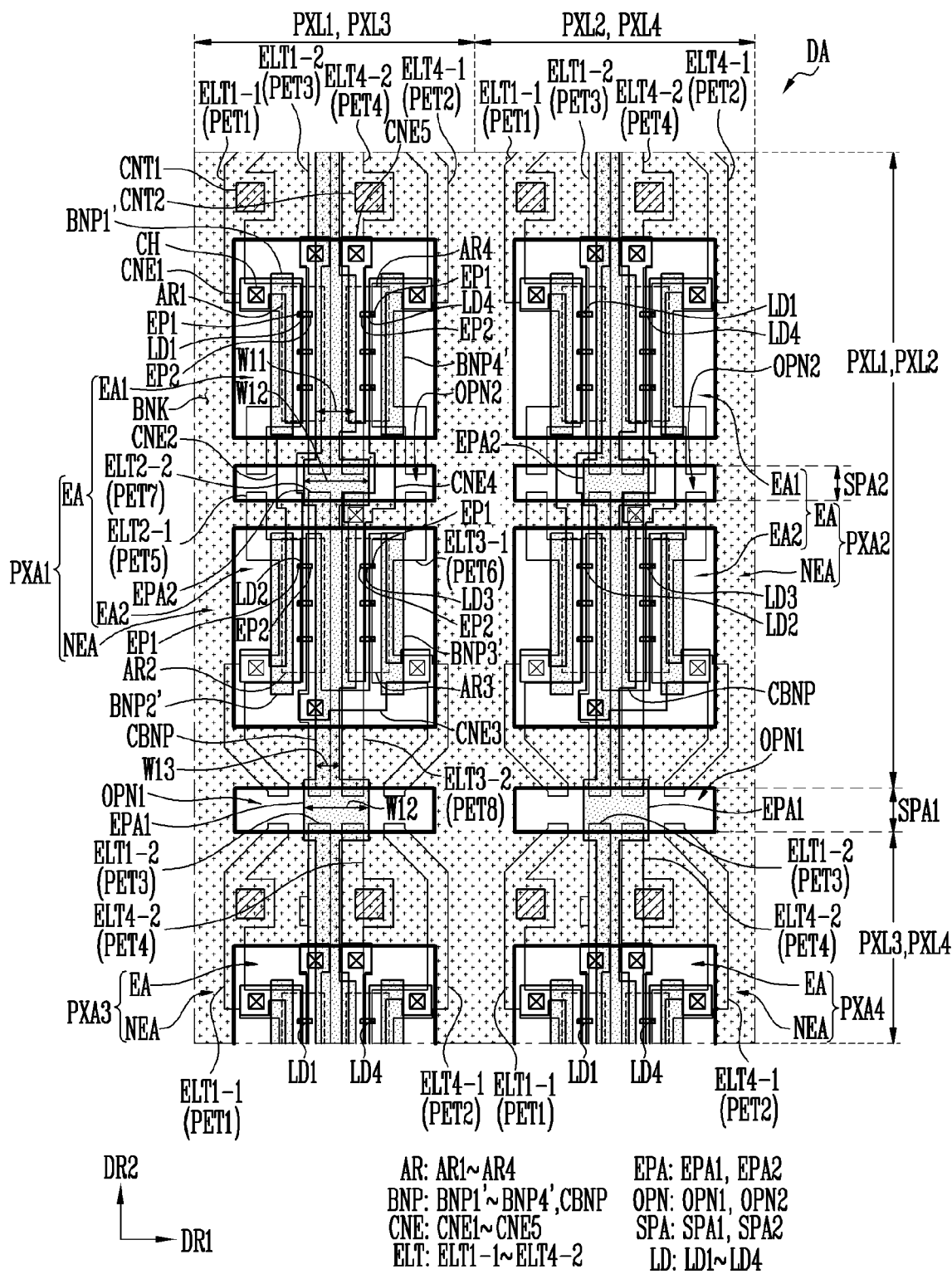

FIG. 26 and FIG. 27 respectively illustrate a schematic plan view of pixels PXL and a display area DA including the same according to an embodiment of the disclosure. For example, FIG. 26 and FIG. 27 illustrate another modified embodiment of an embodiment of FIG. 8 in relation to the light emitting part EMU and the bank pattern portions BNP of each pixel PXL. Compared with an embodiment of FIG. 26, an embodiment of FIG. 27 may further include a second extension portion EPA2 formed in an integrated bank pattern CBNP corresponding to a second separation area SPA2 disposed inside each pixel area PXA. In describing the embodiments of FIG. 26 and FIG. 27, the same reference numerals are denoted to configurations similar to or identical to those of the above-described embodiments, and detailed descriptions thereof will be omitted.

Referring to FIG. 5 to FIG. 27, each pixel PXL may include a light emitting part EMU including four serial stages. For example, each pixel PXL may include a first light emitting element arrangement area AR1 corresponding to a first serial stage, a second light emitting element arrangement area AR2 corresponding to a second serial stage, a third light emitting element arrangement area AR3 corresponding to a third serial stage, and a fourth light emitting element arrangement area AR4 corresponding to a fourth serial stage.

The first light emitting element arrangement area AR1 may be an area corresponding to the first serial stage. For example, the first light emitting element arrangement area AR1 may include the (1-1)-th electrode ELT1-1 and the (1-2)-th electrode ELT1-2, and at least one first light emitting element LD1 disposed and/or connected between the (1-1)-th electrode ELT1-1 and the (1-2)-th electrode ELT1-2.

The second light emitting element arrangement area AR2 may be an area corresponding to the second serial stage. For example, the second light emitting element arrangement area AR2 may include the (2-1)-th electrode ELT2-1 and the (2-2)-th electrode ELT2-2, and at least one second light emitting element LD2 disposed and/or connected between the (2-1)-th electrode ELT2-1 and the (2-2)-th electrode ELT2-2.

The third light emitting element arrangement area AR3 may be an area corresponding to the third serial stage. For example, the third light emitting element arrangement area AR3 may include the (3-1)-th electrode ELT3-1 and the (3-2)-th electrode ELT3-2, and at least one third light emitting element LD3 disposed and/or connected between the (3-1)-th electrode ELT3-1 and the (3-2)-th electrode ELT3-2.

The fourth light emitting element arrangement area AR4 may be an area corresponding to the fourth serial stage. For example, the fourth light emitting element arrangement area AR4 may include the (4-1)-th electrode ELT4-1 and the (4-2)-th electrode ELT4-2, and at least one fourth light emitting element LD4 disposed and/or connected between the (4-1)-th electrode ELT4-1 and the (4-2)-th electrode ELT4-2.

The (1-1)-th, (1-2)-th, (4-1)-th, and (4-2)-th electrodes ELT1-1, ELT1-2, ELT4-1, and ELT4-2 may be separated from each other along the first direction DR1 in the first light emitting area EA1, and each of them may extend along the second direction DR2. The (2-1)-th, (2-2)-th, (3-1)-th, and (3-2)-th electrodes ELT2-1, ELT2-2, ELT3-1, and ELT3-2 may be separated from each other along the first direction DR1 in the second light emitting area EA2, and each of them may extend along the second direction DR2.

The pixel PXL may further include multiple contact electrodes CNE connected to respective pixel electrode ELT and/or light emitting elements LD. For example, the pixel PXL may include first to fifth contact electrodes CNE1 to CNE5. In an embodiment, each contact electrode CNE may be connected to respective pixel electrode(s) ELT through at least one contact hole CH, but is not limited thereto.

In an embodiment, at least one contact electrode CNE may connect two consecutive serial stages. For example, the second contact electrode CNE2 may connect the first and second serial stages, the third contact electrode CNE3 may connect the second and third serial stages, and the fourth contact electrode CNE4 may connect the third and fourth serial stages.

In some embodiments, the first to fourth light emitting element arrangement areas AR1 to AR4 may have substantially similar or same structure to each other, but are not limited thereto. The number of light emitting elements LD disposed in the first to fourth light emitting element arrangement areas AR1 to AR4, and the shape of the pixel electrodes ELT and/or the contact electrodes CNE may be the same or different.

The first contact electrode CNE1 may be disposed on the first end portions EP1 of the first light emitting elements LD1 and the (1-1)-th electrode ELT1-1. The first contact electrode CNE1 may connect the first end portions EP1 of the first light emitting elements LD1 to the (1-1)-th electrode ELT1-1.

The second contact electrode CNE2 may be disposed on the second end portions EP2 of the first light emitting elements LD1 and the (1-2)-th electrode ELT1-2 to connect the second end portions EP2 of the first light emitting elements LD1 to the (1-2)-th electrode ELT1-2. The second contact electrode CNE2 may be disposed on the first end portions EP1 of the second light emitting elements LD2 and the (2-1)-th electrode ELT2-1 to connect the first end portions EP1 of the second light emitting elements LD2 to the (2-1)-th electrode ELT2-1.

To this end, the second contact electrode CNE2 may extend from the first light emitting element arrangement area AR1 through the second separation area SPA2 to the second light emitting element arrangement area AR2 to connect the (1-2)-th electrode ELT1-2 to the (2-1)-th electrode ELT2-1. In another embodiment, the second contact electrode CNE2 may be configured of multiple separate electrodes that may be disposed in the first and second light emitting element arrangement areas AR1 and AR2, respectively, and the separate electrodes may be connected to each other through a bridge pattern or the like. The first serial stage and the second serial stage may be connected by the second contact electrode CNE2.

The third contact electrode CNE3 may be disposed on the second end portions EP2 of the second light emitting elements LD2 and the (2-2)-th electrode ELT2-2 to connect the second end portions EP2 of the second light emitting elements LD2 to the (2-2)-th electrode ELT2-2. The third contact electrode CNE3 may be disposed on the first end portions EP1 of the third light emitting elements LD3 and the (3-1)-th electrode ELT3-1 to connect the first end portions EP1 of the third light emitting elements LD3 to the (3-1)-th electrode ELT3-1.

To this end, the third contact electrode CNE3 may extend from the second light emitting element arrangement area AR2 to the third light emitting element arrangement area AR3 to connect the (2-2)-th electrode ELT2-2 to the (3-1) electrode ELT3-1. In another embodiment, the third contact electrode CNE3 may be configured of multiple separate electrodes that may be disposed in the second and third light emitting element arrangement areas AR2 and AR3, respectively, and the separate electrodes may be connected to each other through a bridge pattern or the like. The second serial stage and the third serial stage may be connected by the third contact electrode CNE3.

The fourth contact electrode CNE4 may be disposed on the second end portions EP2 of the third light emitting elements LD3 and the (1-2)-th electrode ELT1-2 to connect the second end portions EP2 of the third light emitting elements LD3 to the (3-2)-th electrode ELT3-2. The fourth contact electrode CNE4 may be disposed on the first end portions EP1 of the fourth light emitting elements LD4 and the (4-1)-th electrode ELT4-1 to connect the first end portions EP1 of the fourth light emitting elements LD4 to the (4-1)-th electrode ELT4-1.

To this end, the fourth contact electrode CNE4 may extend from the third light emitting element arrangement area AR3 through the second separation area SPA2 to the fourth light emitting element arrangement area AR4 to connect the (3-2)-th electrode ELT3-2 to the (4-1)-th electrode ELT4-1. In another embodiment, the fourth contact electrode CNE4 may be configured of multiple separate electrodes that may be disposed in the third and fourth light emitting element arrangement areas AR3 and AR4, respectively, and the separate electrodes may be connected to each other through a bridge pattern or the like. The third serial stage and the fourth serial stage may be connected by the fourth contact electrode CNE4.

The fifth contact electrode CNE5 may be disposed on the second end portions EP2 of the fourth light emitting elements LD4 and the (4-2)-th electrode ELT4-2. The second end portions EP2 of the fourth light emitting elements LD4 may be connected to the (4-2)-th electrode ELT4-2.

In the above-described manner, the pixel electrodes ELT and the light emitting elements LD may be connected in a desired form by using contact electrodes CNE, in the pixel PXL including at least three serial stages (for example, four serial stages).

In the embodiments of FIG. 26 and FIG. 27, each pixel PXL may include multiple light emitting areas EA provided to at least one serial stage. For example, each pixel PXL may include a first light emitting area EA1 in which the first and fourth serial stages may be provided, and a second light emitting area EA2 in which the second and third serial stages may be provided. In some embodiments, the first and second light emitting areas EA1 and EA2 may be spaced apart from each other along the second direction DR2, and at least one separation area SPA may be disposed between the first and second light emitting areas EA1 and EA2.

Specifically, at least one separation area SPA may be disposed between adjacent pixels PXL in the first direction DR1 and/or in the second direction DR2, and may be disposed inside each pixel area PXA. For example, a first separation area SPA1 may be provided between adjacent pixels PXL in the second direction DR2, and a second separation area SPA2 may be provided inside each pixel area PXA. As an example, the second separation area SPA2 may be provided between the first light emitting area EA1 and the second light emitting area EA2 of each pixel PXL. The pixel electrodes ELT may be disconnected from the first and second separation areas SPA1 and SPA2 to be individually separated.

The bank BNK may be opened corresponding to each of the first and second light emitting areas EA1 and EA2, and further, the bank BNK may include an opening OPN corresponding to the first and/or second separation areas SPA1 and SPA2. For example, the bank BNK may include a first opening OPN1 corresponding to the first separation area SPA1 and a second opening OPN2 corresponding to the second separation area SPA2.

Each pixel PXL and the display area DA including the same may further include the bank pattern portions BNP (or respective bank patterns) overlapping respective pixel electrode(s) ELT. For example, each pixel PXL may include first to fourth bank pattern portions BNP1' to BNP4' overlapping a pixel electrode ELT, respectively, and an integrated bank pattern CBNP overlapping the pixel electrodes ELT.

The first bank pattern portion BNP1' may overlap the (1-1)-th electrode ELT1-1. For example, the first bank pattern portion BNP1' may be disposed under the (1-1)-th electrode ELT1-1 so as to overlap an area of the (1-1)-th electrode ELT1-1. An area of the (1-1)-th electrode ELT1-1 may upwardly protrude by the first bank pattern portion BNP1'. Accordingly, a reflective partition wall may be formed around the first end portions EP1 of the first light emitting elements LD1.

The second bank pattern portion BNP2' may overlap the (2-1)-th electrode ELT2-1. For example, the second bank pattern portion BNP2' may be disposed under the (2-1)-th electrode ELT2-1 so as to overlap an area of the (2-1)-th electrode ELT2-1. An area of the (2-1)-th electrode ELT2-1 may upwardly protrude by the second bank pattern portion BNP2'. Accordingly, a reflective partition wall may be formed around the first end portions EP1 of the second light emitting elements LD2.

The third bank pattern portion BNP3' may overlap the (3-1)-th electrode ELT3-1. For example, the third bank pattern portion BNP3' may be disposed under the (3-1)-th electrode ELT3-1 so as to overlap an area of the (3-1)-th electrode ELT3-1. An area of the (3-1)-th electrode ELT3-1 may upwardly protrude by the third bank pattern portion BNP3'. Accordingly, a reflective partition wall may be formed around the first end portions EP1 of the third light emitting elements LD3.

The fourth bank pattern portion BNP4' may overlap the (4-1)-th electrode ELT4-1. For example, the fourth bank pattern portion BNP4' may be disposed under the (4-1)-th electrode ELT4-1 so as to overlap an area of the (4-1)-th electrode ELT4-1. An area of the (4-1)-th electrode ELT4-1 may upwardly protrude by the fourth bank pattern portion BNP4'. Accordingly, a reflective partition wall may be formed around the first end portions EP1 of the fourth light emitting elements LD4.

In an embodiment, the first to fourth bank pattern portions BNP1' to BNP4' may be separated from each other to form each individual pattern, but the disclosure is not limited thereto. For example, as in the embodiments of FIG. 7 to FIG. 25C, at least two adjacent bank pattern portions BNP may be integrally formed and/or provided.

The integrated bank pattern CBNP may be dispose at a center of each pixel area PXA. For example, the first to fourth bank pattern portions BNP1' to BNP4' may be separated and disposed at both sides (for example, first and second side areas) of each pixel area PXA, and the integrated bank pattern CBNP may be disposed at the center of the pixel area PXA so as to be disposed between the first to fourth bank pattern portions BNP1' to BNP4' (for example, between the first and fourth bank pattern portions BNP1' and BNP4' and between the second and third bank pattern portions BNP2' and BNP3'). For example, the first bank pattern portion BNP1', the integrated bank pattern CBNP, and the fourth bank pattern portion BNP4' may be sequentially arranged along the first direction DR1 in the first light emitting area EA1, and the second bank pattern portion BNP2', the integrated bank pattern CBNP, and the third bank pattern portion BNP3' may be sequentially arranged along the first direction DR1 in the second light emitting area EA2.

In an embodiment, the integrated bank pattern CBNP may overlap at least two pixel electrodes ELT disposed at the center of each pixel area PXA. For example, the integrated bank pattern CBNP may partially overlap the (1-2)-th and (4-2)-th electrodes ELT1-2 and ELT4-2 in the first light emitting area EA1, and may partially overlap the (2-2)-th and (3-2)-th electrodes ELT2-2 and ELT3-2 in the second light emitting area EA2. The integrated bank pattern CBNP may extend from the first light emitting area EA1 through the second separation area SPA2 to the second light emitting area EA2.

However, the disclosure is not limited thereto. For example, in another embodiment, in a manner similar to the second integrated bank pattern CBNP2 according to the embodiments of FIG. 22 and FIG. 23, an end portion of each integrated bank pattern CBNP may be disconnected in the second separation area SPA2.

The integrated bank pattern CBNP may extend along a direction in the display area DA so that at least two adjacent pixels PXL respectively overlap in common with the pixel electrodes ELT corresponding thereto. For example, the integrated bank pattern CBNP may extend along the second direction DR2 in the display area DA so as to overlap the (1-2)-th, (2-2)-th, (3-2)-th, and (4-2)-th electrodes (ELT1-2, ELT2-2, ELT3-2, and ELT4-2 of at least two adjacent pixels PXL in the second direction DR2. As an example, the integrated bank pattern CBNP may extend along the second direction DR2 in each pixel column of the display area DA to overlap the (1-2)-th, (2-2)-th, (3-2)-th, and (4-2)-th electrodes ELT1-2, ELT2-2, ELT3-2, and ELT4-2 of the pixels PXL disposed in the same pixel column.

However, the disclosure is not limited thereto. For example, in another embodiment, similar to the second integrated bank pattern CBNP2 according to the embodiments of FIG. 22 and FIG. 23, an end portion of each integrated bank pattern CBNP may be disconnected in the first separation area SPA1.

As described above, in the embodiments in which each pixel PXL includes multiple light emitting areas EA, and the second separation area SPA2 may be provided between the light emitting areas EA, each integrated bank pattern CBNP may have a width extending along the first direction DR1 in at least one separation area SPA. For example, each integrated bank pattern CBNP may have a width partially extended in at least the first separation area SPA1.

For example, the integrated bank pattern CBNP may have a first width W11 so as to partially overlap the (1-2)-th, (2-2)-th, (3-2)-th, and (4-2)-th electrodes ELT1-2, ELT2-2, ELT3-2, and ELT4-2 in the first and second light emitting areas EA1 and EA2. The integrated bank pattern CBNP may have a second width W12 that may be larger than the first width W11 so as to completely overlap end portions of each of the (1-2)-th, (2-2)-th, (3-2)-th, and (4-2)-th electrodes ELT1-2, ELT2-2, ELT3-2, and ELT4-2 disposed in the corresponding area in the first separation area SPA1. For example, the integrated bank pattern CBNP may have the extended second width W12 so as to completely overlap end portions (lower end portions) of each of the (2-2)-th and (3-2)-th electrodes ELT2-2 and ELT3-2 of the first pixel PXL1 and end portions (upper end portions) of each of the (1-2)-th and (4-2)-th electrodes ELT1-2 and ELT4-2 of the third pixel PXL3, in the first separation area SPA1 between the first and third pixels PXL1 and PXL3.

The integrated bank pattern CBNP may have a third width W13 that may be narrower than the first width W11 and the second width W12, in the non-light emitting areas NEA around the first and second light emitting areas EA1 and EA2. The integrated bank pattern CBNP may have a selectively extended width in the second separation area SPA2.

For example, as in an embodiment of FIG. 26, the integrated bank pattern CBNP may overlap an area of the (1-2)-th, (2-2)-th, (3-2)-th, and/or (4-2)-th electrodes ELT1-2, ELT2-2, ELT3-2, and/or ELT4-2 of each pixel PXL while having the third width W13 in the second separation area SPA2. In another embodiment, as in an embodiment of FIG. 27, the integrated bank pattern CBNP may completely overlap end portions of the (1-2)-th, (2-2)-th, (3-2), and (4-2)-th electrodes ELT1-2, ELT2-2, ELT3-2, and ELT4-2 of each pixel PXL while having the extended second width W12 in the second separation area SPA2.

As in an embodiment of FIG. 27, in case that the integrated bank pattern CBNP has the extended width in the second separation area SPA2, end portions of the (1-2)-th, (2-2)-th, (3-2), and (4-2)-th electrodes ELT1-2, ELT2-2, ELT3-2, and ELT4-2 may be disposed on the flat upper surface of the integrated bank pattern CBNP. Accordingly, in the patterning process of the conductive film for forming the pixel electrodes ELT, it may be possible to prevent the residues of the conductive film from occurring in the second separation area SPA2, and thus it may be possible to prevent at least two adjacent pixel electrodes ELT (for example, the (1-2)-th electrode ELT1-2 and the (2-2)-th electrode ELT2-2) from being short-circuited in the second separation area SPA2.

The technical idea of the disclosure has been specifically described according to the embodiments, but it should be noted that the foregoing embodiments are provided only for illustration while not limiting the disclosure. It will be understood by those skilled in the art that various changes in form and details may be made therein without departing from the scope of the disclosure.

The claimed scope of the disclosure may be determined based on the scope of the accompanying claims including equivalents thereof. All changes or modifications that come within the meaning and range of the claims and their equivalents will be interpreted as being included within the range of the disclosure.

What is claimed is:

1. A display device comprising:
pixels disposed in a display area and including a first pixel, a second pixel adjacent to the first pixel in a first direction, a third pixel adjacent to the first pixel in a second direction;
a first integrated bank pattern disposed between the first pixel and the second pixel; and
a second integrated bank pattern extending in the second direction and spaced apart from the first integrated bank pattern, wherein
each of the pixels includes:
a first electrode and a second electrode that are spaced apart from each other along the first direction in a light emitting area, and extend in the second direction;
a third electrode disposed between the first electrode and the second electrode;
a fourth electrode disposed between the second electrode and the third electrode;
a first bank pattern portion overlapping the first electrode;
a second bank pattern portion overlapping the second electrode; and
a third bank pattern portion overlapping the third electrode,
first, second, and third electrodes of the first pixel and first, second, and third electrodes of the third pixel are electrically disconnected from each other in a first separation area between the first pixel and the third pixel,
the second integrated bank pattern includes a third bank pattern portion of the first pixel and a third bank pattern portion of the third pixel, and
the third bank pattern portion of the first pixel and the third bank pattern portion of the third pixel are spaced apart from each other in the first separation area.

2. The display device of claim 1, wherein each of the third bank pattern portion of the first pixel and the third bank pattern portion of the third pixel has a first width in the light emitting area and a second width larger than the first width in the first separation area.

3. The display device of claim 2, wherein each of the third bank pattern portion of the first pixel and the third bank pattern portion of the third pixel has a third width smaller than the first width in an area between the light emitting area and the first separation area.

4. The display device of claim 3, wherein the third bank pattern portion partially overlaps the third and fourth electrodes in the light emitting area, completely overlaps an end portion of each of the third and fourth electrodes in the first separation area, at least partially overlaps the third electrode in the area, and does not overlap the fourth electrode.

5. The display device of claim 1, wherein
the third bank pattern portion of the first pixel includes a first extension in the first separation area, and
the third bank pattern portion of the third pixel includes a second extension spaced apart from the first extension in the first separation area.

6. The display device of claim 5, wherein
the first extension completely overlaps end portions of each of the third and fourth electrodes of the first pixel in the first separation area, and
the second extension completely overlaps end portions of each of the third and fourth electrodes of the third pixel in the first separation area.

7. The display device of claim 5, wherein each of the first extension and the second extension has an extended width corresponding to the first separation area.

8. The display device of claim 7, wherein the first extension has a same shape as the second extension.

9. The display device of claim 1, wherein
the pixels further include a fourth pixel adjacent to the second pixel in the second direction, and
a third bank pattern portion of the second pixel and a third bank pattern portion of the fourth pixel are spaced apart from each other in in a second separation area between the second pixel and the fourth pixel.

10. The display device of claim 9, wherein each of the third bank pattern portion of the second pixel and the third bank pattern portion of the fourth pixel has a first width in the light emitting area and a second width larger than the first width in the second separation area.

11. The display device of claim 9, wherein
the third bank pattern portion of the second pixel includes a first extension in the second separation area, and
the third bank pattern portion of the fourth pixel includes a second extension spaced apart from the first extension in the second separation area.

12. The display device of claim 11, wherein each of the first extension and the second extension has an extended width corresponding to the second separation area.

13. The display device of claim 11, wherein
the first extension completely overlaps end portions of each of third and fourth electrodes of the second pixel in the second separation area, and
the second extension completely overlaps end portions of each of third and fourth electrodes of the fourth pixel in the second separation area.

14. The display device of claim 1, wherein
each of the pixels further includes at least one contact portion formed at the fourth electrode in an area between the light emitting area and the first separation area, and
the third bank pattern portion does not overlap the at least one contact portion.

15. The display device of claim 1, wherein the first integrated bank pattern includes:
a second bank pattern portion disposed at the first pixel;
a first bank pattern portion disposed at the second pixel; and
a protrusion extending in the second direction in a boundary area between the first pixel and the second pixel.

16. The display device of claim 15, wherein the protrusion is disposed in an area between the second electrode of the first pixel and a first electrode of the second pixel in a plan view.

17. The display device of claim 16, wherein end portions at an upper end and a lower end of the first integrated bank pattern respectively protrude in directions of a previous pixel row and a next pixel row.

18. A display device comprising:
pixels disposed in a display area along a first direction and a second direction, wherein
each of the pixels includes:
a first electrode and a second electrode that are spaced apart from each other along the first direction in a light emitting area and extend in the second direction;
a third electrode disposed between the first electrode and the second electrode and extending along the second direction;

a first bank pattern portion overlapping the first electrode;

a second bank pattern portion overlapping the second electrode; and an integrated bank pattern that is disposed between the first bank pattern portion and the second bank pattern portion to overlap the third electrode, the integrated bank pattern extending along the second direction in each light emitting area, the integrated bank pattern has, in a separation area between two adjacent pixels along the second direction, a width extending to completely overlap an end portion of a third electrode of each of the two adjacent pixels, and the integrated bank pattern of a previous pixel of the two adjacent pixels and the integrated bank pattern of a next pixel of the two adjacent pixels are spaced apart from each other in the separation area.

19. The display device of claim 18, wherein a third bank pattern portion of the previous pixel includes a first extension in the separation area, and a third bank pattern portion of the next pixel includes a second extension spaced apart from the first extension in the separation area.

20. The display device of claim 19, wherein the first extension completely overlaps end portions of the third electrode of the previous pixel in the separation area, and the second extension completely overlaps end portions of the third electrode of the next pixel in the separation area.

* * * * *